(12) United States Patent
Sugishita et al.

(10) Patent No.: US 7,577,493 B2
(45) Date of Patent: Aug. 18, 2009

(54) TEMPERATURE REGULATING METHOD, THERMAL PROCESSING SYSTEM AND SEMICONDUCTOR DEVICE MANUFACTURING METHOD

(75) Inventors: Masashi Sugishita, Toyama (JP); Masaaki Ueno, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 11/663,198

(22) PCT Filed: Nov. 28, 2005

(86) PCT No.: PCT/JP2005/021763
§ 371 (c)(1),
(2), (4) Date: May 29, 2007

(87) PCT Pub. No.: WO2006/070552
PCT Pub. Date: Jul. 6, 2006

(65) Prior Publication Data
US 2008/0046110 A1 Feb. 21, 2008

(30) Foreign Application Priority Data
Dec. 27, 2004 (JP) .............................. 2004-375768

(51) Int. Cl.
| | |
|---|---|
| G06F 19/00 | (2006.01) |
| G02B 21/00 | (2006.01) |
| H01L 21/331 | (2006.01) |
| H01L 21/336 | (2006.01) |
| F27D 19/00 | (2006.01) |
| F27B 9/02 | (2006.01) |
| H05B 1/02 | (2006.01) |
| H01L 21/8238 | (2006.01) |
| A21B 1/00 | (2006.01) |

(52) U.S. Cl. ...................... 700/207; 700/121; 700/209; 700/274; 438/225; 438/362; 438/297; 432/49; 432/128; 219/411; 219/494; 219/497

(58) Field of Classification Search ................. 700/121, 700/209, 274; 438/225, 362, 297; 432/49, 432/128; 219/411, 494, 497
See application file for complete search history.

(56) References Cited

U.S. PATENT DOCUMENTS
4,276,603 A * 6/1981 Beck et al. .................. 700/209
(Continued)

FOREIGN PATENT DOCUMENTS
JP        9-7963         1/1997
(Continued)

*Primary Examiner*—Ronald D Hartman, Jr.
*Assistant Examiner*—Sunray R Chang
(74) *Attorney, Agent, or Firm*—McGinn IP Law Group, PLLC

(57) ABSTRACT

A temperature regulating method in a thermal processing system includes controlling a heating means by performing integral operation, differential operation and proportional operation by means of a heating control section in a manner a detection temperature by a temperature detecting means becomes a predetermined target temperature, determining a first output control pattern by patterning a first operation amount for the heating control section to control the heating means depending upon a detection temperature detected by a first temperature detecting means, in controlling the heating means controlling the heating means by means of the heating control section depending upon the first output control pattern determined, and determining a second output control pattern by patterning at least a part of a second operation amount for the heating control section to control the heating means depending upon a detection temperature detected by a second temperature detecting means, in controlling the heating means.

16 Claims, 44 Drawing Sheets

U.S. PATENT DOCUMENTS

| | | | |
|---|---|---|---|
| 4,761,538 A * | 8/1988 | Chiba et al. | 219/497 |
| 5,603,772 A * | 2/1997 | Ide | 118/724 |
| 5,777,881 A * | 7/1998 | Kanno | 700/209 |
| 6,084,215 A * | 7/2000 | Furuya et al. | 219/444.1 |
| 6,746,908 B2 * | 6/2004 | Tanaka et al. | 438/225 |
| 6,767,752 B2 * | 7/2004 | Nakano et al. | 438/7 |
| 7,346,273 B2 * | 3/2008 | Tanaka et al. | 392/418 |
| 2002/0055080 A1 * | 5/2002 | Tanaka et al. | 432/49 |
| 2002/0125239 A1 * | 9/2002 | Chen et al. | 219/444.1 |

FOREIGN PATENT DOCUMENTS

| | | |
|---|---|---|
| JP | 2000-183072 | 6/2000 |
| JP | 2004-193219 | 7/2004 |

* cited by examiner

TEMPERATURE REGULATING METHOD, THERMAL PROCESSING SYSTEM AND SEMICONDUCTOR DEVICE MANUFACTURING METHOD

TECHNICAL FIELD

The present invention relates to a temperature regulating method, thermal processing system and semiconductor device manufacturing method.

BACKGROUND ART

In the equipment of semiconductor manufacture, it is a conventional practice to place its heater under control of the controller depending upon a temperature-change pattern of a preset target temperature because of the necessity of maintaining the furnace interior proper in temperature or causing the furnace interior to follow the designated change of temperature (see Patent Document 1, for example).

Patent Document 1: JP-A-2000-183072 (pages 11-21, FIG. 1)

DISCLOSURE OF THE INVENTION

Problem that the Invention is to Solve

Where using feedback control based on prior-art PID control, an overshoot or undershoot arises significantly because of the follow-up control of changing the operation amount after recognition of an increase of deviation of between a target value (target temperature) and an actual measurement value. This results in a possible necessity of much time in obtaining a stable status. As a consequence, because of repeated regulations (adjustment of preset parameters for PID operation) by a skilled operator in order to reduce the error of from the target temperature, much regulation time and cost are necessarily spent, thus hindering the improvement of operation efficiency and the reduction of cost.

The present invention has been made in order to solve the foregoing problem, and aims at providing a temperature regulating method, thermal processing system and semiconductor device manufacturing method capable of contributing to the improvement of operation efficiency and the reduction of cost.

Means for Solving the Problem

In order to solve the foregoing problem, a temperature regulating method according to the invention is a temperature regulating method in a thermal processing system having heating means for heating an interior of a process chamber to process a substrate, a heating control section for controlling the heating means, and first and second temperature detecting means for detecting a temperature in the process chamber, wherein the first temperature detecting means is arranged in a position closer to the substrate than the second temperature detecting means while the second temperature detecting means is arranged in a position closer to the heating means than the first temperature detecting means, the temperature regulating method comprising: a first step of controlling the heating means by performing integral operation, differential operation and proportional operation in a manner that a detection temperature by the temperature detecting means becomes a predetermined target temperature; a second step of determining a first output control pattern by patterning a first operation amount for the heating control section to control the heating means depending upon a detection temperature detected by the first temperature detecting means, in controlling the heating means in the first step; a third step of controlling the heating means by means of the heating control section depending upon the first output control pattern determined in the second step; and a fourth step of determining a second output control pattern by patterning at least a part of a second operation amount for the heating control section to control the heating means depending upon a detection temperature detected by the second temperature detecting means, in controlling the heating means in the third step.

Meanwhile, the temperature regulating method structured as above may be comprised of a fifth step that the substrate is processed while controlling the heating means by means of the heating controlling means, by using the second output control pattern determined in the fourth step as at least a part of the second operation amount.

Meanwhile, the temperature regulating method structured as above may be structured that the fourth step is to determine the second output control pattern by determining a heat amount, at from a ramp-up start time to a time of maximum temperature, of a detection temperature detected by the second temperature detecting means in controlling the heating means in the third step and patterning at least a part of the second operation amount of from the ramp-up start time to the time of maximum temperature by using a heat amount which is obtained by subtracting an output amount based on the proportional operation from the relevant heat amount.

Meanwhile, a thermal processing system according to the invention is a thermal processing system having heating means for heating an interior of a process chamber to process a substrate, heating control section for controlling the heating means, and first and second temperature detecting means for detecting a temperature in the process chamber, wherein the first temperature detecting means is arranged in a position closer to the substrate than the second temperature detecting means while the second temperature detecting means is arranged in a position closer to the heating means than the first temperature detecting means, the thermal processing system characterized in that: the heating control section determines a first output control pattern by performing integral, differential and proportional operations in a manner that a detection temperature by the first temperature detecting means becomes a target temperature from a temperature at a ramp-up start time and patterning a first operation amount for controlling the heating means depending upon a detection temperature detected by the first temperature detecting means upon controlling the heating means; and determining a second output control pattern by patterning at least a part of a second operation amount for controlling the heating means depending upon a detection temperature detected by the second temperature detecting means in controlling the heating means depending upon the first output control pattern.

Meanwhile, in the thermal processing system structured as above, the heating control section may process the substrate while controlling the heating means by use of the second output control pattern as at least a part of the second operation amount.

Meanwhile, in the thermal processing system structured as above, the heating control section, in a case an overshooting amount is greater than an allowable value preset such that the detection temperature detected by the first temperature detecting means exceeds the target temperature, may determine, in a manner reducing the overshooting amount, a total heat amount in a period of a process of changing a temperature of at the ramp-up start time to the target temperature into a stabilization at the target temperature, a ramp-up heat amount, required for ramp up, of the total heat amount and an overshoot heat amount which an overshoot is occurring exceeding the target temperature; determine an overshooting temperature ratio as a ratio of the total heat amount and the overshoot heat amount; and determine the first output control pattern depending upon a heat amount determined by subtracting an amount of the overshooting temperature ratio from the ramp-up heat amount.

Meanwhile, in the thermal processing system structured as above, preferably, the heating control section determines the second output control pattern by determining a heat amount of from a ramp-up start time to a maximum-temperature time indicated by a detection temperature detected by the second temperature detecting means in controlling the heating means depending upon the first output control pattern, and patterning at least a part of the second operation amount of from the ramp-up start time to the maximum temperature time by using a heat amount which is obtained by subtracting an output amount based on the proportional operation from the relevant heat amount.

Meanwhile, in the thermal processing system structured as above, in processing the substrate based on the second output control pattern, in a period of ramp up to the target temperature, the heating control section arithmetically may operate the second operation amount on a basis of a result of proportional and differential operations and the second output control pattern by use of a result which is obtained by subtracting the temperature detected by the first temperature detecting means from the target temperature, and control the heating means while performing proportional, differential and integral operations with using a result obtained by subtracting the temperature detected by the second temperature detecting means from the second operation amount arithmetically operated, when being stabilized at the target temperature, the heating control section arithmetically operating a third operation amount on a basis of a result of proportional, differential and integral operations and the second output control pattern by use of a result which is obtained by subtracting the temperature detected by the first temperature detecting means from the target temperature, and control the heating means while performing proportional, differential and integral operations with using a result obtained by subtracting the temperature detected by the second temperature detecting means from the third operation amount arithmetically operated, thereby processing the substrate.

Meanwhile, a semiconductor device manufacturing method according to the invention is a semiconductor device manufacturing method for processing a substrate by using a thermal processing system wherein a thermal processing system has heating means for heating an interior of a process chamber to process a substrate, heating control section for controlling the heating means, and first and second temperature detecting means for detecting a temperature in the process chamber, wherein the first temperature detecting means is arranged in a position closer to the substrate than the second temperature detecting means while the second temperature detecting means is arranged in a position closer to the heating means than the first temperature detecting means, the heating control section determining a first output control pattern by patterning a first operation amount for controlling the heating means depending upon a detection temperature that is detected by the first temperature detecting means in controlling the heating means by performing integral, differential and proportional operations in a manner the detection temperature by the first temperature detecting means becomes a predetermined target temperature, and determining a second output control pattern by patterning at least a part of a second operation amount for controlling the heating means depending upon a detection temperature that is detected by the second temperature detecting means in controlling the heating means on a basis of the first output control pattern, the semiconductor manufacturing method comprising: a step of loading a substrate into a process chamber; a step that the heating control section processes the substrate loaded in the process chamber while controlling the heating means by using the second output control pattern as at least a part of the second operation amount; and a step of unloading the substrate out of the process chamber.

BEST MODE FOR CARRYING OUT THE INVENTION

With reference to the drawings, explanation will be now made below on embodiments of the present invention. The invention is concerned with an automatic temperature-regulation procedure in a scheme to control the control amount outputted from heating means, by use of feedback control based on proportional/integral/differential (PID) operations on an operation amount to input to the heating means, in regulating the temperature with a thermal processing system.

First Embodiment

Figure 1:
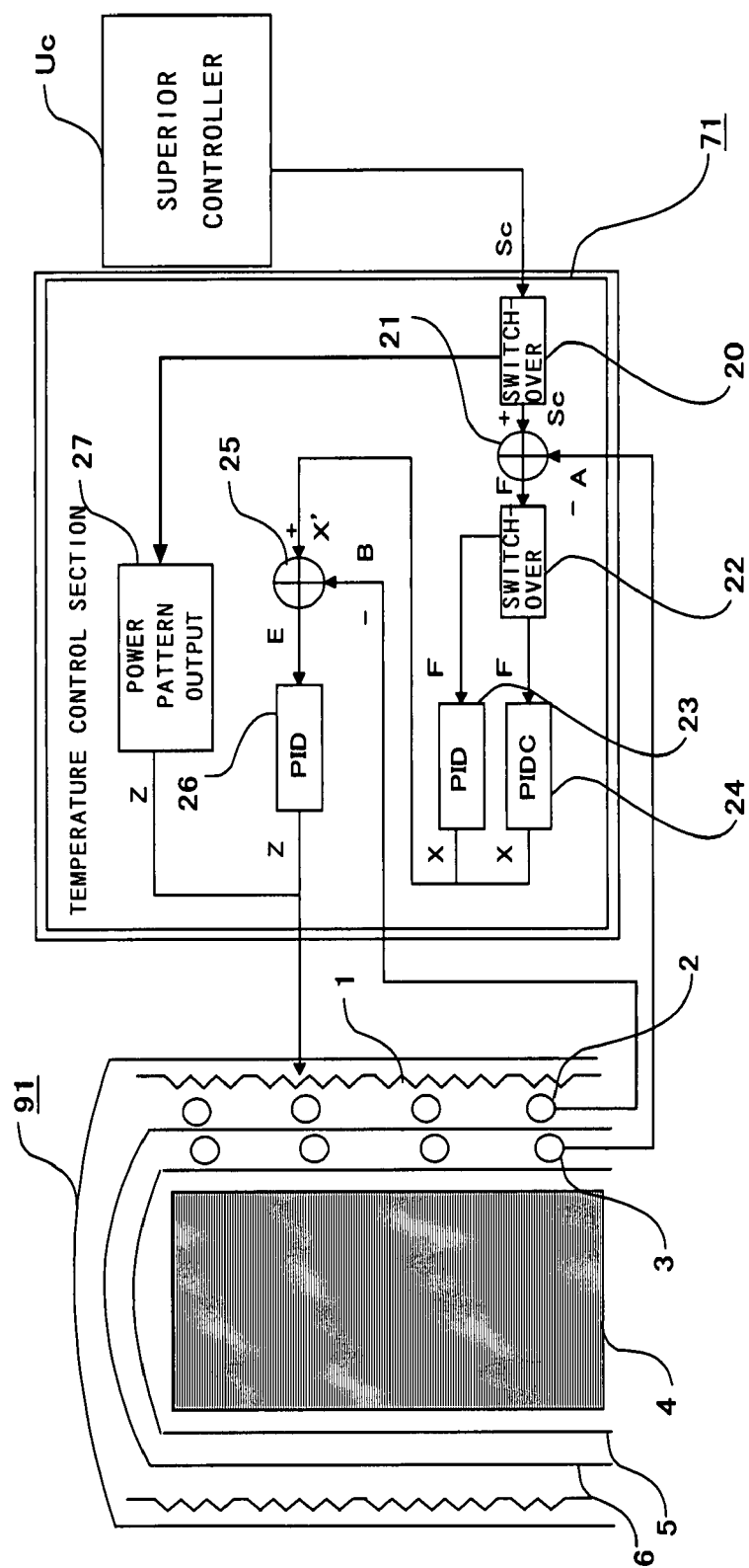
FIG. 1 is a functional block diagram for explaining a first embodiment of the present invention.
Figure 2:
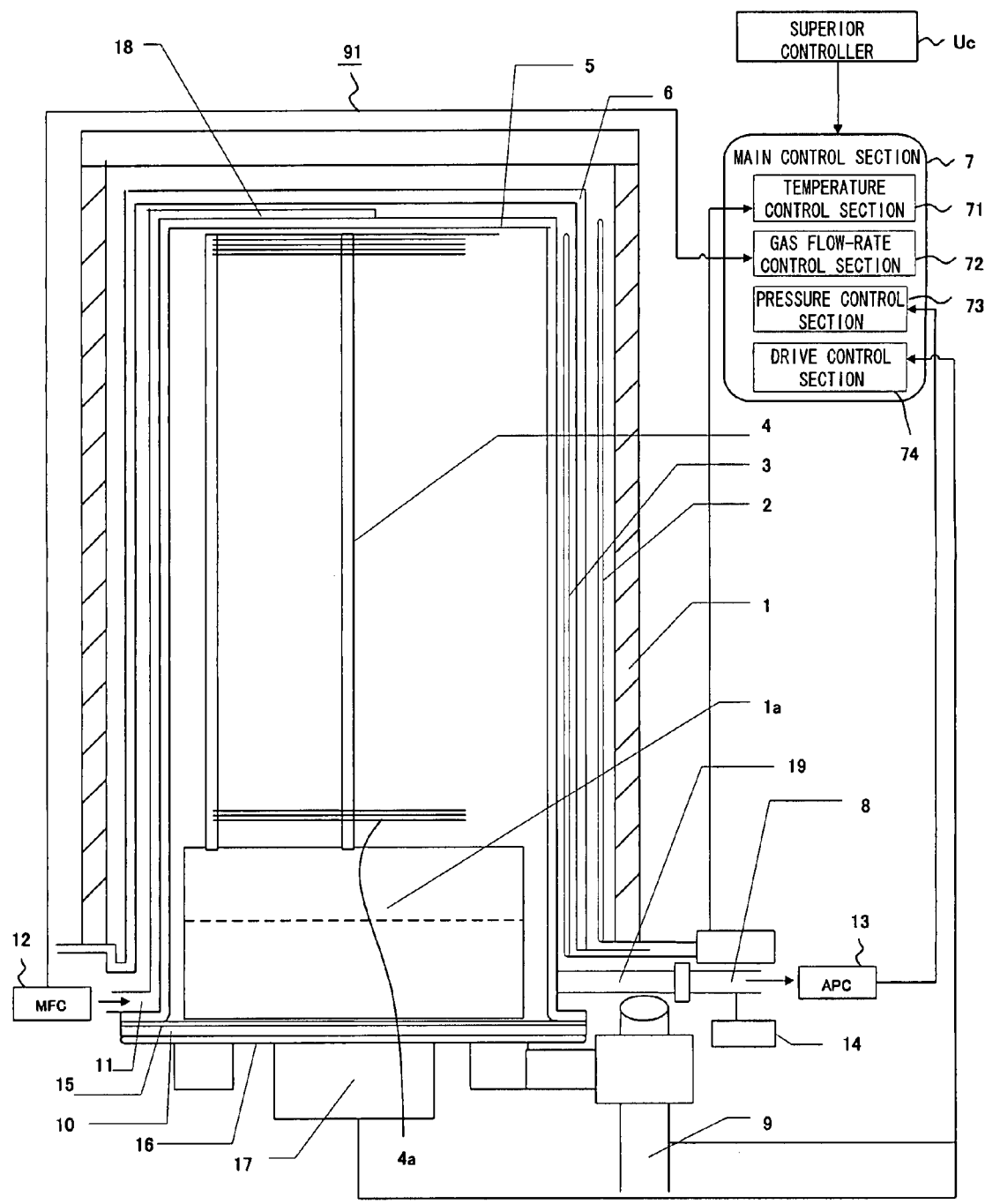
FIG. 2 is a figure for explaining the detail of a vicinity of a reactor tube of the system.

FIG. 1 is a functional block diagram for explaining a thermal processing system according to a first embodiment of the invention. FIG. 2 is a figure for explaining the detail structure in a vicinity of a reactor tube of the relevant system.

The thermal processing system in this embodiment is constructed with a reactor 91 and a main control section 7. Note that, in FIG. 1, the main control section 7 is shown by excerpting only a temperature control section 71.

The reactor 91 includes a heater (heating means) 1, a quartz cap 1a, a heater thermocouple (second temperature detecting means) 2, a cascade thermocouple (first temperature detecting means) 3, a boat 4, a reactor tube 5, a liner tube 6, a gas exit pipe 8, a boat elevator 9, a base 10, a gas supply pipe 11, a mass flow controller (MFC) 12, a pressure regulator (APC) 13, a pressure sensor 14, an O-ring 15, a seal cap 16, a rotary shaft 17, an introduction port 18 and a gas exit port 19.

The main control section 7 has a temperature regulation (heating control) 71, a gas flow-rate control section 72, a pressure control section 73 and a drive control section 74.

The liner tube 6 is formed, say, of a refractory material, such as SiC, in a cylindrical form having an upper end closed and a lower end opened. The reactor vessel (hereinafter, reactor tube 5) formed of a heat-resistant material such as quartz ($SiO_2$) is formed in a cylindrical form having an opening in a lower end thereof and arranged in and concentrically to the liner tube 6. The reactor tube 5 has a lower part to which connected are the gas supply pipe 11 and the gas exit pipe 8 that are formed of quartz, for example. The introduction port 18, connected to the gas supply pipe 11, is structured to rise in the form of a capillary from the lower part of and along the side part of the reactor tube 5, and to have a ceiling reaching the interior of the reactor tube 5. The gas exit pipe 8 is connected to the gas exit port 19 of the reactor tube 5. The gas is allowed to pass through from the gas supply pipe 11 to ceiling of the reactor tube 5 and enter the interior of the reactor tube 5 and to exit at the gas exit pipe 8 connected to the lower part of the reactor tube 5.

The introduction port 18 of the reactor tube 5 is arranged such that a gas for processing is supplied into the reactor tube 5 through the gas supply pipe 11. The gas supply pipe 11 is coupled to the mass flow controller (MFC) 12 serving as gas flow-rate control means or to a, not-shown moisture producer. The mass flow controller 12 is connected to the gas flow-rate control section 72 and structured to regulate the flow-rate of a supply gas or vapor ($H_2O$) to a predetermined amount.

The gas, flowing in the reactor tube 5, is allowed to exit at the exit port 19 of the reactor tube 5. The gas exit pipe 8, coupled to the pressure regulator (e.g. APC) 13, is connected to the exit port 19 of the reactor tube 5, to detect the interior pressure of the reactor tube 5 by means of pressure detecting means (hereinafter, pressure sensor 14). The APC 13 is placed under control of the pressure control section 73 in a manner to bring the interior pressure of the reactor tube 5 to a predetermined pressure.

A disk-like support (hereinafter, base 10) of quartz, for example, is removably provided, for hermetical seal, at the lower opening of the reactor tube 5 through the O-ring 15. The base 10 is attached on a disk-like lid (hereinafter, seal cap 16). Meanwhile, the seal cap 16 is coupled with rotating means (hereinafter, rotary shaft 17) so that rotary shaft 17 can rotate the support (hereinafter, quartz cap 1a), the substrate holding means (boat 4) and the substrate (hereinafter, wafer 4a) held on the boat 4. Meanwhile, the seal cap 16 is coupled to elevation means (hereinafter, boat elevator 9), thus being structured to ascend and descend the boat 4. The rotary shaft 17 and the boat elevator 9 are placed under control of the drive control section 74 so that those can be driven at a predetermined speed.

The heating means (hereinafter, heater 1) is concentrically arranged around the reactor tube 5. The heater 1 is controlled by the temperature control section 71 through detecting a temperature by means of the temperature detecting means (hereinafter, heater thermocouple 2 and cascade thermocouple 3), in a manner to bring the interior temperature of the reactor tube 5 to a process temperature set up at the superior controller Uc. Here, the heater thermocouple 2 serves to detect the temperature of the heater 1 while the cascade thermocouple 3 to detect the temperature at between the liner tube 6 and the reactor tube 5. Specifically, the heater 1 is divided into a plurality of zones (e.g. U zone, CU zone, CL zone, L zone, etc.) in order to regulate accurately the interior temperature of the reactor. Depending upon the deviations of between the temperature detection values of from the plurality of heating zones formed by the heater 1 and the temperature setting value, power control signals are outputted to the heater on a heating-zone basis, thus effecting temperature control. Incidentally, the heater thermocouple 2 and the cascade thermocouple 3 each have a plurality of detecting points so that detection can be made in positions corresponding, respectively, to the plurality of zones of the heater 1.

Here, the cascade thermocouple 3 is arranged between the reactor tube 5 and the boat 4, thus being structured to detect also the interior temperature of the reactor tube 5. However, the cascade thermocouple 3 and the heater thermocouple 2 may be both arranged between the heater 1 and the wafer 4a, wherein the cascade thermocouple 3 is arranged closer to the wafer 4a than the heater thermocouple 2 while the heater thermocouple 2 is closer to the heater 1 than the cascade thermocouple 3.

Now explanation is made on one example of an oxidation and diffusion in the reactor 91. At first, the boat 4 is descended by the boat elevator 9. The boat 4 holds a plurality of wafers 4a thereon. Then, the interior temperature of the reactor tube 5 is raised to a predetermined temperature while heating it up by means of the heater 1. An inert gas is previously filled in the reactor tube 5 by the MFC 12 connected to the gas supply pipe 11. By the boat elevator 9, the boat 4 is ascended into the reactor tube 5 and the interior temperature of the reactor tube 5 is maintained at a predetermined process temperature. After keeping the interior of the reactor tube 5 at predetermined pressure, the boat 4 and the wafers 4a held on the boat 4 are rotated through the rotary shaft 17. Simultaneously, a process gas is supplied through the gas supply pipe 11 or vapor is supplied through the moisture producer. The supplied gas descends the reactor tube 5, thus being supplied evenly to the wafers 4a.

In the reactor tube 5 under oxidation/diffusion processing, evacuation is made through the gas exit pipe 8 and the pressure is regulated into a predetermined pressure by the APC 13, to perform oxidation/diffusion for a predetermined time.

After completing the oxidation/diffusion in this manner, the gas in the reactor tube 5 is replaced with an inert gas in order to enter oxidation/diffusion for the next wafers 4a and the pressure is rendered to the normal pressure. Thereafter, the boat 4 is descended by the boat elevator 9, to take the boat 4 and the processed wafers 4a out of the reactor tube 5. The processed wafers 4a, placed on the boat 4 and taken out of the reactor tube 5, are exchanged with the unprocessed wafers 4a. Those are ascended again into the reactor tube 5 similarly to the foregoing and subjected to oxidation/diffusion.

Now explanation is made on the temperature control section 71 shown in FIG. 1. Note that, although the temperature control section 71 places the heater 1, the cascade thermocouple 3 and the heater thermocouple 2 under control based on each of the heating zones in a manner matched therewith, it is assumed that the following explanation is on one of the heating zones unless otherwise especially noted.

The temperature control section 71 is configured with selectors 20, 22, subtracters 21, 25, PID operators 23, 26, a PIDC operator 24 and a power-pattern output 27.

The selector 20 is to selectively switch over the control scheme, in accordance with the control mode established. Specifically, it selectively switches over between PID control (referred later) and power control (referred later).

The subtracter 21 calculates, as a deviation F, the result of subtraction of a control amount (detected temperature) A from a target value Sc established at the superior controller Uc, and outputs it to the PID operator 23 or the PIDC operator 24 by way of the selector 22.

The selector 22 is to selectively switch over the control scheme, in accordance with the control mode established. Specifically, it selectively switches over between PIDC control (referred later) and PID control.

Figure 3:
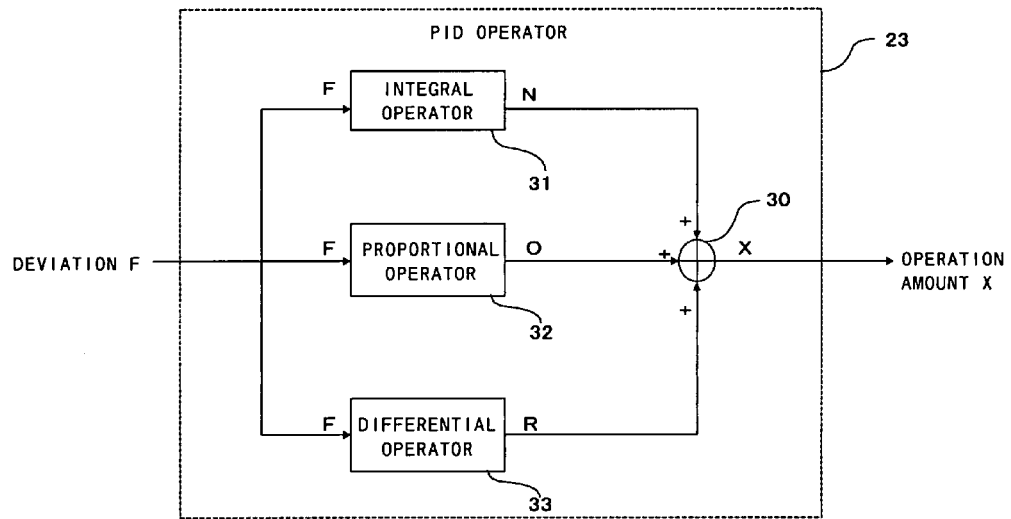
FIG. 3 is a figure for explaining the process (PID control) in a PID operator 23.

Then, explanation is made on the process (PID control) at the PID operator 23, based on FIG. 3.

As shown in FIG. 3, the PID operator 23 is configured with an adder 30, an integral operator 31, a proportional operator 32 and a differential operator 33. The integral operator 31 is to input the deviation F and to output, as an integral value N, the value which is obtained by multiplying a preset parameter Ki with the result which is obtained by time-integral-operating (I-operating) the deviation F. Provided that the deviation F at a particular time "t" is represented as F(t) and the integral value N at that time is as N(t), the integral value N can be determined according to equation (1). Incidentally, in equation (1), the integral range of ∫F(u)du lies between 0 and t.

$$N(t)=Ki \cdot \int F(u)du \quad (1)$$

The proportional operator 32 is to input the deviation F and to output, as a proportional value O, the value which is obtained by multiplying a preset parameter Kp (P-operating). Provided that the deviation F at a particular time "t" is represented as F(t) and the proportional value O at that time is as O(t), the proportional value O can be determined according to equation (2).

$$O(t)=Kp \cdot F(t) \quad (2)$$

The differential operator 33 is to input the deviation F and to output, as a differential value R, the value which is obtained by multiplying a preset parameter Kd on the result which is obtained by time-differential-operating (D-operating) the deviation F. Provided that the deviation F at a particular time "t" is represented as F(t) and the differential value R at that time is as R(t), the differential value R can be determined according to equation (3).

$$R(t)=Kd \cdot dF(t)/dt \quad (3)$$

The adder 30 is to input an integral value N, proportional value O and differential value R and to output an operation amount X by calculating the sum over those. Provided that the deviation F at a particular time "t" is represented as F(t) and the operation amount X at that time is as X(t), the operation amount X can be determined according to equation (4), from the equations (1), (2) and (3). Such arithmetic operation process at the PID operator 23 is referred to as PID operation. Incidentally, in equation (4), the integral range of ∫F(u)du lies between 0 and t.

$$X(t)=Kp \cdot F(t)+Ki \cdot \int F(u)du+Kd \cdot dF(t)/dt \quad (4)$$

Namely, as shown in FIG. 1, the target value (target temperature) Sc of from the superior controller Uc and the control amount (detected temperature) A of from the cascade thermocouple 3 are inputted to the temperature control section 71 of the main control section 7. The subtracter 21 in the temperature control section 71 outputs a deviation F which is obtained by subtracting the control amount A from the target value (target temperature) Sc. The PID operator 23 performs a PID operation by use of the deviation F and determines an operation amount X. The operation amount X is converted into a target value X' so that the target value X' and the control amount (detected temperature) B of from the heater thermocouple 2 are inputted to the subtracter 25. The subtracter 25 outputs a deviation E which is obtained by subtracting the control amount B from the target value X'. The PID operator 26 performs a PID operation by use of the deviation E and outputs an operation amount Z as an output of the temperature control section 71 that is to be inputted to the heater 1. The control amounts A, B outputted from the heater 1 are fed back again to the temperature control section 71. In this manner, the operation amount Z outputted from the temperature control section 71 is changed in real time such that the deviation F of between the target value Sc and the control amount A becomes zero. The control scheme like this is referred to as PID control.

Figure 4:
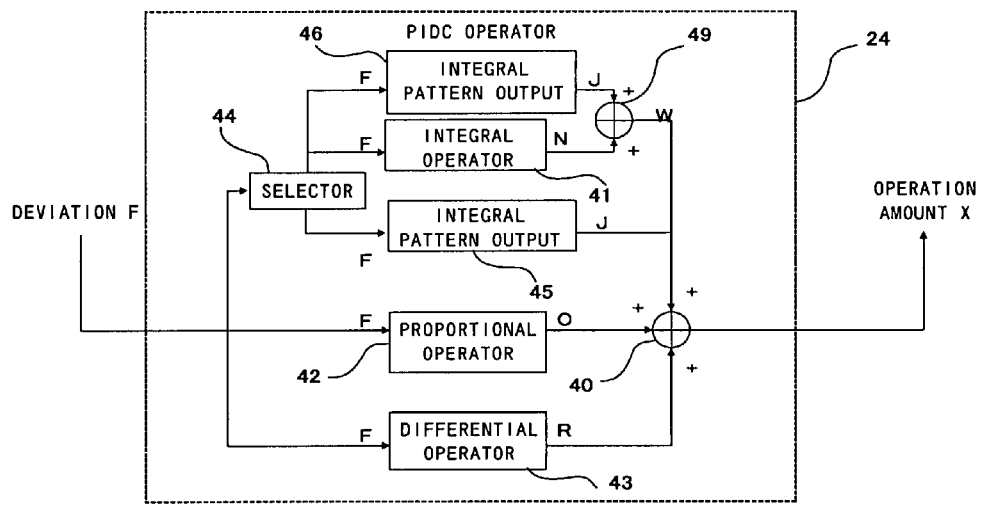
FIG. 4 is a figure for explaining a PIDC operator.

Then, explanation is made on the PIDC operator, based on FIG. 4.

As shown in FIG. 4, the PIDC operator 24 is configured with an adder 40, an integral operator 41, a proportional operator 42, a differential operator 43, a selector 44, an integral-pattern output 45 and an integral-pattern output 46.

The selector 44 is to perform a selective switchover depending upon a preset control switchover time. Specifically, it switches over to the integral-pattern output 45 or the integral-pattern output 46 + integral operator 41 at a timing t preset when control is started.

The integral operator 41 is to input the deviation F and to output, as an integral value N, the value which is obtained by multiplying a preset parameter Ki on the result which is obtained by time-integral-operating (I-operating) the deviation F. Provided that the deviation F at a particular time "t" is represented as F(t) and the integral value N at that time is as N(t), the integral value N can be determined according to equation (5). Incidentally, in equation (5), the integral range of ∫F(u)du lies between 0 and t.

$$N(t)=Ki \cdot \int F(u)du \quad (5)$$

Figure 5:
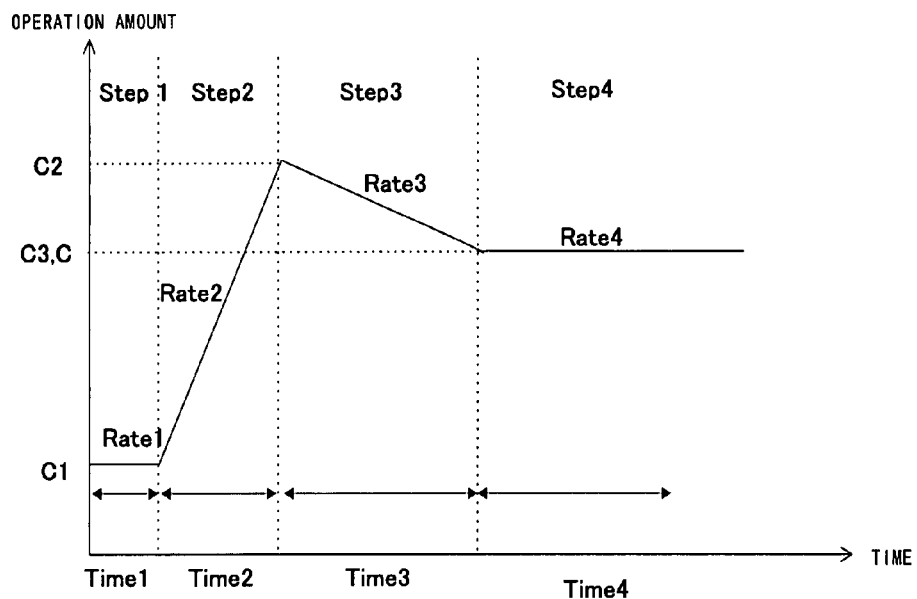
FIG. 5 is a figure for explaining an integral output pattern.

Here, the integral output pattern is a previous setting of output value of integral operation suitably for the process, in place of integral output. The integral-pattern outputs 45, 46 are to output an integral-pattern value J depending upon a preset output pattern. FIG. 5 is a figure exemplifying an integral-output pattern. The superior controller Uc is allowed to set up an output value C, rate and time, for each of a plurality of steps (steps 1-4) for temperature regulation. Provided that a certain step is at I-th step, the output value C(I−1) in the preceding step is changed at a rate (I) to an output value C(I). After reaching the output value C(I), output is continued by keeping the output value at C(I). After a start of I-th step, the next, (I+1)-th step is entered at a lapse of time (I). The output value J is assumed as J(t) at a certain particular time "t".

The adder 49 is to input the integral-pattern value J of from the integral-pattern output 46 and the integral-operated value N of from the integral operator 41, and output an integral-operation amount W by calculating the sum over those.

Namely, provided that the deviation F at a particular time "t" is represented as F(t) and the integral operation amount W at that time is as W(t), when the selector 44 performs a switchover of between the integral-pattern output 45 and the integral-pattern output 46 + integral operator 41, the integral operation amount W can be determined according to equation (6). The integral operation amount W is given as a sum of an integral-pattern value (J(t)) and an integral-operated value. Incidentally, in equation (6), the integral range of ∫F(u)du lies between 0 and t.

$$W(t)=J(t)+Ki \cdot \int F(u)du \quad (6)$$

The proportional operator 42 is to input the deviation F and to output, as a proportional value O, the value which is obtained by multiplying (P-operating) a preset parameter Kp. Provided that the deviation F at a particular time "t" is represented as F(t) and the proportional value O at that time is as O(t), the proportional value O can be determined according to equation (7).

$$O(t)=Kp \cdot F(t) \quad (7)$$

The differential operator 43 is to input the deviation F and to output, as a differential value R, the value which is obtained by multiplying a preset parameter Kd on the result which is obtained by time-differential-operating (D-operating) the deviation F. Provided that the deviation F at a particular time "t" is represented as F(t) and the differential value R at that time is as R(t), the differential value R can be determined according to equation (8).

$$R(t)=Kd \cdot dF(t)/dt \quad (8)$$

The adder 40 is to input the integral operation amount W or integral-pattern value J, the proportional value O and the differential value R and output an operation amount X by calculating the sum over those. Provided that the deviation F at a particular time "t" is represented as F(t) and the operation amount X at that time is as X(t), the operation amount X is determined from the equations (6), (7) and (8), according to equation (9a) or (9b). This is referred to as PIDC operation.

$$X(t)=W(t)+Kp \cdot F(t)+Kd \cdot dF(t)/dt \quad (9a)$$

$$X(t)=J(t)+Kp \cdot F(t)+Kd \cdot dF(t)/dt \quad (9b)$$

Namely, as shown in FIG. 1, when the target value Sc of from the superior controller Uc and the control amount A of from the cascade thermocouple 3 are input to the temperature control section 71, the subtracter 21 of the temperature control section 71 outputs a deviation F which is obtained by subtracting the control amount A from the target value Sc. When the deviation F is inputted to the PIDC operator 24 by means of the selector 22, the PIDC operator 24 determines an operation amount X by use of the deviation F, the preset integral-pattern integrated value and the proportional and differential operators and so on. The operation amount X is converted into a target value X' so that the target value X' and the control amount B of from the heater thermocouple 2 are inputted to the subtracter 25. The subtracter 25 outputs a deviation E which is obtained by subtracting the control amount B from the target value X'. The PID operator 26 performs a PID operation by use of the deviation E and outputs an operation amount Z as an output of the temperature control section 71 that is to be inputted to the heater 1. The control amounts A, B outputted from the heater 1 are fed back again to the temperature control section 71. In this manner, the operation amount Z, to be outputted from the temperature control section 71, is changed in real time such that the deviation F of between the target value Sc and the control amount A becomes zero. The control scheme like this is referred to as PIDC control.

Then, explanation is made on the power-pattern output 27.

Figure 6:
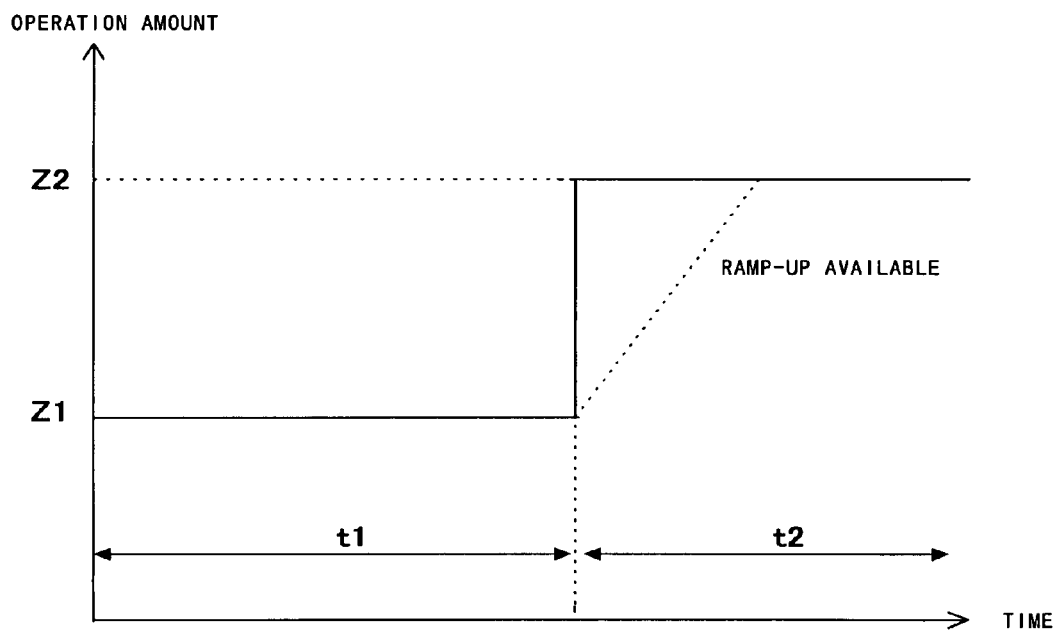
FIG. 6 is a figure for explaining power control.

Here, the power pattern is a previous setting of a to-heater output value including integral, differential and proportional operation amounts in a manner matched to the process, in place of a to-heater output value including integral, differential and proportional operation amounts. The power pattern output 27 is to output the operation amount Z depending upon a preset pattern. Specifically, it outputs a certain constant operation amount Z1 at a certain particular time t1, and outputs a certain constant operation amount Z2 at a certain particular time t2 after the passage of t1, as shown in FIG. 6, for example. On this occasion, ramping is available by means of an inclination (operation amount/time) previously set upon a shift of from the operation amount Z1 to the operation amount Z2. The control scheme, that an operation amount is determined and outputted depending upon a pattern previously prepared with time, operation amount and inclination in this manner, is referred to as power control.

Figure 7:
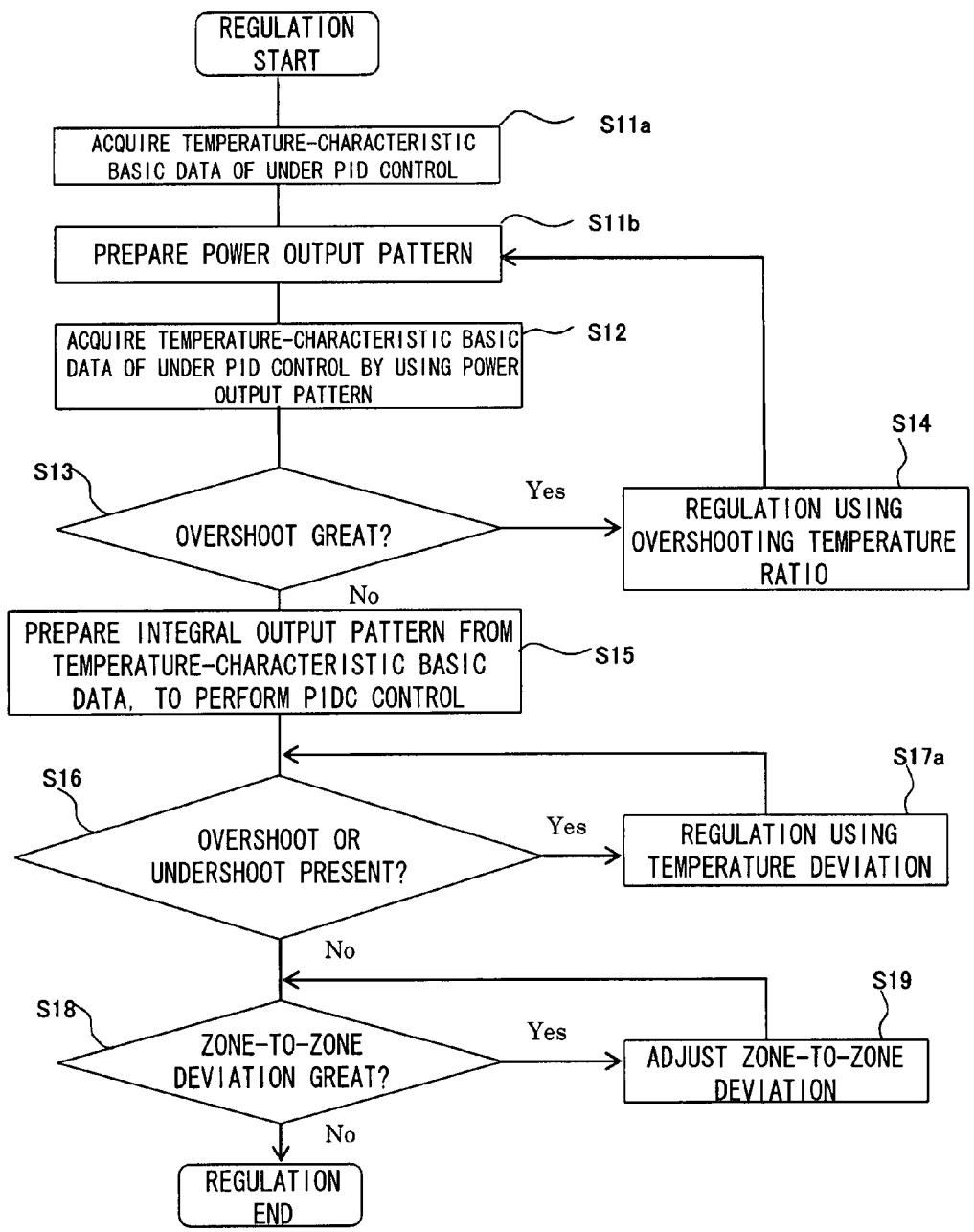
FIG. 7 is a flowchart for explaining the procedure in a temperature regulating method.

FIG. 7 is a flowchart for explaining the temperature regulation method according to the present embodiment. Described herein is the case that ramp-up is made from the initial temperature S to a target temperature S' thus reaching a stable process. Incidentally, ramp-up herein signifies a process step of temperature rise.

At first, using the standard PID parameters (Ki, Kp, Kd) under PID control, the temperature control section 71 places the heater under temperature control such that the detected temperature by the cascade thermocouple becomes a predetermined target temperature (first step), to thereby acquire temperature-characteristic basic data (temperature data detected by the cascade thermostat) (S11a).

Figure 8:
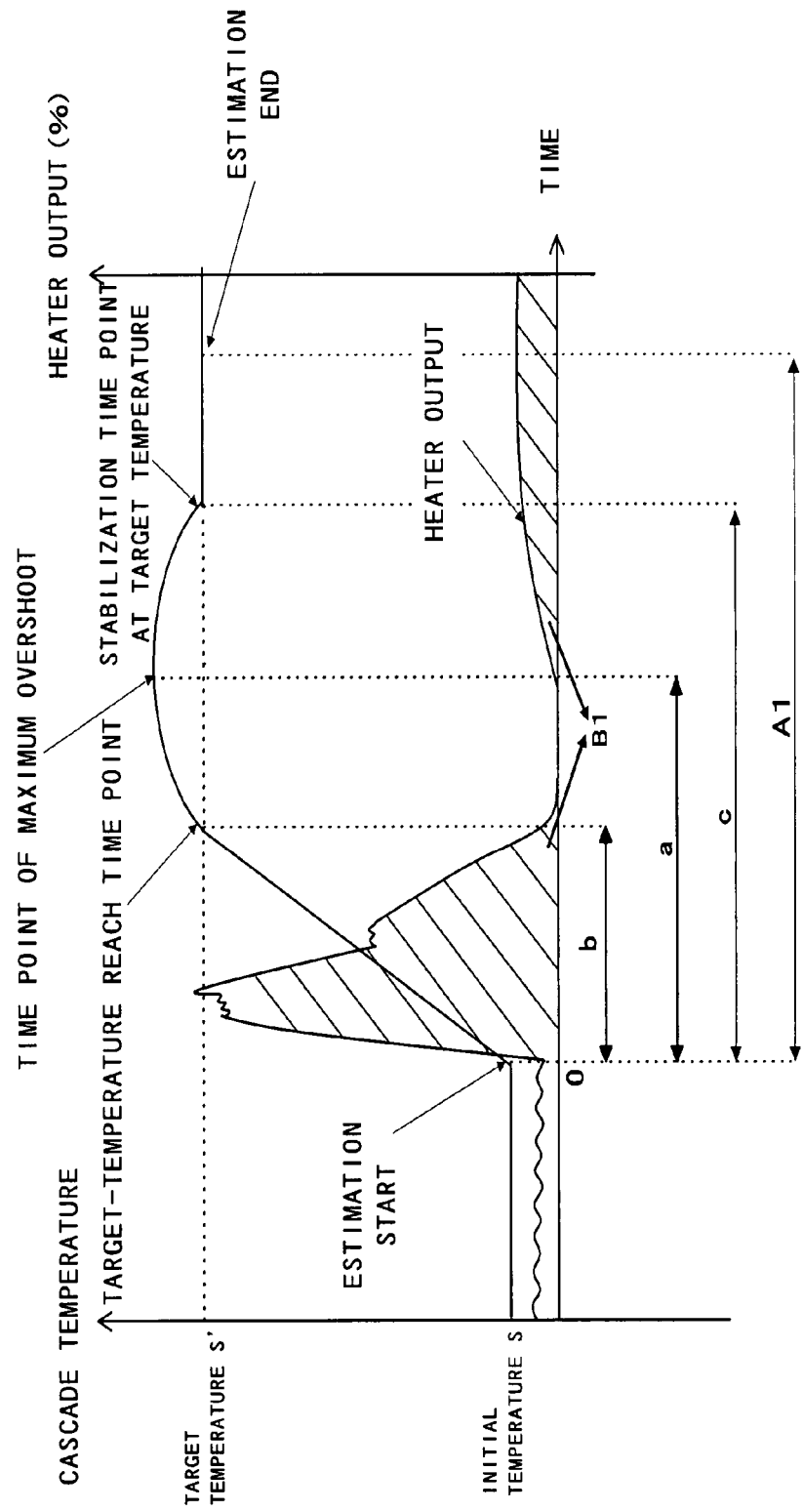
FIG. 8 is a figure for explaining the parameter to be determined based on temperature-characteristic basic data.

Then, a temperature-regulation estimating time A1 [min] (based on the measurement temperature of the cascade thermocouple) of from a ramp-up start (temperature rise start) is determined depending upon the temperature-characteristic basic data, as shown in FIG. 8. Meanwhile, determined are a maximum-overshoot time of the temperature indicated by the cascade thermocouple 3 (time of from a ramp-up start to a time the overshoot maximizes) "a" [min], a target-temperature S' reach time "b" [min], a stabilization time "c" [min] at target temperature S' and an operation amount "d" [%] at a stabilization at the target temperature. Meanwhile, determined are an operation amount e(t) [%] at each time within the temperature-regulation estimating time A1, a temperature f(t) [° C.] the heater thermocouple 2 indicates, and a temperature g(t) [° C.] the cascade thermocouple 3 indicates.

Then, determined is a total heat amount B1 [%*min] over the temperatures the cascade thermocouple 3 indicates (hereinafter, referred also to as cascade temperature) in the temperature-regulation estimating time A1. Incidentally, in equation (10), the integral range of $\int e(t)dt$ lies between 0 and A1.

$$B1 = \int e(t)dt \tag{10}$$

Provided that the total heat amount in the temperature-regulation estimating time A1 is a stable amount of heat C1 [%*min] on the assumption that it is stable at the temperature of the target temperature S' over the entire range of the temperature-regulation estimating time A1 and output is only the operation amount "d" in a stabilization at the target temperature S', then C1 can be determined by the following equation (11).

$$C1 = d*A1 \tag{11}$$

Using B1, C1 determined from equations (10), (11), the heat amount determined by the following equation (12) is taken as a ramp-up heat amount D1 [%*min].

$$D1 = B1 - C1 \tag{12}$$

Here, ramp-up heat amount is explained. The heat amount, determined by PID operation as to a duration of from a ramp-up start from the initial temperature to a desired target temperature S' up to a stabilization, includes two types of heat amounts, i.e. the heat amount required in stably sustaining at the target temperature S' and the heat amount required in raising the temperature to the target temperature while following the set value.

For this reason, with assumption that outputting is continued with the operation amount in a stabilization at the target temperature, from the total heat amount determined by equation (10), it is possible to obtain a ramp-up heat amount, i.e. heat amount required for ramp up by subtracting the stable amount of heat.

As described before, the temperature rises while following the set value in a duration of from a ramp-up start to a target temperature. However, the ramp-up heat amount is excessively great, an overshoot results wherein the temperature continues rising even after exceeding the target temperature. Such an overshoot is a phenomenon which is not requisite in temperature control. There is a need to eliminate it to a possible less extent. Here, the factor of overshoot is latent in the ramp-up heat amount of among the total heat amount instead of the stable amount of heat. By using an output pattern on which a heat amount ratio related to the overshoot factor that is latent in the ramp-up heat amount is reflected, the interior of the reactor can be stabilized swiftly at an ideal temperature.

Figure 9:
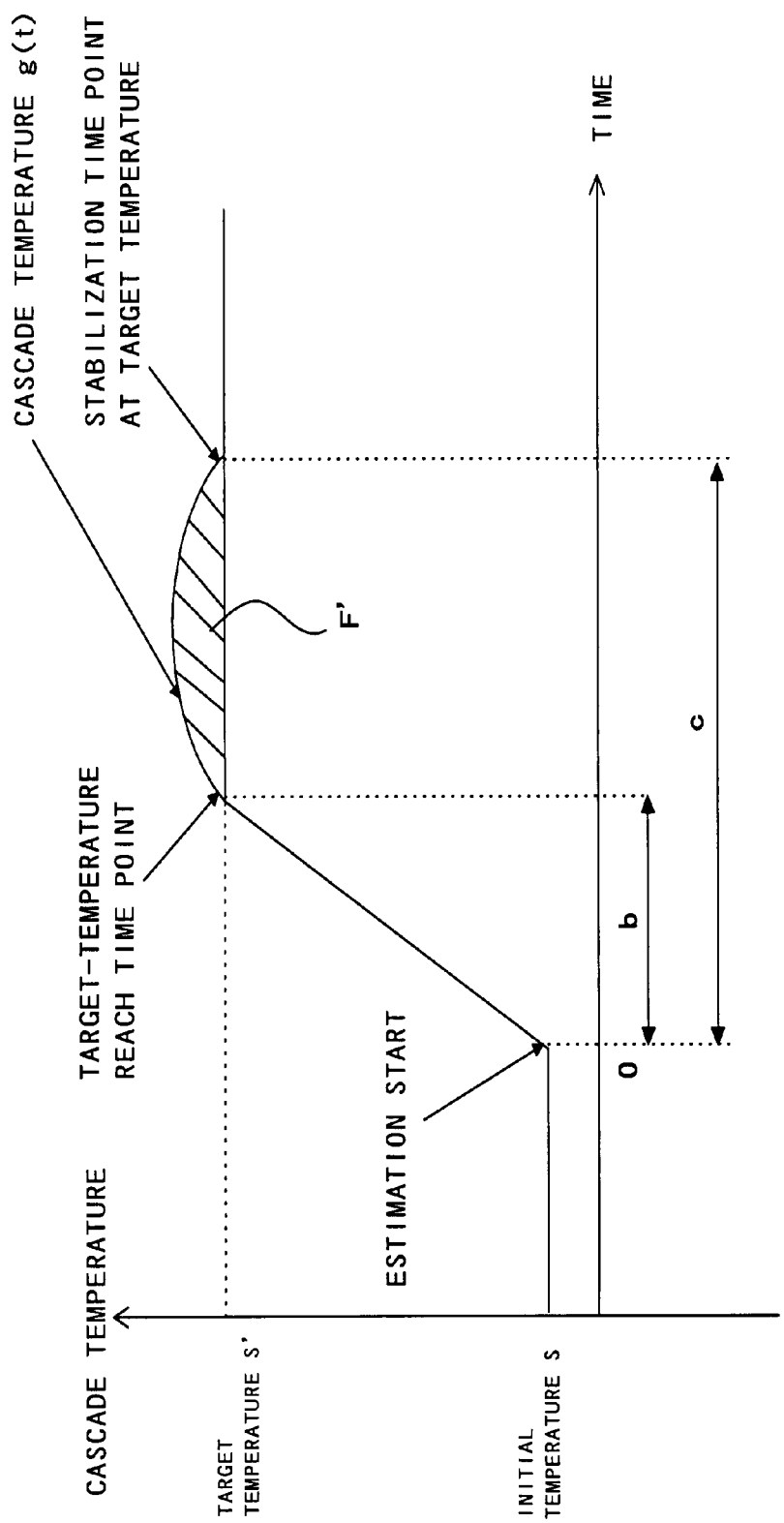
FIG. 9 is a figure for explaining the total sum over cascade temperatures overshot.

Then, as shown by the hatching in FIG. 9, determined is a total sum over the cascade temperatures at which overshoots occur in the duration of from a reach time "b" to target temperature S' after an estimation start and a target-temperature S' stabilization time "c". If this is assumed an overshooting-temperature total sum F', F' can be determined by the following equation (13). Incidentally, in equation (13), the integral range of $\int g(t)dt$ lies between b and c.

$$F' = \int g(t)dt - S'*(c-b) \tag{13}$$

Figure 10:
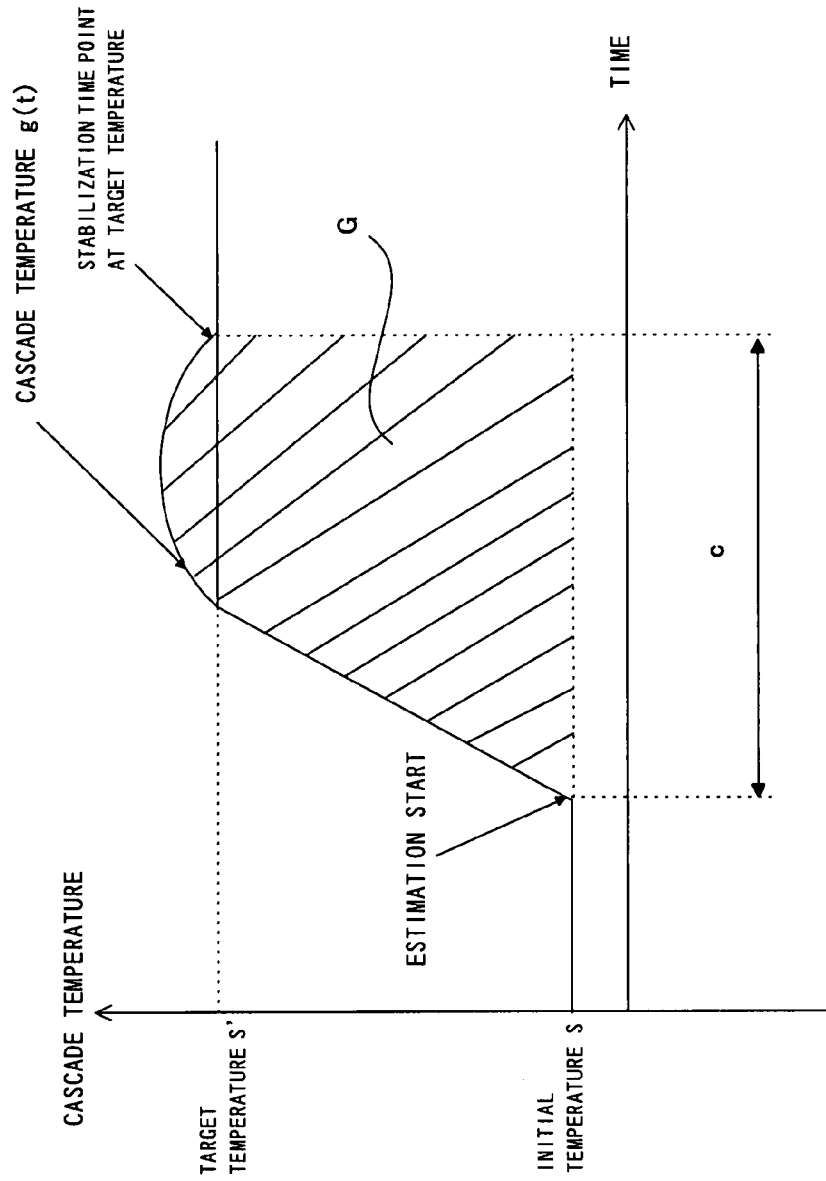
FIG. 10 is a figure for explaining the total sum over temperatures in a duration of from an estimation start up to an target-temperature S' stabilization time "c".

Then, as shown by the hatching in FIG. 10, determined is a total sum over the temperatures of between the estimation start and the target-temperature S' stabilization time "c". If this is assumed as a temperature total sum G, G can be determined by the following equation (14). Incidentally, in equation (14), the integral range of $\int g(t)dt$ lies between 0 and c.

$$G = \int g(t)dt - S*c \tag{14}$$

Then, the ratio H of overshooting temperature [percentage] is determined. This is the ratio of the total sum F' of overshooting temperatures relative to the total sum G of temperatures, as shown in FIG. 10. Accordingly, it can be determined by the following equation (15).

$$H = F'/G \tag{15}$$

The amount of overshooting-temperature ratio H is a ratio of the heat amount related to the overshoot factor latent in the ramp-up heat amount D1. For this reason, by subtracting the amount of overshooting-temperature ratio H from the ramp-up heat amount D1 thereby reflecting the same upon the ramp-up heat amount D1, overshoot can be suppressed, thus being stabilized swiftly to the furnace interior at an ideal temperature. Provided that the ramp-up heat amount after eliminating the overshooting-temperature ratio H is taken D1', D1' can be determined by the following equation (16).

$$D1'=D1*(1-H) \quad (16)$$

Using "a", "d" and "d1" determined as above, a pattern for power output pattern (corresponding to a first output control pattern) is determined (second step) thus effecting power control (third step). Namely, Depending upon the temperature detected by the cascade thermocouple under the heater control in the first step, patterning is made for the operation amount (a first operation amount) for placing the heater under control (refer to the operation amount shown in FIG. 11). By determining a first output control pattern, the heater is placed under control based on the first output control pastern. Namely, based on the temperature data detected by the cascade thermocouple, patterning is made for the first operation amount that is an operation amount to regulate a power output pattern, thus determining a power output pattern.

Figure 11:
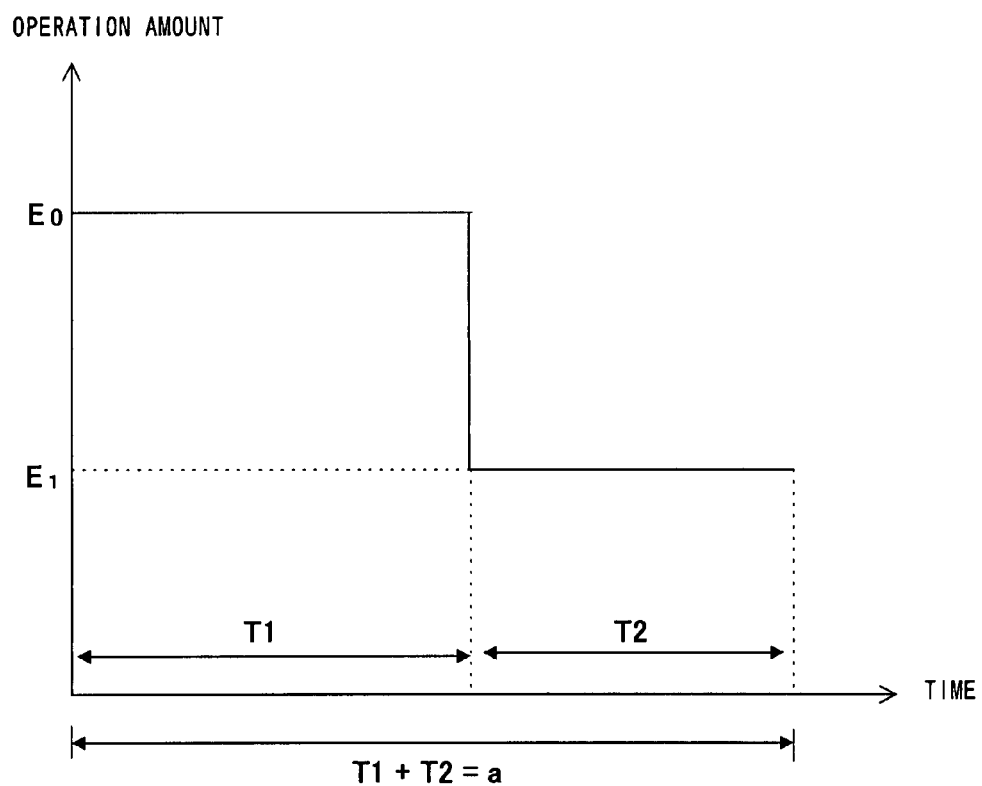
FIG. 11 is a figure for explaining the relationship between an operation amount and a time.

As for a power output pattern, determined is a pattern shown in FIG. 11 (S11b). If the ramp rate (° C./min) is assumed "h", the parameters in FIG. 11 are to be determined by the following equations (17)-(20). Note that the ramp rate means a rate (inclination) of temperature change, e.g. when raising the temperature from 100° C. to 200° C. in 5 minutes, the ramp rate is (200° C.-100° C.)/5 minutes=20° C./min.

$$E0=(D1'/T1)+d \quad (17)$$

$$E1=d \quad (18)$$

$$T1=(S'-S)/h \quad (19)$$

$$T2=a-T1 \quad (20)$$

Here, E0 is a value which is obtained by dividing D' by the time of the time T1 of reaching from the initial temperature S to a target temperature S' with the ramp-up heat amount D1' being taken as a constant output amount and then added with the operation amount "d" (%) in stabilization at target temperature (i.e. operation amount for T1). Meanwhile, S represents the initial temperature.

After T1, nothing is allowed to output other than the operation amount "d" in a stabilization at target temperature until reaching the "a" (min) at which the cascade temperature attains the maximum in temperature (maximum-overshooting time).

By using the power output pattern, it is possible to obtain a temperature waveform, represented by the heater thermocouple 2, that is to follow the ramp rate h and be stabilized swiftly. This is acquired as temperature characteristic data of under power control(S12).

Then, overshooting amount is determined on the basic temperature data of under power control (S13). In the case the overshooting amount is greater than a preset allowable overshoot value (S13, Yes), the foregoing equations (13)-(20) are used to modify the power output pattern from the ratio of the temperature waveform entirety and the overshoot area, thus effecting a regulation in a manner relieving the overshoot (S14). With the power output pattern thus modified, power control is performed again (third step), to acquire temperature characteristic data under that control (S12).

Figure 12:
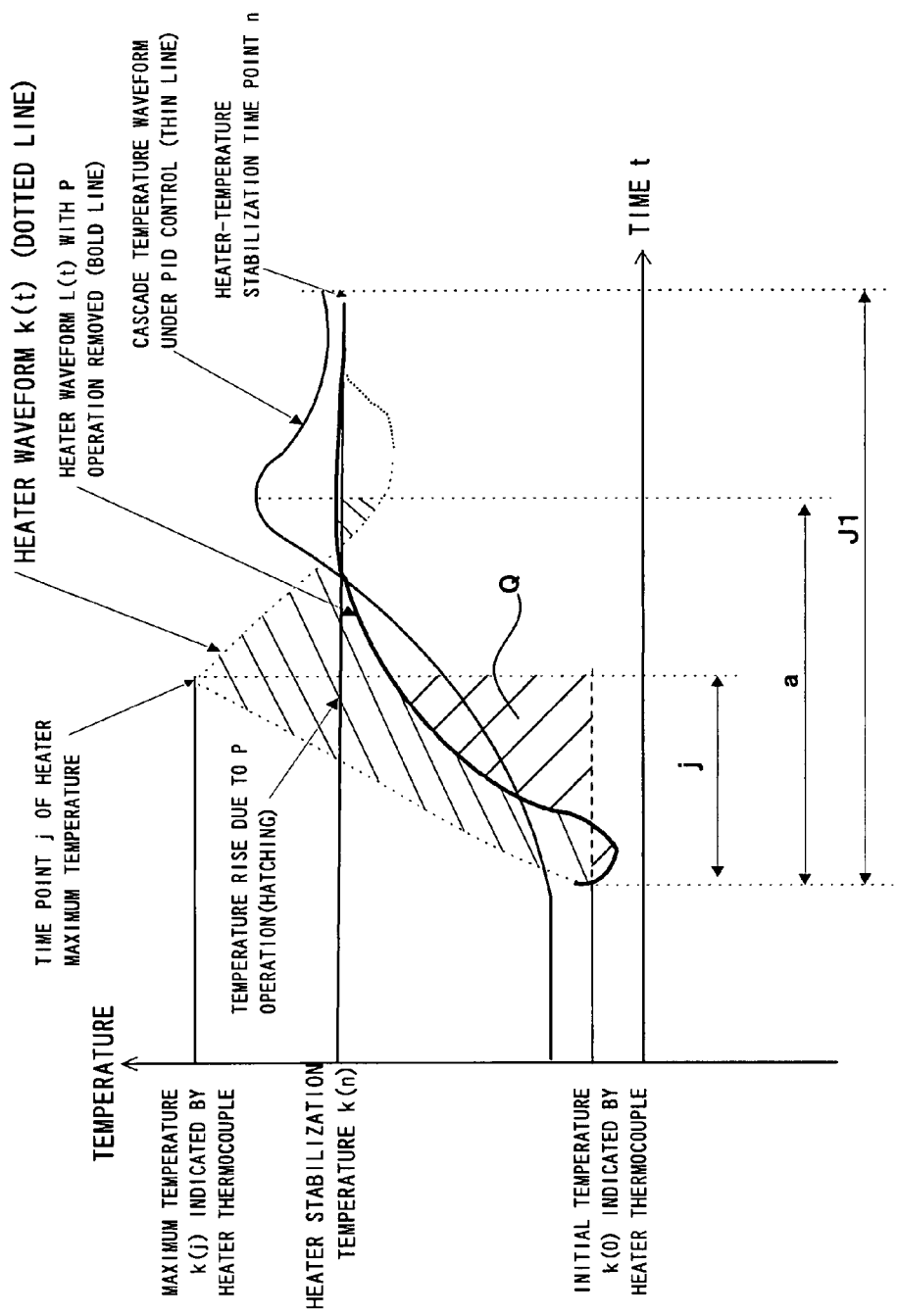
FIG. 12 is a figure for explaining a to-heater waveform L (t) which is obtained by subtracting a P-operation amount from a waveform of k(t).

Then, in the case the overshooting amount is not greater than a preset allowable overshoot value (S13, No), as shown in FIG. 12, determined is a temperature-regulation estimating time J1 [min] of from a start of power control, from the temperature transition (temperature waveform) to the cascade thermocouple under PID control acquired in the first step and the temperature-characteristic basic data of under power control acquired in the third step. Meanwhile, determined are a time "j" [min] at which the heater thermocouple 2 indicates the maximum temperature and a time "n" [min] at which the heater thermocouple 2 indicates a temperature fully stable. Here, it is assumed that the temperature at which the heater thermocouple 2 indicates is k(t) [° C.] while the temperature at which the cascade thermocouple 3 indicates is m(t) [° C.], under power control, at each time within the temperature-regulation estimating time J1 (hereinafter, referred to as a heater waveform).

Figure 13:
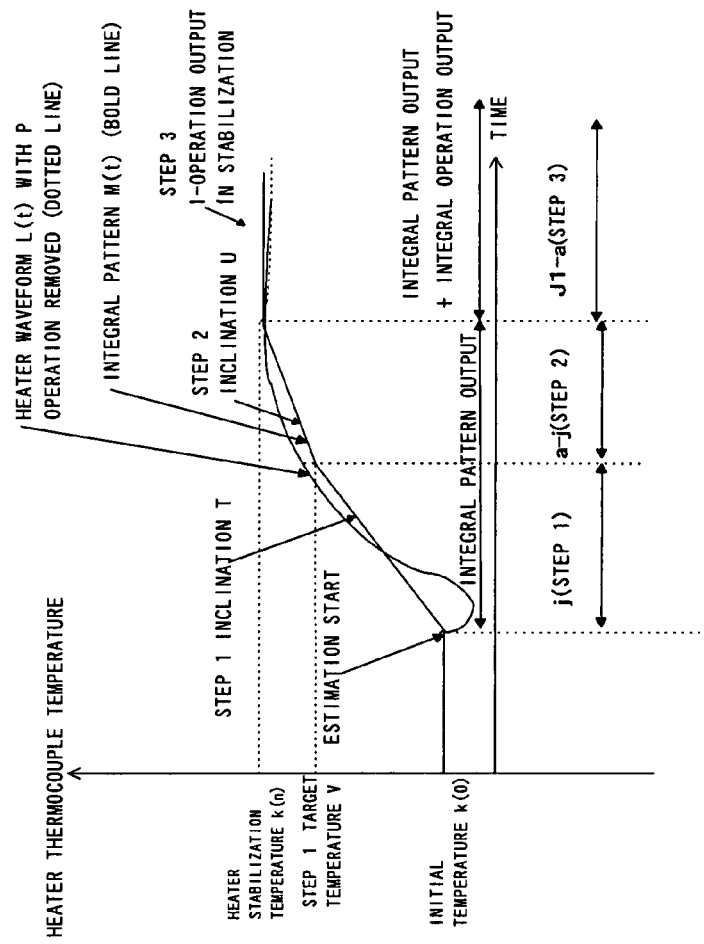
FIG. 13 is a figure for explaining an integral output pattern M(t).

From the data, determined is an integral output pattern (corresponding to a second output control pattern) M(t) as shown in FIG. 12, based on the heater waveform L(t) which is obtained by subtracting the amount of P operation from the temperature k(t) waveform the heater thermocouple 2 indicates under power control as shown in FIG. 13 (fourth step) (S15). Namely, depending upon the heater waveform L(t), patterning is made on at least part of the second operation amount (see the operation amount shown in FIG. 5) that is an operation amount defining an integral output pattern, thus determining an integral output pattern Here, the reason, of subtracting the amount of P (proportional) operation from the temperature k(t) waveform the heater thermocouple 2 indicates, is because k(t) is acquired by preparing a power output pattern on the basis of the output calculated by a PID operation under PID control and hence the waveform is based on the total sum over the P (proportional), I (integral) and D (differential) outputs.

For this reason, if subtracting the amount of P and D outputs, a desired integral output pattern M(t) can be determined. Here, because the D output is generally slight upon ramp up, the D output can be ignored.

Then, determined is the heat amount in a duration of up to a time j of maximum heater temperature which the heater waveform k(t) represents from an estimation start, that which is obtained by subtracting k(0)·j from the heater temperature waveform L(t) which is obtained by subtracting the amount of P operation. It is assumed as Q. Incidentally, in equation (21), the integral range of ∫L(t)dt lies between 0 and j.

$$Q=\int L(t)dt-k(0)\cdot j \quad (21)$$

By dividing this Q by the time of up to the time point j of maximum heater temperature, a value M can be determined that is equal to Q in area (heat amount) and constant in heater temperature in the duration of from the estimation start to the time point "j".

(area(heat amount) of a rectangule having a bottom side j and a height M=area(heat amount)of Q)

$$M=Q/j \quad (22)$$

By doubling this M, a triangle can be determined that has a bottom side j and a height M*2 and is equal to Q in area (heat amount). Using the height and inclination of the triangle and k(0)·j, provides a suitable integral output pattern with a equal heat amount to the heat amount based on the temperature the heater thermocouple indicates with the amount of P operation eliminated (hereinafter, referred also to as heater thermocouple temperature).

As shown in FIG. 13, step 1 is assumed to be the duration of between an estimation start and a time point "j" of maximum temperature indicated by the heater thermocouple under power control, and step 2 is to be the duration of between the time point "j" of maximum temperature (indicated by the heater thermocouple) under power control and the time "a" of maximum cascade temperature of under PID control.

The temperature in step 1, if applying the foregoing triangular height and inclination, provides a suitable integral output pattern of from the estimation start to the time point "j" of maximum temperature indicated by the heater thermocouple under power control. Namely, the heater thermocouple maximum time point under power control lies in a time point when there becomes free of the effect of the output for ramp-up due to heating of the heater, i.e. ramp-up heat amount, upon the temperature the heater thermocouple detects. It is proper to prepare an integral output pattern in a manner ramp up is made up to this time point.

At and after the reach time point to maximum temperature indicated by the cascade thermocouple under PID control that is the end time point of step 2, there is eliminated the effect of the variation in heater's heating upon the temperature the cascade thermocouple detects. Namely, in case the cascade temperature reaches the target temperature S' at this time point, it thereafter stabilizes at the target temperature S' without encountering an overshoot. Namely, the time point of reaching maximum temperature indicated by the cascade thermocouple is a time point that there becomes eliminated the effect of heater's heating upon the output to ramp, i.e. of ramp-up heat amount upon the temperature the cascade thermocouple detects. It is proper to prepare an integral output pattern in a manner ramp-up is made up to this time point.

Therefore, for the integral output pattern, in case patterning is made in a manner the output thereof stabilizes at a time when the detection temperature of the cascade thermocouple maximizes under PID control, an integral output pattern is suitable for step 2. It is satisfactory to make a linear patterning to the heater temperature k(n) at a time "n" when the heater thermocouple is fully stabilized from the step 1 target temperature V. Incidentally, it may be made such that the detection temperature of the cascade thermocouple maximizes under power control instead of providing PID control.

By the following equations (23)-(26), determination can be made for the parameters in FIGS. 12 and 13, i.e. L(t) [° C.] (heater temperature obtained by subtracting the amount of P), V [° C.] (step 1 target temperature in FIG. 13), T [° C./min] (step 1 inclination in FIG. 13) and U [° C./min] (step 2 inclination in FIG. 13).

$$L(t)[° C.]=(\text{heater waveform}-P\text{-operation output amount})=k(t)-[P\text{-constant } Kp^*(\text{target temperature } S'\text{-cascade temperature } m(t) \text{ under power control}) \quad (23)$$

From equations (21) and (22), $$V[° C.]=(\int L(t)dt/j)\times 2 \quad (24)$$

$$T[° C./min]=(V-k(0))/j \quad (25)$$

$$U[° C./min]=(k(n)-V)/(a-j) \quad (26)$$

By preparing an integral output pattern from the equations like the above, PIDC control is effected (S15). Incidentally, in equation (24), the integral range of ∫L(t)dt lies between 0 and j.

Specifically, initial and target values, rates and time are set up step by step as shown in FIG. 13, thus making an output along the steps. Meanwhile, the integral output pattern in its transition can be prepared by using more steps instead of the foregoing two steps.

Figure 14:
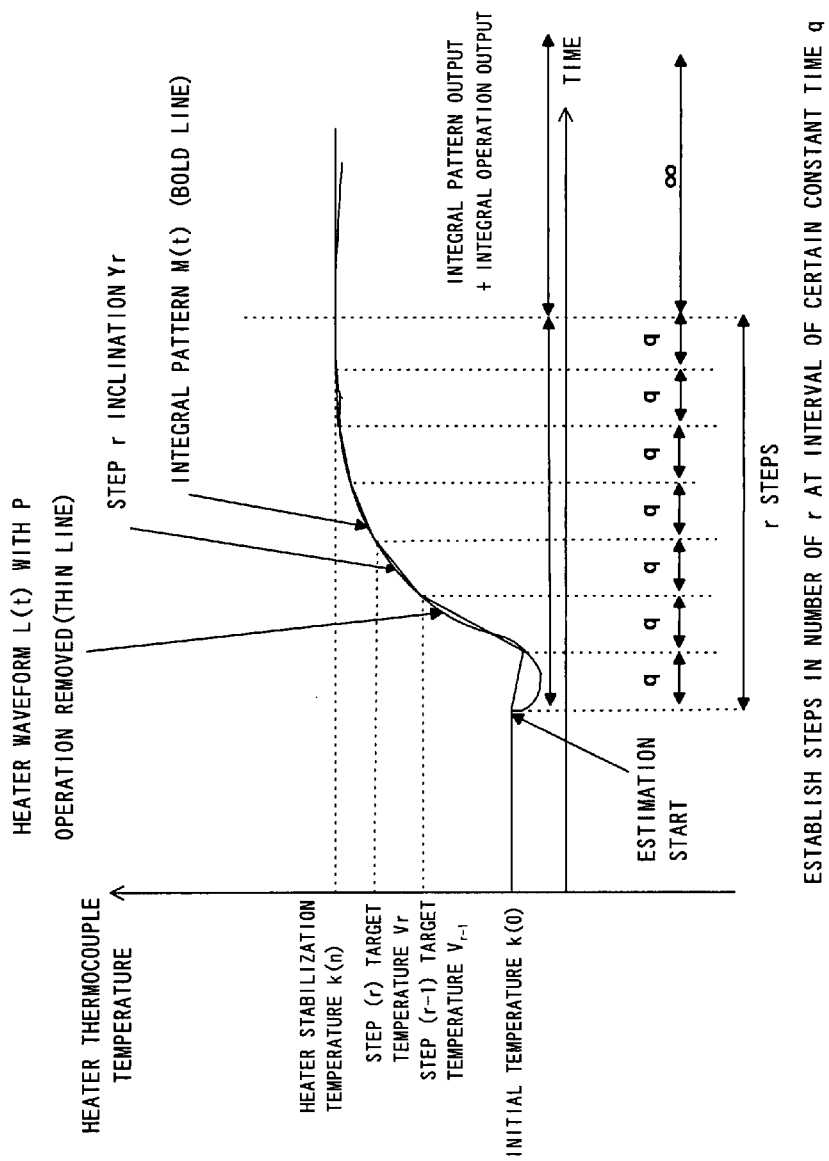
FIG. 14 is a figure for explaining a target temperature and ramp rate where setting steps "r" in the number are set for an integral pattern output at an interval of certain constant time.

In case the steps of outputting an integral pattern, say, are set up "r" in the number at an interval of constant time "q" [min] in its temperature transition as shown in FIG. 14, the target temperature Vr and ramp rate (inclination) Yr in each step STEP(r) can be determined by the following equations (27) and (28).

$$Vr[° C.]=(\int L(r^*q)dt/q)^*2 \quad (27)$$

$$Yr[° C./min]=(V(r-1)-V(r))/q \quad (28)$$

By preparing an integral output pattern as above, the integral output can be prevented from increasing during the transition of temperature. Meanwhile, by using the waveform of under power control as a basis, the furnace interior can be stabilized shortest in time to the target temperature S'.

Furthermore, in the thermal processing system of this embodiment, where overshoot or undershoot is great in the integral output pattern despite carrying out PDIC control or there is a need to improve the significant deviation between heating zones, there is provided a function to regulate those. For example, although excessive integral operation values are excluded by using the integral output pattern, there is on the other hand a possibility that the timing of ramp-up is delayed by the effect thereof thus excessively increasing the proportional operation value, etc. For this reason, there encounters a case that those are required to regulate.

Explanation is made below on the improvement and regulation of overshoot and undershoot. As per the foregoing, in the invention, patterning is made for the integral output in a temperature transition while an integral output pattern is prepared such that the amount of integral output in a temperature stabilization is given as that in stabilization, and added to the integral operation output, thereby effecting temperature regulation. Here, the reason of using the integral operation output in a temperature stabilization is that bad effects tend to appear comparatively conspicuously due to a somewhat temperature change, e.g. unexpectable disturbances, as compared to those in ramp-up, and hence the incapability of coping therewith, by means of only the integral output pattern, is made copable by use of an integral operation output.

Namely, in FIG. 13 for example, temperature regulation stabilized period lies at from step 3. By rendering 0 the deviation between the target temperature S' and the temperature the cascade thermostat indicates at a switchover of steps 2 and 3, the temperature thereafter stabilizes, which can be considered to provide proper regulation.

Accordingly, in the case overshoot or undershoot arises (S16, Yes), the integral output pattern is modified from the deviation of between the target temperature S' and the temperature the cascade thermostat indicates at the switchover (switchover of PID control) of steps 2 and 3. Thus, regulation is made in a manner relieving the overshoot or undershoot (S17a).

Figure 15:
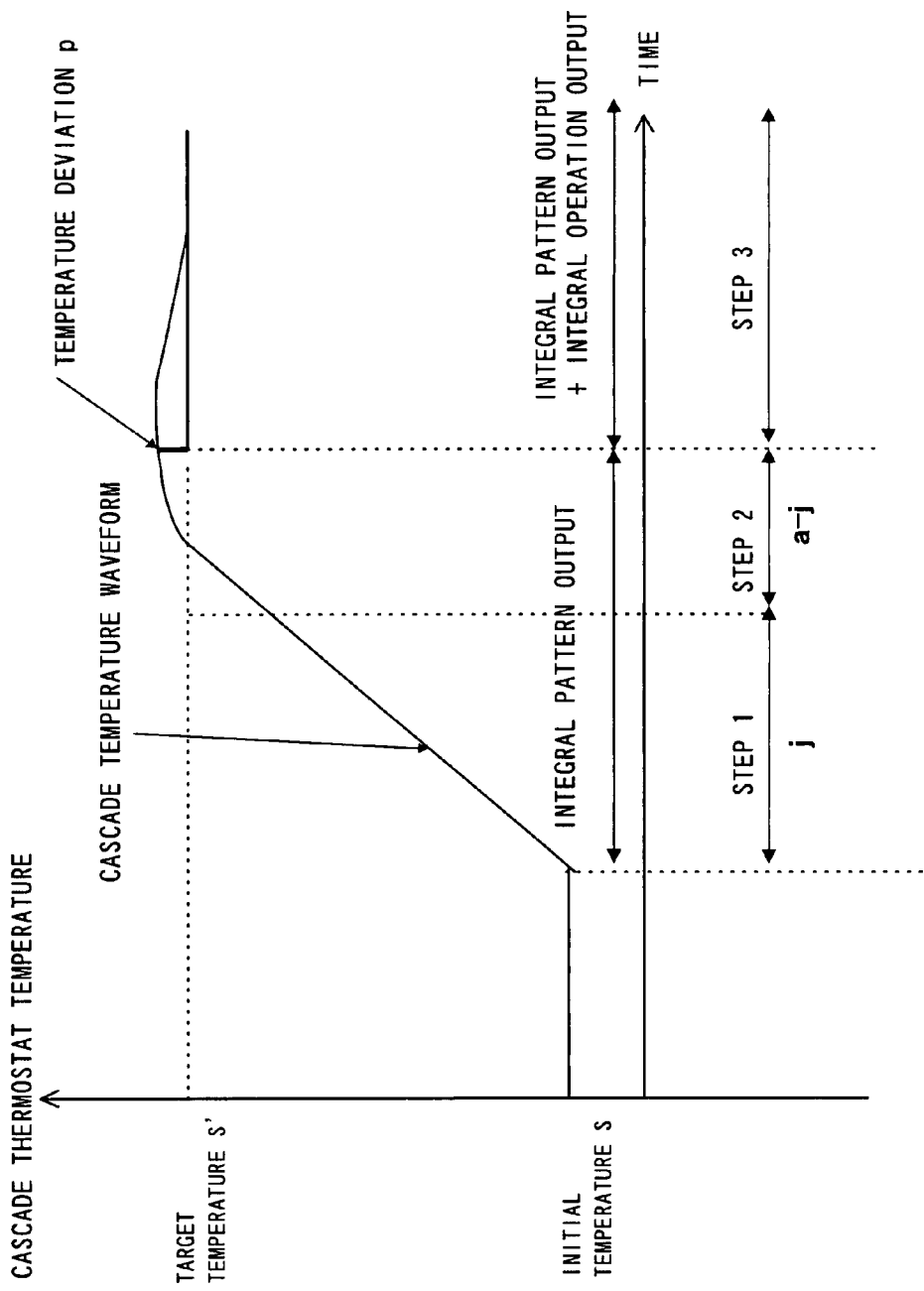
FIG. 15 is a figure for explaining the occurrence of an overshoot and undershoot where the integral output pattern is proper.

Provided that the deviation is given "p" of between the temperature the cascade thermostat indicates at the switchover of steps 2 and 3 and the target temperature S' as shown in FIG. 15, an overshoot or undershoot occurs while the integral output pattern is proper, which can be considered the great effect of P output in a transition period. The P output W1, calculated from the deviation "p" at the switchover of steps 2 and 3, can be determined by equation (29), similarly to equation (7).

$$W1=Kp \cdot p \quad (29)$$

Namely, the amount W1 of P output is excessive in outputting, which can be considered to appear as a deviation "p" at the switchover of steps 1 and 2.

Therefore, it can be considered that the improvement of overshoot and undershoot be realized by regulating the excessive P output W1 by means of the integral output pattern.

Here, the temperature transition period lies in steps 1 to 2. By subtracting the regulation amount W1 from the step 1 target temperature V and calculating again the step 1 inclination T and step 2 inclination U, the operation amount in a temperature transition, i.e. in steps 1 to 2, can be regulated properly. Namely, where there is an undershoot, the integral operation amount is increased in a temperature transition. Where there is an overshoot, the integral operation amount is decreased in a temperature transition. This can reduce the deviation between the target temperature S' and the temperature the cascade thermostat indicates at the switchover of the steps 2 and 3 thus improving the overshoot and undershoot.

Provided that the regulation amount is W1, the integral output initial temperature is k(0), the step 1 target temperature is V, the step 1 time is "j", the step 2 time is (a−j) and the heater stabilization temperature (step 3 target temperature) is k(n), then the post-regulation step 1 target temperature V', step 1 ramp rate T' and step 2 ramp rate U' can be determined by the following equations (30)-(32).

$$V' = V - W1 \quad (30)$$

$$T'[°C./min] = (V' - k(0))/j \quad (31)$$

$$U'[°C./min] = (k(n) - V')/(a - j) \quad (32)$$

Figure 16:
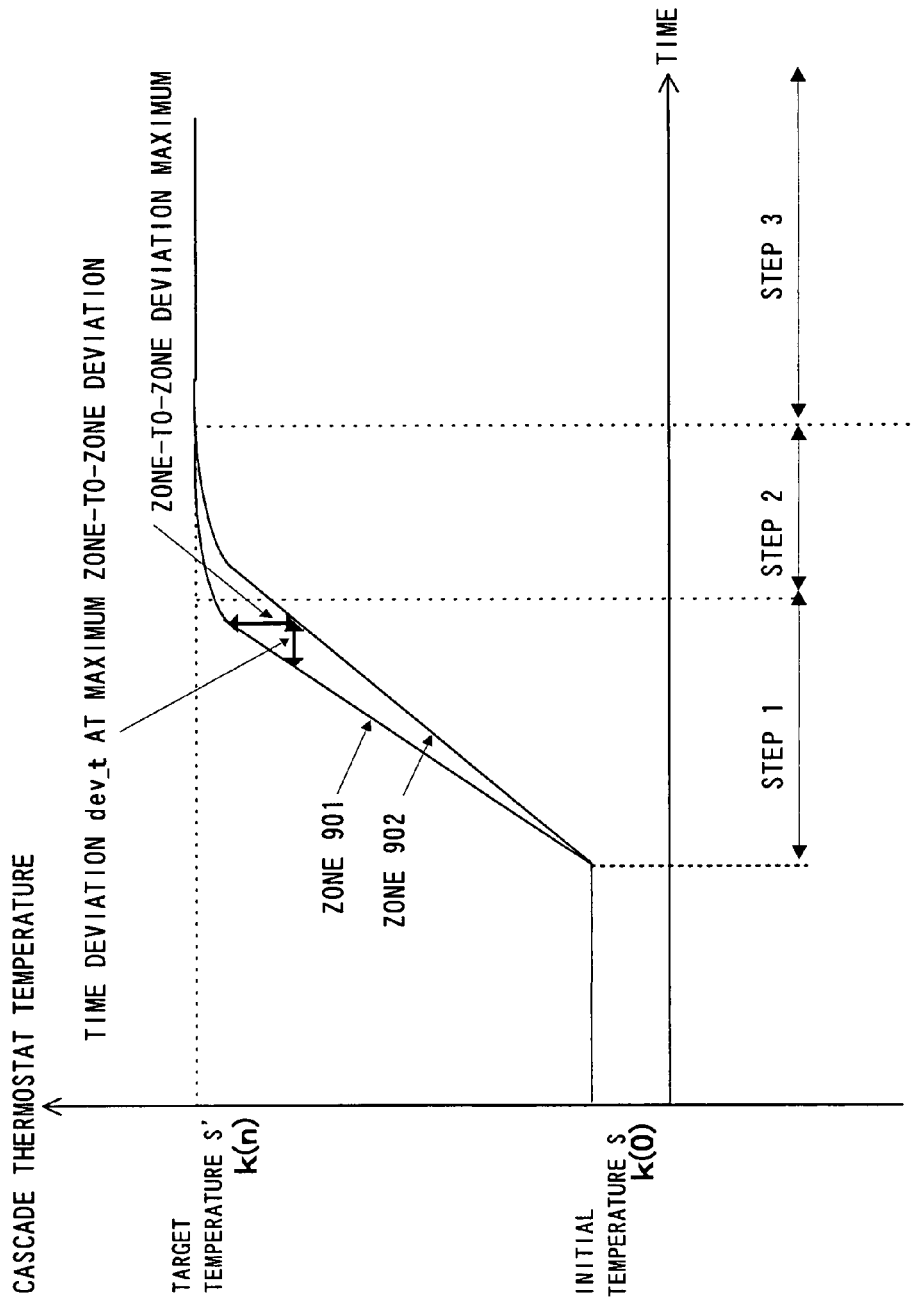
FIG. 16 is a figure for explaining a zone-to-zone deviation.

Because the operation amount is prepared and regulated based on each heating zone as shown in FIG. 16 even where temperature regulation is proper, there occurs early and late zones to a stabilization at target temperature. This forms a zone-to-zone deviation that possibly gives effects upon film thickness.

For this reason, where the zone-to-zone deviation is greater than a preset allowable value (S18, Yes), the zone earlier to a stabilization to target temperature is delayed to be matched to the late zone by regulating the integral output pattern, thereby improving the zone-to-zone deviation (S19).

Determined is a time deviation dev_t [min] at a maximum zone-to-zone deviation maximum time point of between a certain zone 901 earlier to a stabilization to target temperature and a zone 902 later to a stabilization to target temperature.

This can be determined by determining a temperature B' of the zone 902 at the maximum of zone-to-zone deviation so that the difference of between the time point the temperature becomes B' in the zone 901 and the time point the zone-to-zone deviation maximizes can be given as a time deviation dev_t.

Figure 17:
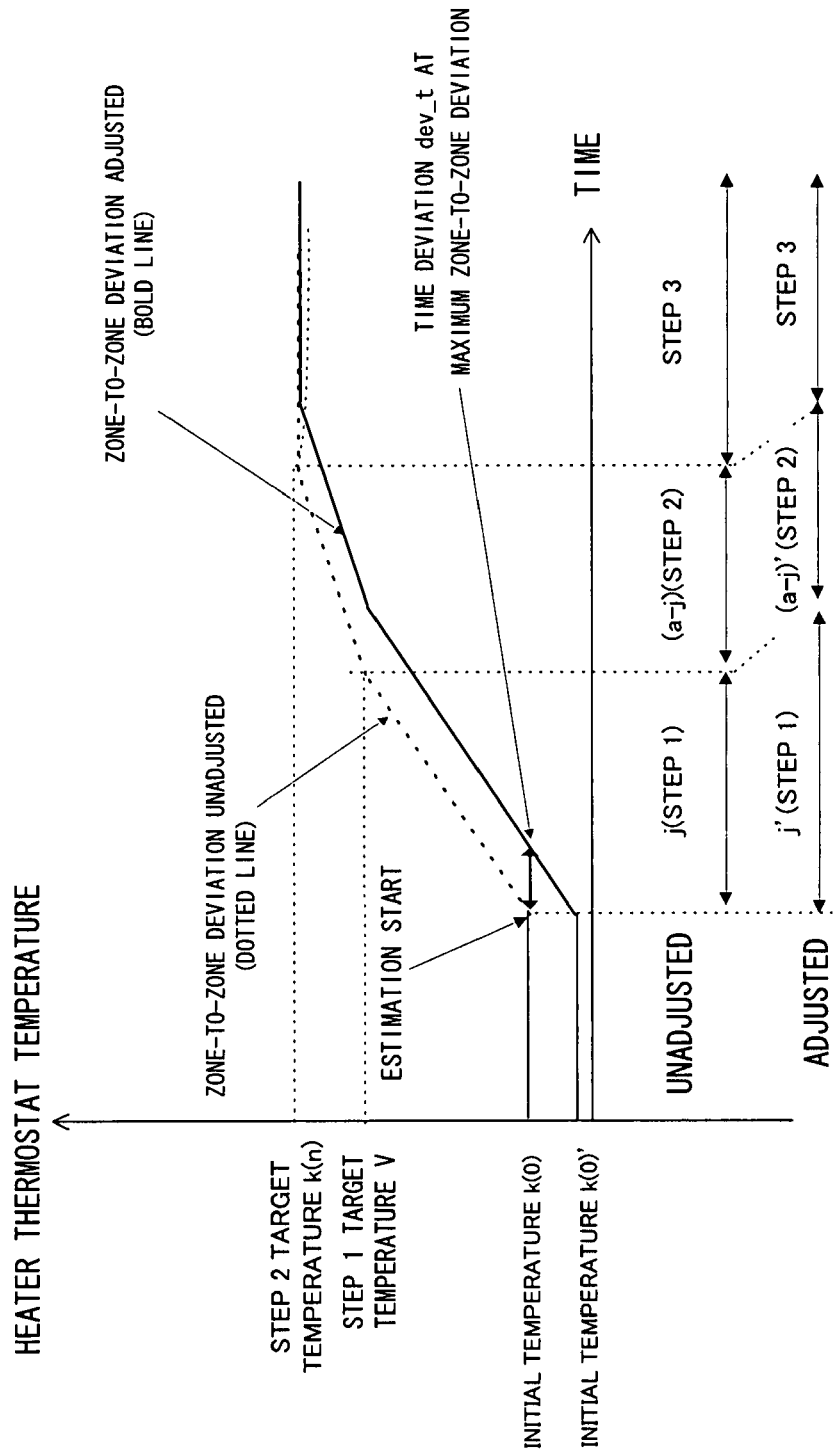
FIG. 17 is a figure for explaining a temperature regulating procedure in the presence of a zone-to-zone deviation.

Then, by delaying, by dev_t, the steps for an integral output pattern in the zone 901 as shown in FIG. 17, the stabilization to target temperature is delayed to be matched to the zone 902.

The parameters shown in FIG. 17 can be determined by the following equations (33), (34).

Here, T is the foregoing step 1 inclination T [° C./min]

$$a' = a + \text{dev}\_t \quad (33)$$

$$k(0)' = k(0) + T \cdot \text{dev}\_t \quad (34)$$

By thus delaying the integral output pattern by an amount of time deviation dev_t, the zone earlier in stabilization to target temperature can be delayed.

Meanwhile, where the zone-to-zone deviation is not greater than the preset allowable value (S18, No), the temperature regulation process is ended.

In this manner, in the semiconductor device manufacturing method according to the present embodiment, thermal processing is performed on a substrate by making a temperature regulation using the second output control pattern as at least a part of the operation amount to the heater (fifth step).

Specifically, according to the integral output pattern determined in the above, the superior controller Uc sets up an output value, rate and time on each of the plurality of steps for each heating zone, further setting the selector 44 with a switchover time. Incidentally, the switchover time of the selector 44 is set to a time transiting to post-ramp stabilization (e.g. to a time of transition from step 2 to step 3 in FIG. 17).

After the setting, temperature regulation is executed by use of the PIDC operator 24, the PID operator 26, etc., to process the substrate. Specifically, the temperature control section 71 upon ramping (e.g. steps 1 and 2 in FIG. 17) arithmetically operates an operation amount X (second operation amount) for the target value Sc (e.g. step 2 target temperature k(n) in FIG. 17), by its proportional operator 42, differential operator 43 and integral pattern output 45, depending upon the result F which is obtained by subtracting the control amount A of from the cascade thermocouple 3 in the subtracter 21. Thereafter, the operation amount X is converted into a target value X' and the control amount B of from the heater thermocouple 2 is subtracted in the subtracter 25. Thus, a deviation (first deviation) E is outputted. Thereafter, in the PID operator 26, PID operation is made using the deviation E, to output a control amount Z as an output of the temperature control section 71, thus placing the heater 1 under control.

The control amounts A, B outputted from the heater 1 are fed back again to the temperature control section 71. In this manner, the operation amount Z is controlled such that the deviation F between the target value Sc and the control amount A becomes zero. Meanwhile, in a post-ramp stabilization (e.g. at step 3 in FIG. 17), switchover is made by means of the selector 44 after completing the ramp up. With the result F which is obtained by subtracting the control amount A of from the cascade thermocouple 3 in the subtracter 21, an operation amount (third operation amount) X is arithmetically operated by the proportional operator 42, differential operator 43, integral pattern output 46 and integral operator 41. Thereafter, the operation amount X is converted into a target value X' and the control amount B of from the heater thermocouple 2 is subtracted in the subtracter 25. Thus, a deviation (second deviation) E is outputted. Thereafter, the PID operator 26 performs a PID operation with using the deviation E, to output an operation amount Z as an output of the temperature control section 71, thus placing the heater under control. The control amounts A, B outputted from the heater 1 are fed back again to the temperature control section 71. In also this time, the operation amount Z is controlled such that the deviation F between the target value Sc and the control amount A becomes zero. The substrate is thermally processed while performing such temperature regulation.

Figure 18:
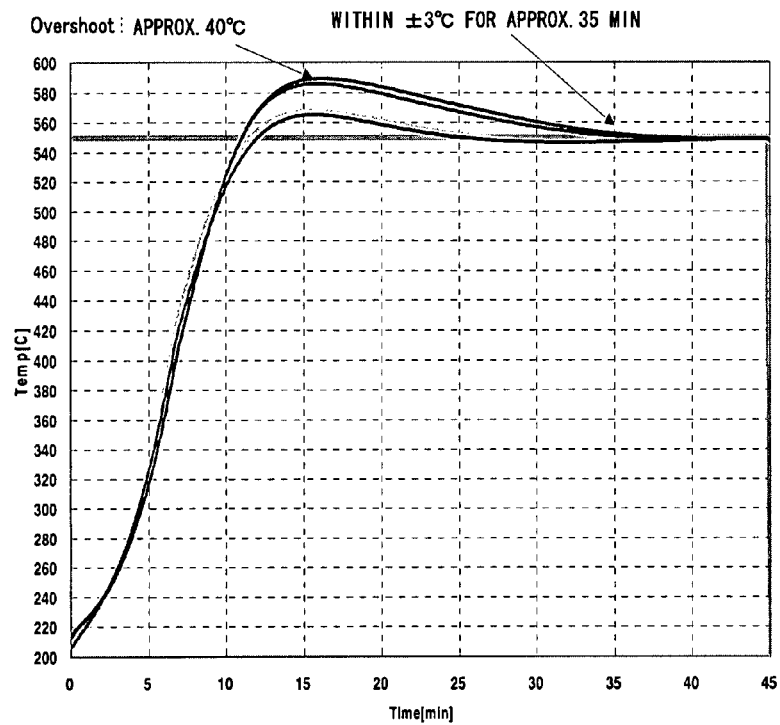
FIG. 18 is a figure showing a temperature change in the reactor where temperature control is performed according to the present embodiment.
Figure 19:
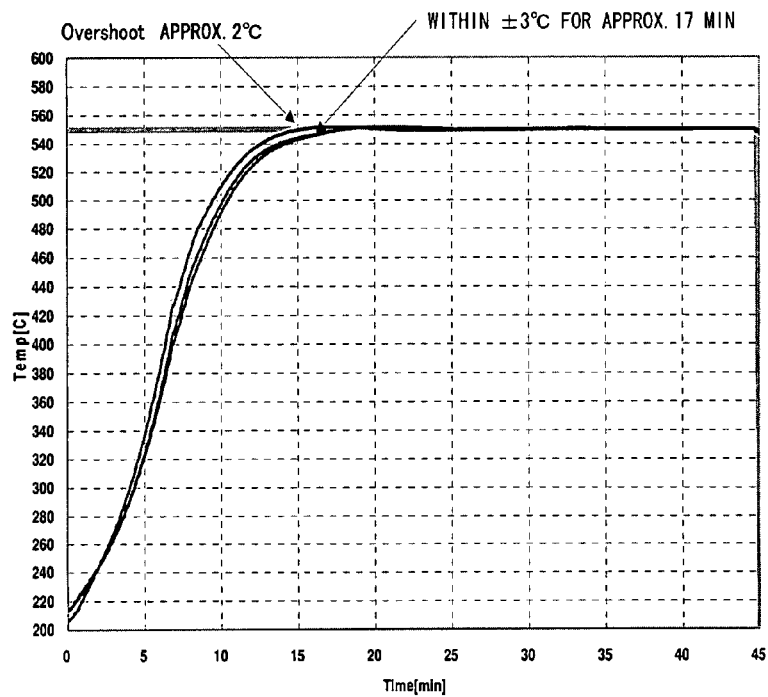
FIG. 19 is a figure showing a temperature change in the reactor where temperature control is performed according to the present embodiment.
Figure 20:
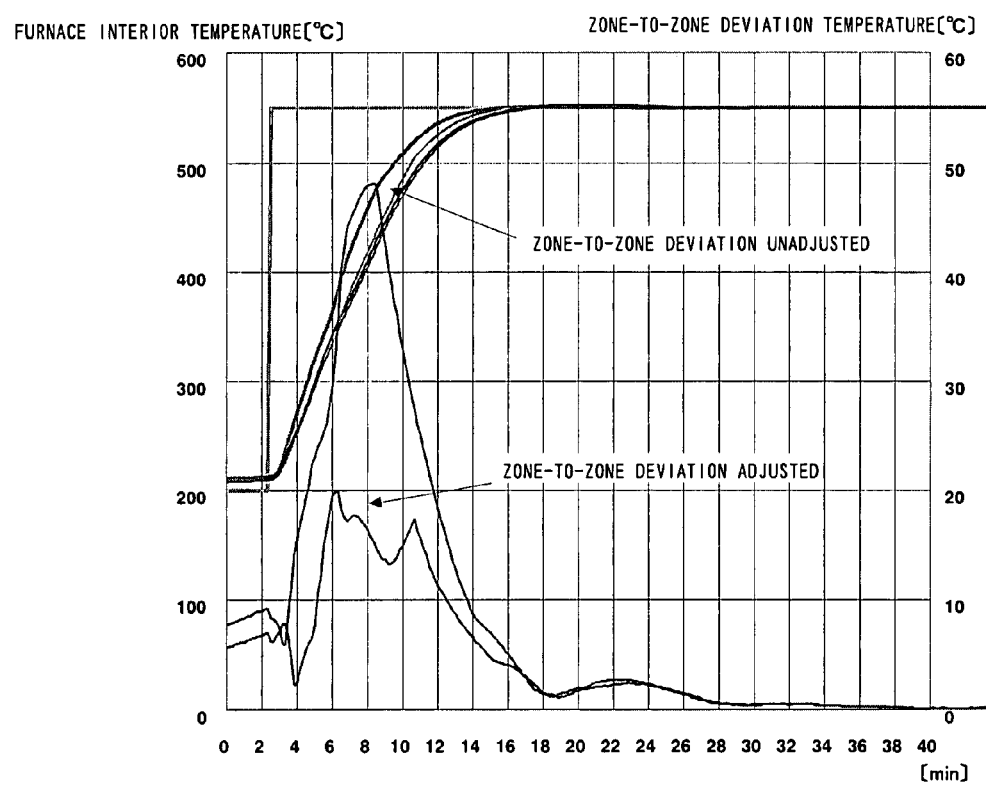
FIG. 20 is a figure showing a temperature change in the reactor where temperature control is performed according to the present embodiment.

The temperature change within the furnace is shown in FIGS. 18, 19 and 20 where temperature control is performed according to the present embodiment.

FIGS. 18 and 19 are concrete examples in ramp-up. In the ramp up under the conventional technique PID control shown in FIG. 18, overshoot is at approximately 40° C. wherein it takes 35 minutes until stabilization at the target temperature ±3° C. In the FIG. 19 ramp up under the PDIC control for temperature regulation based on the procedure of the invention (FIG. 12), overshoot is at approximately 2° C. wherein it takes approximately 17 minutes until stabilization at the target temperature ±3° C. In this manner, the invention is apparently effective in a ramp-up.

FIG. 20 is an improvement result of zone-to-zone deviation in a ramp-up.

The zone-to-zone deviation is approximately 50° C. before regulating the deviation of between the zones. As a result of regulation of between the zones, the zone-to-zone deviation could have been reduced to within approximately 20° C.

From FIG. 20, the zone-to-zone deviation regulation procedure in the invention is apparently effective in reducing the deviation of between the zones.

Second Embodiment

Then, explanation is made on a second embodiment of the invention.

Figure 21:
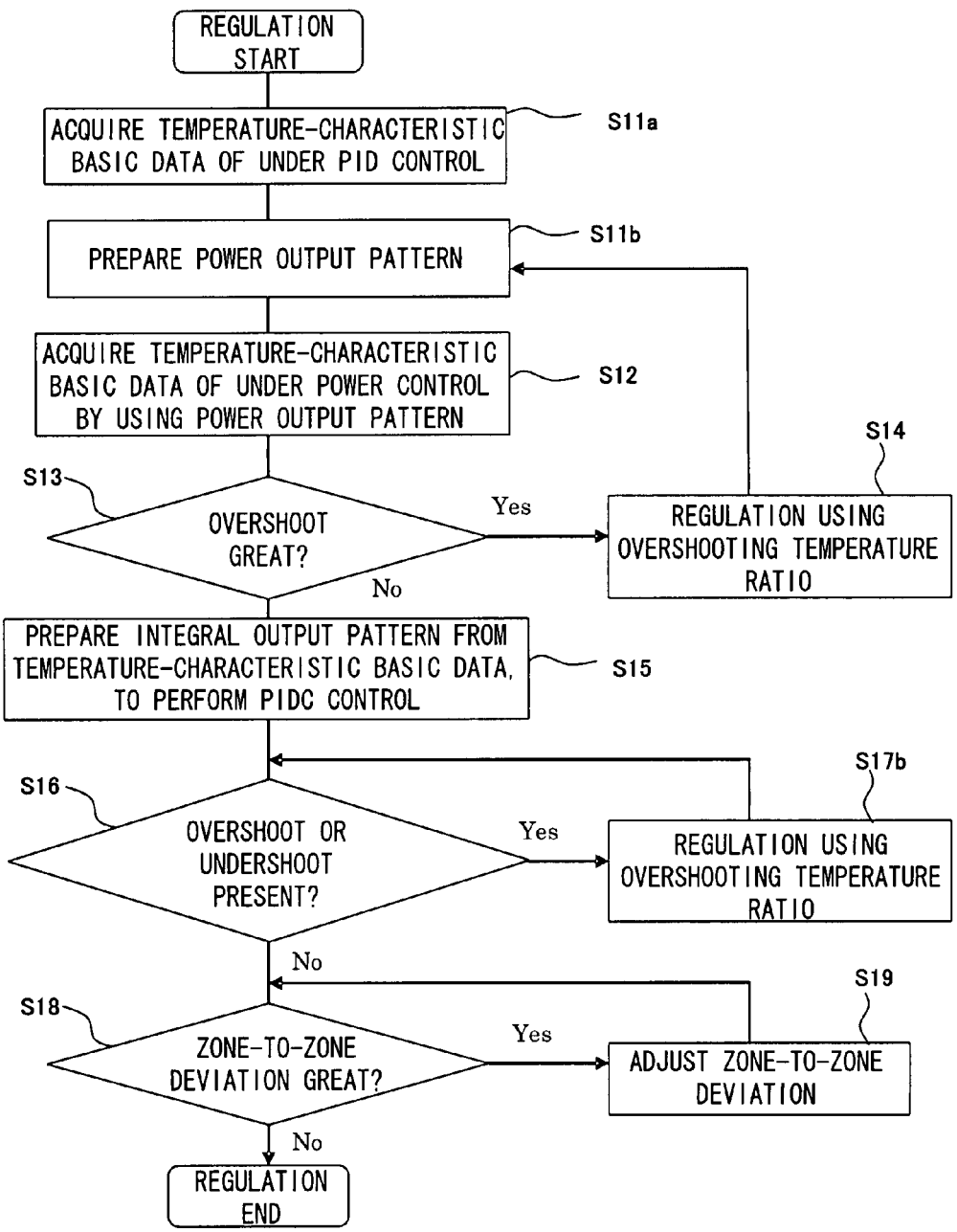
FIG. 21 is a flowchart for explaining a temperature regulating procedure in a second embodiment.

A thermal processing system according to the present embodiment is arranged similarly to the thermal processing system according to the first embodiment. The present embodiment and the first embodiment are different in the processing of temperature regulation procedure where an overshoot or undershoot occurs (S16, Yes). In the following, those similar to the apparatus structure and process contents of the first embodiment are attached with the same references, to omit the explanation thereof. FIG. 21 is a flowchart for explaining a temperature regulation procedure in this embodiment.

In the first embodiment, patterning is made on the integral output in a temperature transition while, in a stabilization of temperature, it is prepared in a manner the integral output amount is equal to that in a stabilization, thereby effecting a temperature regulation. Namely, steps 1-2 are in a temperature transition while step 3 is in a stabilization.

Here, in the second embodiment, regulation is by use of an overshooting temperature ratio in place of the regulation using the S17a temperature regulation.

In also the second embodiment, the overshooting temperature ratio H is determined based on the result of the S15 PIDC control, by use of the equations (13)-(15). The amount of overshooting temperature ratio H calculated constitutes a heat-amount ratio forming an overshoot factor that is latent in the integral output pattern of steps 1-2. Accordingly, by deleting the amount of overshooting temperature ratio H from the step 1 target temperature V, reflection is possible upon the integral output pattern in a temperature transition. Thus, the furnace interior can be stabilized swiftly to the ideal temperature (S17b).

Provided that the initial temperature is k(0), the step 1 target temperature is V, the step 1 time is j, the step 2 time is (a-j) and the heater's stable temperature (step 3 target temperature) is k(n), then the step 1 target temperature V', step 1 ramp rate T' and step 2 ramp rate U after the overshooting temperature ratio H is deleted can be determined by the following equations (35)-(37).

$$V' = V*(1-H) \quad (35)$$

$$T'[°C./min] = (V'-k(0))/j \quad (36)$$

$$U'[°C./min] = (k(n)-V')/(a-j) \quad (37)$$

By executing the above procedure, temperature regulation can be properly done swiftly and positively by even an operator not skilled (S17b).

Third Embodiment

Then, explanation is made on a second embodiment of the invention.

The thermal processing system according to the present embodiment is arranged similarly to the thermal processing system according to the first embodiment. The present embodiment and the first embodiment are different in thermal processing. The first embodiment covers mainly the process of from a ramp-up up to a stabilization at target temperature while the third embodiment covers mainly a boat-up recovery process. Incidentally, the boat-up recovery process refers to a process that, when a boat, filled with wafers to be thermally processed in the next time, is ascended by a boat elevator and loaded into a reactor tube, the interior temperature of the reactor tube (e.g. 200° C.) is lowered by the thermal effect of the boat and wafers lying at room temperature (approximately 25° C.), and thereafter the interior temperature of the reactor tube thus lowered is restored, i.e. the interior temperature of the reactor tube is returned to the former temperature (200° C., in this case) in the state the wafer and the boat are moved into the reactor tube. There is a difference in the process of from a calculation of lamp-up heat amount D up to an improvement regulation of zone-to-zone deviation (step S19 in the first embodiment). In the following, those similar to the apparatus structure and process contents of the first embodiment are attached with the same references, to omit the explanation thereof.

Figure 22:
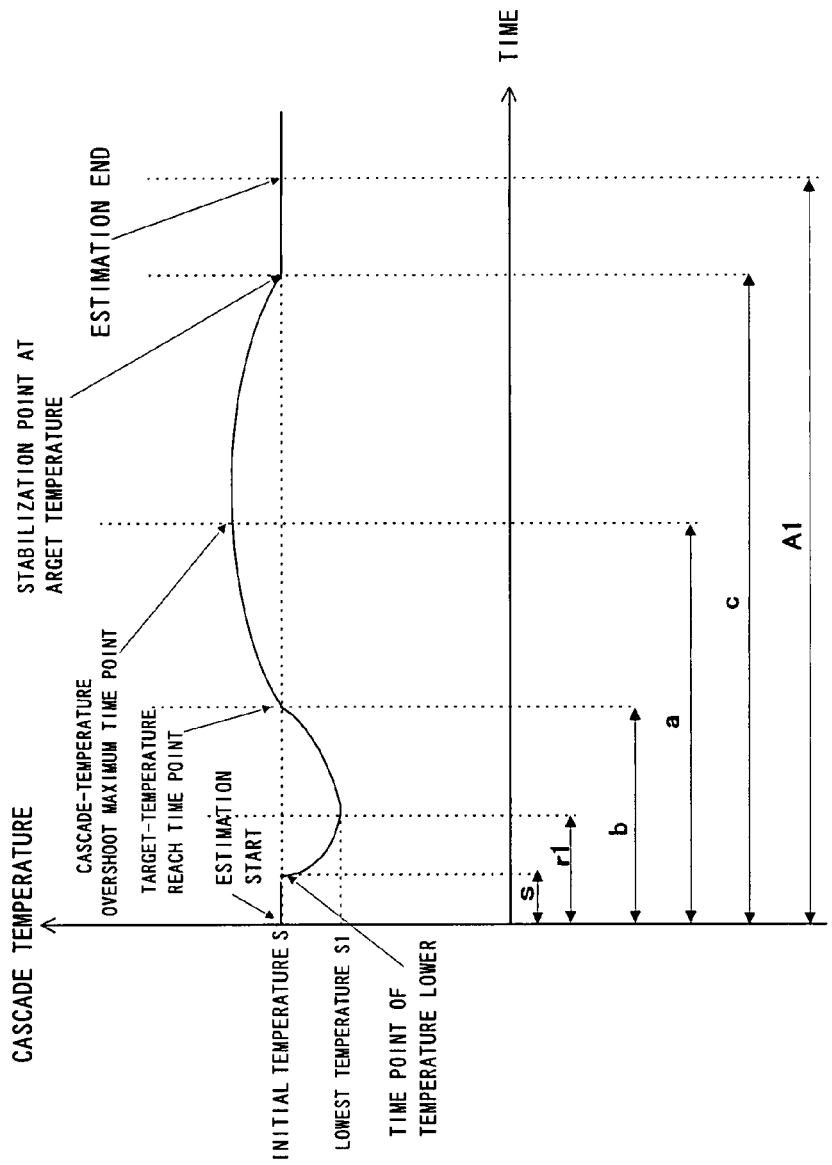
FIG. 22 is a figure for explaining the parameters to be determined based on temperature-characteristic basic data.

At first, from the temperature-characteristic basic data obtained under PID control, determined is a temperature-regulation estimating time A1 [min] of from a ramp-up start time, as shown in FIG. 22. Meanwhile, determined are a maximum-overshoot time "a" [min] of the temperature the cascade thermocouple 3 indicates, a returning time "b" [min] to initial temperature S, a stabilization time "c" [min] at initial temperature S, and an operation amount "d" [%] in stabilization at initial temperature. Meanwhile, determined are an operation amount e(t) [%] at each time within the temperature regulation estimating time A1, a temperature f(t) [° C.] the heater thermocouple 2 indicates, and a temperature g(t) the cascade thermocouple 3 indicates. Meanwhile, the time to a lowing start of g(t) is taken as "s" [min].

Provided that the amount of stable amount of heat not outputted during an overshoot is a deficient heat amount Y [%*min], Y can be determined by equation (38). Incidentally, in equation (38), the integral range of ∫(d-e(t))dt lies between b and c.

$$Y = \int (d-e(t))dt \quad (38)$$

Determination is made by applying the equations (10), (11) shown in the first embodiment to the FIG. 22 temperature-characteristic basic data. By using the total heat amount B1, stable amount of heat C1 and deficient heat amount Y determined also from equation (38), the heat amount determined by the following equation (39) is taken as a ramp-up heat amount D1 [%*min].

$$D1 = B1 - C1 + Y \quad (39)$$

Here, explanation is made on ramp-up heat amount and deficient heat amount. It can be considered that the total heat amount, determined by the PID operation of, up to a stabilization to a certain initial temperature S after a boat-up, includes a heat amount required for stably sustaining at the initial temperature S.

However, because of follow-up control, the temperature is lowered by a certain degree from the initial temperature S by the boat-up. Because it stably held at the initial temperature after an increase of the deviation between the initial temperature and the actual measurement, there is an increase of PID operation output.

Here, provided that the minimal cascade temperature lowered by the boat-up is S1 and the time of from an estimation start to S1 is r1, boat-up recovery can be considered as a ramp up of from the minimal cascade temperature S1, lowered by the boat-up after a lapse of r1 from the estimation start, to the initial temperature S.

In the case considered as a ramp-up of from S1 to S, the heat amount, required for stable sustaining at the initial temperature S, can be divided as a heat amount for a ramp-up of from the minimal cascade temperature S1 lowered by the boat-up to the initial temperature S, and a heat amount for stable sustaining at the initial temperature S.

Therefore, in case subtracting a stable amount of heat with assumption that, after the boat-up, the operation amount when the cascade temperature is stabilized has been continuously outputted as a heat amount for stable sustaining at the initial temperature S, from the total heat amount determined by applying equation (10) as in the foregoing, a heat amount, i.e. ramp-up heat amount, can be obtained, which is required for ramp-up.

However, for a boat-up recovery at low temperature (e.g. in a temperature zone of 50-200° C.), the time of from reaching the target temperature to a stabilization (c–b) is excessively long after an overshoot of cascade temperature. Provided that the time of up to a full stabilization of the cascade temperature is a temperature-regulation estimating time A1, the temperature-regulation estimating time A1 also increases similarly to (c–b). The stable amount of heat determined by applying equation (11) is greater than the total heat amount determined by applying equation (10), and hence the ramp-up heat amount cannot be determined correctly.

For this reason, for the duration of overshoot (c–b) as represented by equation (38), by adding the differential heat amount of between an operation amount in stabilization and an actual measurement value of operation amount to the total heat amount determined by applying equation (10), correction can be made for the defective heat amount that is a stable amount of heat lost in the duration (c–b). Thus, a correct ramp-up heat amount can be determined.

Meanwhile, it can be considered that, in case the ramp-up heat is excessive in amount, overshoot occurs despite attempting to stably hold the initial temperature S. Namely, by using the output pattern reflecting thereon a heat amount ratio constituting a factor of overshoot latent in the ramp-up heat amount, the furnace interior can be stabilized swiftly to an ideal temperature.

Figure 23:
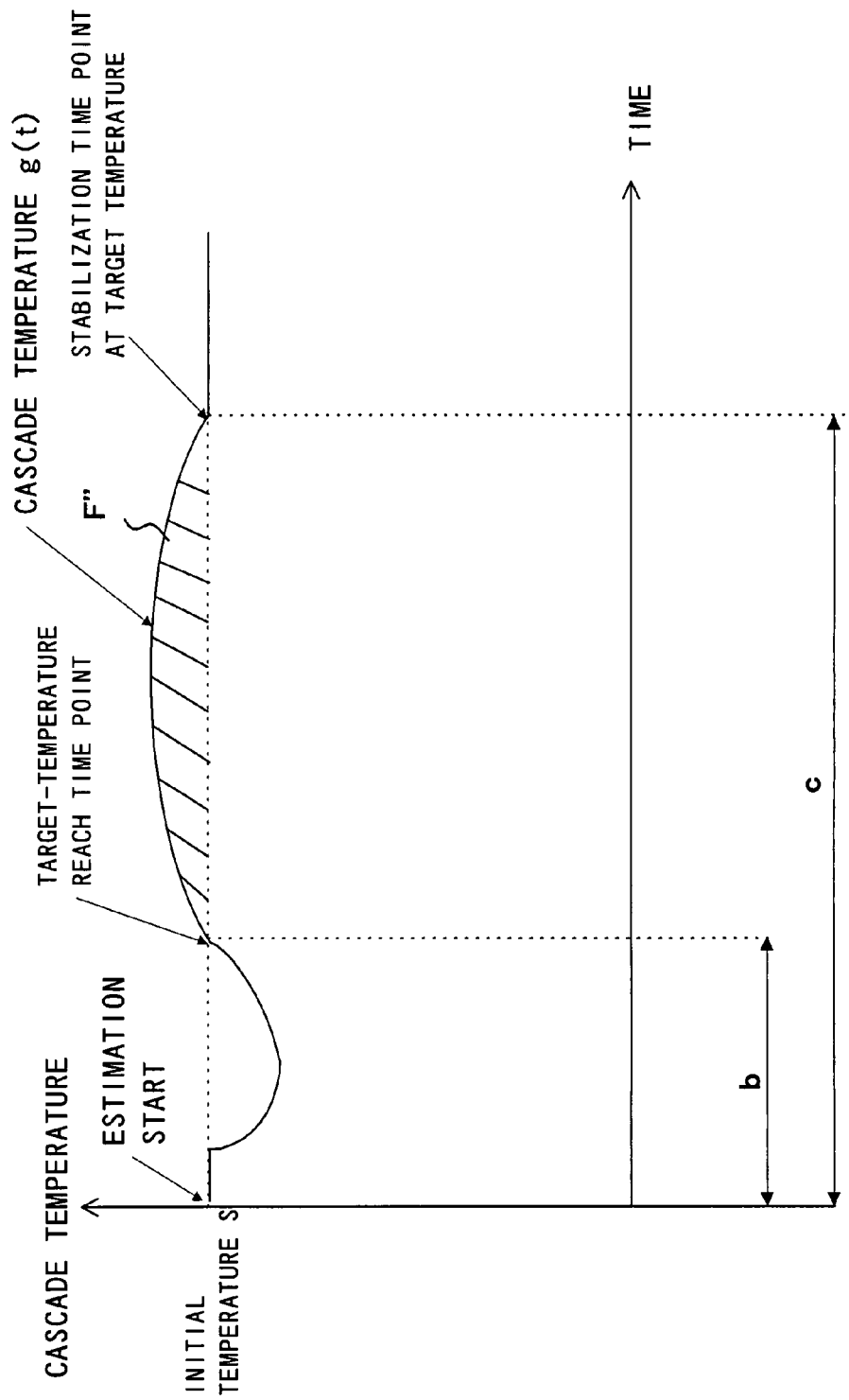
FIG. 23 is a figure for explaining the total sum over cascade temperatures overshot.

Then, determined is a total sum over the cascade temperatures overshot in the duration of from the reach time "b" to initial temperature to the stabilization time "c" at initial temperature, as shown by the hatching in FIG. 23. Provided that this is an overshooting-temperature total sum F", then F" can be determined by the following equation (40). Incidentally, in equation (40), the integral range of ∫g(t)dt lies between b and c.

$$F' = \int g(t)dt - S(c-b) \quad (40)$$

Figure 24:
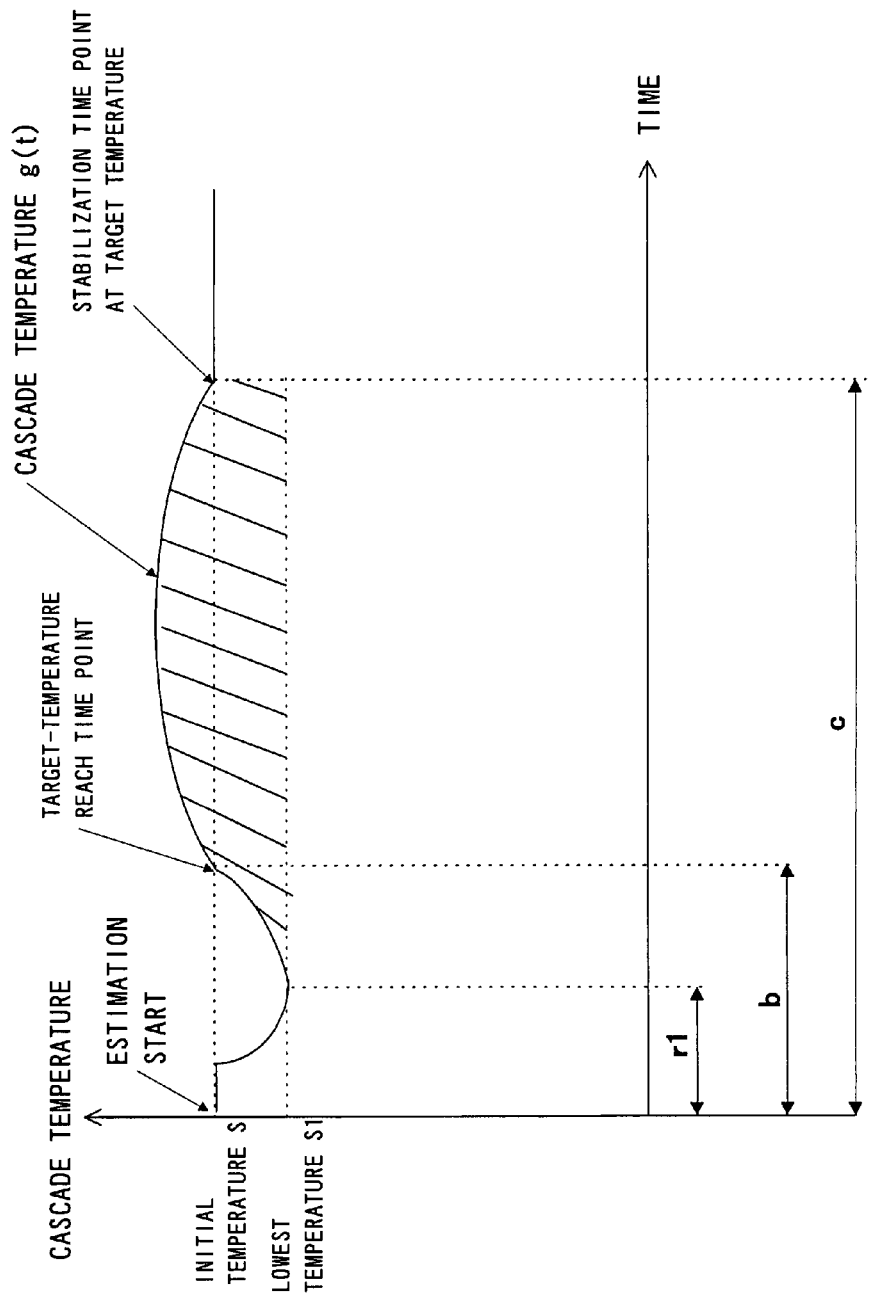
FIG. 24 is a figure for explaining the total sum over temperatures in a duration of from a time point "r" of minimum temperature S1 to a stabilization time "c" at initial temperature S.

Then, determined is a total sum over temperatures of between the time point r1 of minimum temperature S1 and the stabilization time "c" at initial temperature S, as shown by the hatching in FIG. 24. Provided that this is the total sum G of temperature, then G can be determined by the following equation (41). Incidentally, in equation (41), the integral range of ∫g(t)dt lies between r1 and c.

$$G = \int g(t)dt - S1(c-r1) \quad (41)$$

Then, determined is an overshooting temperature ratio H, and a ramp-up heat amount D1' after deleting the overshooting temperature ratio H. Incidentally, the calculation of an overshooting temperature ratio H and a ramp-up heat amount D1' is similar to that of the first embodiment, and hence omitted to explain.

Figure 25:
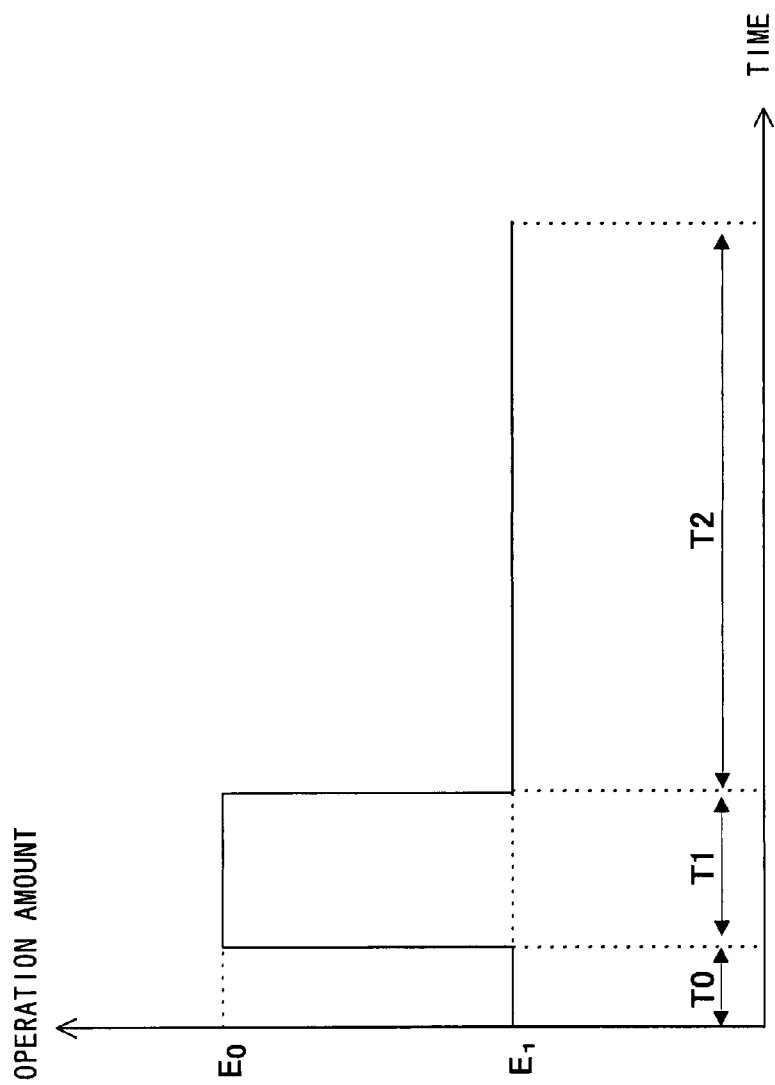
FIG. 25 is a figure for explaining a power output pattern.

From the above, determined is the power output pattern shown in FIG. 25, to effect power control. The parameters in FIG. 25 can be determined by the following equations (42)-(46).

$$E0 = (D1'/T1) + d \quad (42)$$

$$E1 = d \quad (43)$$

$$T0 = s \quad (44)$$

$$T1 = (r1 - s) \quad (45)$$

$$T2 = a - T1 - T0 \quad (46)$$

Then, explanation is made on T0. In boat-up, there is a great difference in effect between heating zones. Particularly, the difference is great between the L and U zones. In the L zone, during boat-up, it lies on an entrance side where wafers and boat, etc. at normal temperature comes in order at all times, thus being significant in the temperature decrease due to boat-up. Meanwhile, in the U zone, temperature decrease is comparatively moderate as compared to the L zone because wafers, boat, etc. are heated up during a boat-up between the L and CU zones. Accordingly, provided that suitable ramp-up heat amount is added to each of stable operation amounts in the L, CL, CU and U zones simultaneously with a start of boat-up (start of estimation), the temperature rises particularly in the U zone before the occurrence of the effect of the boat-up, i.e. the effect when cascade temperature decrease occurring upon reaching of the wafers, boat, etc. to a vicinity of the U zone. Thus, there arises a useless heat amount (e.g. overshoot).

For this reason, setting is previously made such that, in each zone, ramp-up heat amount is not outputted until the cascade temperature begins to lower due to the effect of boat-up, e.g. before lowering 1° C. per minute.

Due to this, between the zones, there are provided differences in the time of starting to output a ramp-up amount of heat, thus enabling the proper regulation of temperature on a zone-by-zone basis.

E0 is a value obtained by dividing the ramp-up heat amount D1' by a time T1 in a manner of outputting at a constant output amount and then adding with an operation amount "d" for a stabilization at initial temperature. Thereafter, outputted is solely the operation amount "d" for a stabilization at target temperature until reaching the maximum-overshoot time "a".

By using the power output pattern, it is possible to obtain a temperature waveform which the heater thermocouple 2 indicates, and which can stabilize the furnace interior swiftly to the initial temperature S. This is acquired as temperature characteristic data of under power control.

Figure 26:
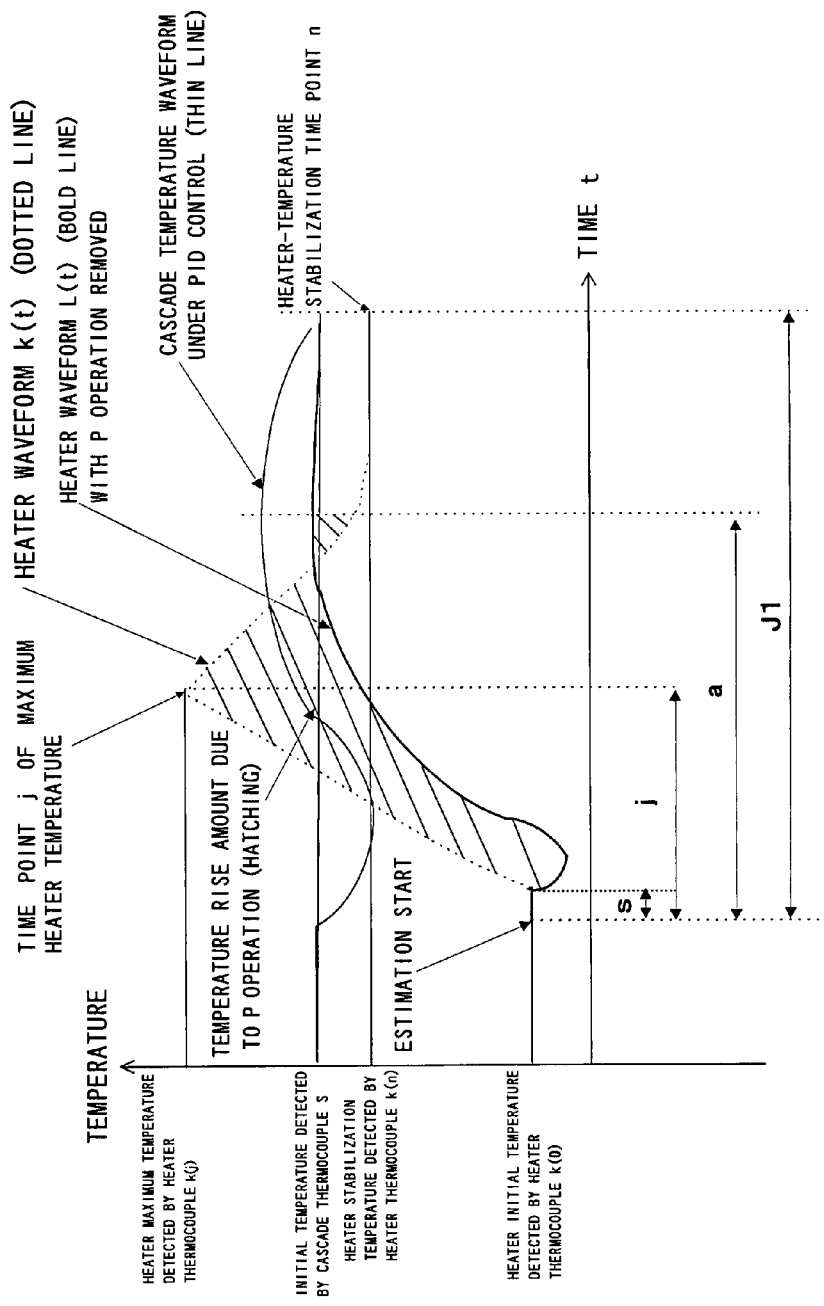
FIG. 26 is a figure for explaining a determination of temperature-regulation estimating time, etc. of from a start of power control depending upon temperature-characteristic basic data of under power control.

Then, a temperature-regulation estimating time J1 [min] of from a start of power control is determined from the temperature characteristic basic data of under power control, as shown in FIG. 26. Meanwhile, for each zone, determined are a time "j" [min] of the maximum temperature the heater thermocouple 2 indicates, and a time "n" [min] at which the temperature indicated by the heater thermocouple 2 is fully stable. Meanwhile, it is assumed that the temperature indicated by the heater thermocouple 2 at each point of time within the temperature-regulation estimating time J1 is k(t) [° C.] and the temperature the cascade thermocouple 3 indicates is m(t) [° C.].

Figure 27:
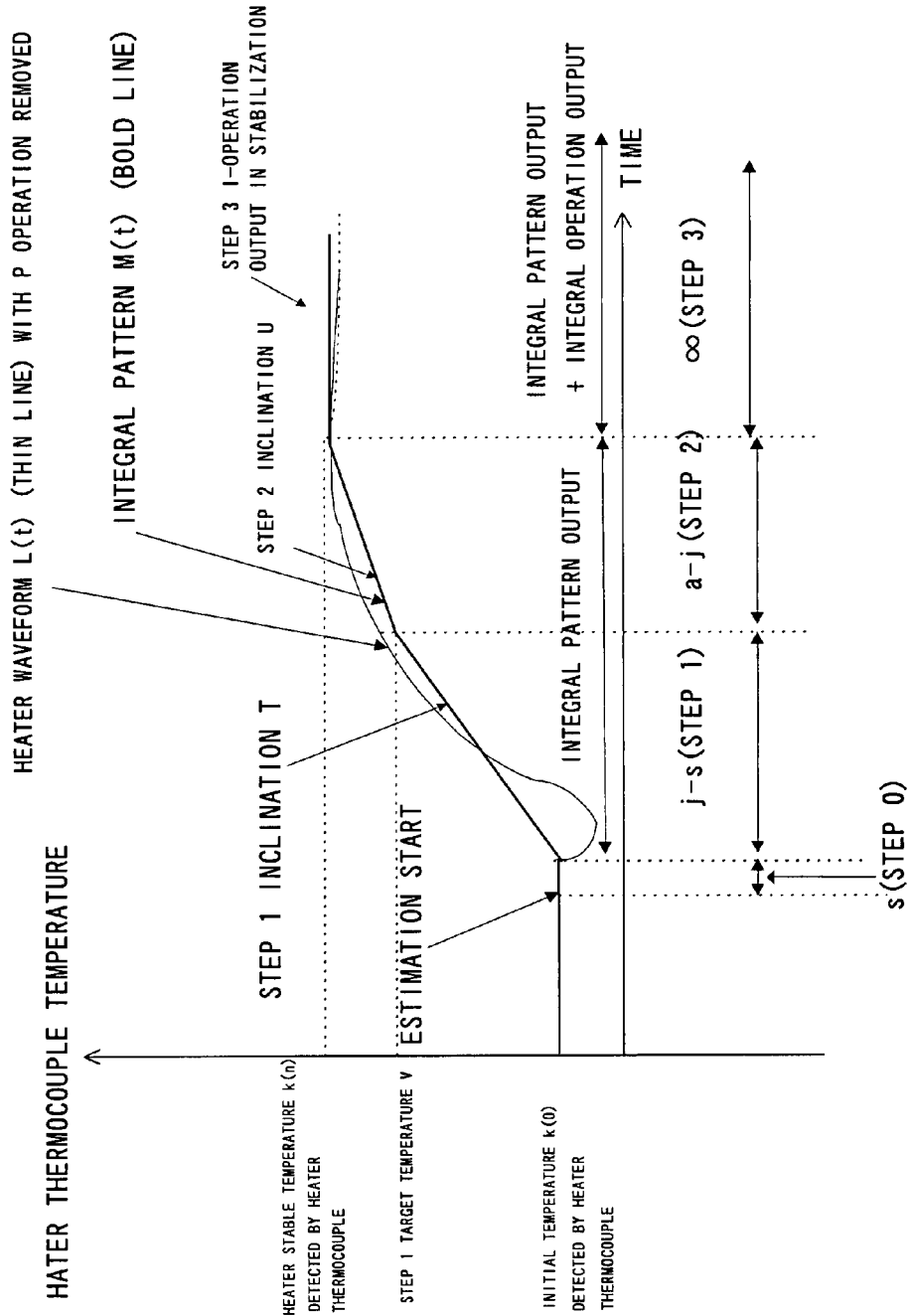
FIG. 27 is a figure for explaining an integral output pattern M(t).

From those of data, an integral output pattern M(t) as shown in FIG. 27 is determined on the basis of the heater waveform L(t) which is obtained by subtracting the P-operation amount from the waveform k(t) as shown in FIG. 26. Here, the reason of subtracting the P operation amount from the waveform of temperature k(t) is that the k(t) is acquired by preparing a power output pattern on the basis of the output calculated by PID arithmetic operation under PID control and hence the relevant waveform is based on the total sum over the P (proportional), I (integral) and D (differential) outputs. For this reason, by subtracting the P and D output amounts, a desired integral output pattern M(t) is obtained. Here, the D output is negligible because generally the D output is slight in ramp-up.

Then, determined is an area (heat amount) of from a ramp-up heat amount output start time "s" on the heater temperature waveform L(t) which is obtained by subtracting the P operation amount to a time "j" maximum in heater temperature (actual measurement value with the P amount not subtracted). It is assumed Q. Incidentally, in equation (47), the integral range of ∫L(t)dt lies between s and j.

$$Q = \int L(t)dt - k(0) \cdot (j-s) \tag{47}$$

By dividing the Q by j, the time of up to the time point maximum in heater temperature, a value M can be determined that is equal to Q in area (heat amount) at from the time point "s" to the time point "j" and constant in heater temperature (area (heat amount) of a rectangle having a bottom side (j−s) and a height M=area (heat amount) of Q).

$$M = Q/(j-s) \tag{48}$$

By doubling the M, a triangle can be determined that is equal to the area (heat amount) of Q and has a bottom side (j−s) and a height M*2. By using the height, inclination and k(j−s), provided is a heat amount that is equal to the heat amount based on the temperature the heater thermocouple indicates and eliminated of the P operation amount the heater thermocouple indicates.

As shown in FIG. 27, step 0 is assumed given for a duration of from the estimation start to the ramp-up heat amount output start time point "s", step 1 is given for a duration of from the time point "s" to the maximum heater temperature time point "j" of under power control, and step 2 is given for a duration of from the maximum heater temperature time point "j" of under power control to the maximum cascade temperature time "a" of under PID control.

The step 0 temperature is in a period yet free of the effect of boat-up and hence stabilized at a temperature in the start of estimation.

The step 1 temperature, if applied with the height and inclination of the foregoing triangle, can be considered as a proper integral output pattern in a part from the estimation start to the heater maximum-temperature time point "j" the heater thermocouple indicates under power control.

In the maximum cascade time point under PID control at a completion of step 2, it is considered that the effect of disturbance, etc. in a temperature transition upon the cascade temperature is eliminated, at this point and later. Namely, it can be considered that, in case the cascade temperature reaches the initial temperature S at this time point, it thereafter stabilizes at the initial temperature S without encountering an overshoot.

The parameters in FIGS. 26 and 27, i.e. L(t) [° C.] (heater temperature obtained by subtracting the P amount), V [° C.] (step 1 target temperature), T [° C./min] (step 1 inclination) and U [° C./min] (step 2 inclination), can be determined by the following equation (49)-(52).

$$L(t)[° C.] = \text{(heater waveform−P operation output amount)} = k(t) - [P \text{ constant } Kp^*(\text{initial temperature } S − \text{cascade temperature } m(t) \text{ under power control}] \tag{49}$$

$$V[° C.] = [\int L(t)dt/(j-s)] \times 2 \tag{50}$$

$$T[° C./\min] = (V - k(0))/(j-s) \tag{51}$$

$$U[° C./\min] = (k(n) - V)/(a-j) \tag{52}$$

By preparing an integral output pattern from the above equations, PIDC control is effected. Incidentally, in equation (50), the integral range of ∫L(t)dt lies between s and j. Specifically, as shown in FIG. 27, initial values, target values, rates and time are set up step by step and outputted along the steps. Meanwhile, it can be considered to prepare an integral output pattern in transition by use of more steps instead of the foregoing three steps.

Figure 28:
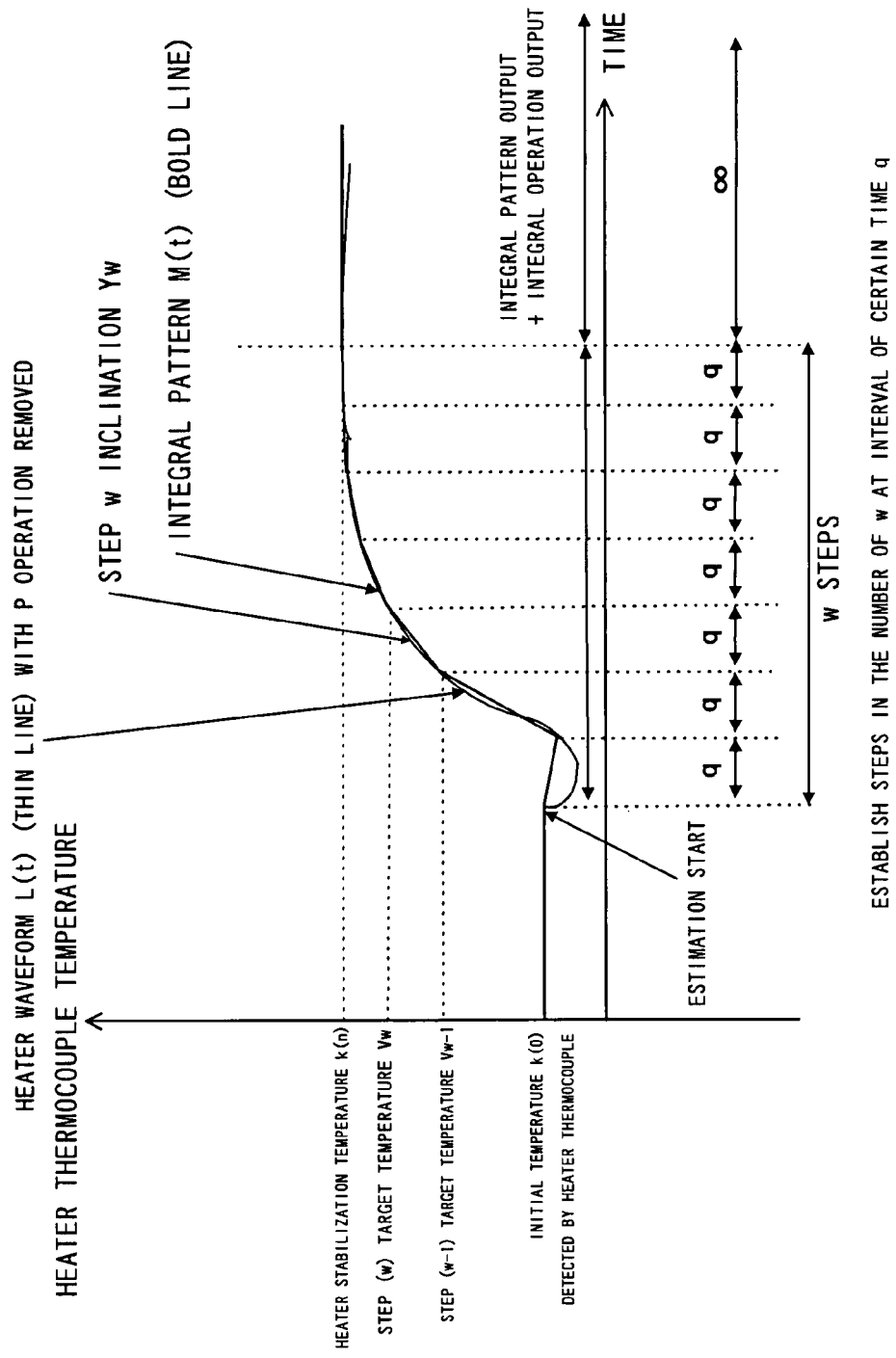
FIG. 28 is a figure for explaining a target temperature and ramp rate where setting steps "w" in the number are set for an integral pattern output at an interval of certain constant time.

In case providing steps of integral pattern output in the number of "w" at an interval of constant time "q", say, in a temperature transition as shown in FIG. 28, the target temperature Vw and ramp rate (inclination) Yw for each step STEP(w) can be determined by the following equations (53) and (54).

$$Vw[° C.] = (\int L(w^*q)dt/q) \times 2 \tag{53}$$

$$Yw[° C./\min] = (V(w-1) - V(w))/q \tag{54}$$

By preparing an integral output pattern as above, the integral output in a temperature transition can be prevented from increasing. Meanwhile, by using the waveform under power control as a basis, the furnace interior can be stabilized to the initial temperature S shortest in time.

Furthermore, in the invention, where overshoot or undershoot is great in the integral output pattern despite carrying out PDIC control or there is a need to improve the significant deviation between heating zones, there is provided a function to regulate those.

Explanation is made below on the improvement and regulation of overshoot and undershoot.

As noted before, in the invention, patterning is made for the integral output pattern in a temperature transition. Meanwhile, for a temperature-stabilized period, an integral output pattern is prepared with an integral output amount given equal to that in stability, thus effecting a temperature regulation.

Namely, in the temperature regulation method shown in FIG. 27 for example, stabilization period lies from step 3. By rendering 0 the deviation between the initial temperature S and the temperature the cascade thermostat indicates at a switchover of steps 2 and 3, the temperature thereafter stabilizes. This can be considered to provide for proper regulation.

Accordingly, in the case overshoot or undershoot occurs, it is satisfactory to determine a regulation amount from the deviation between the initial temperature S and the temperature the cascade thermostat indicates at the switchover of steps 2 and 3.

Figure 29:
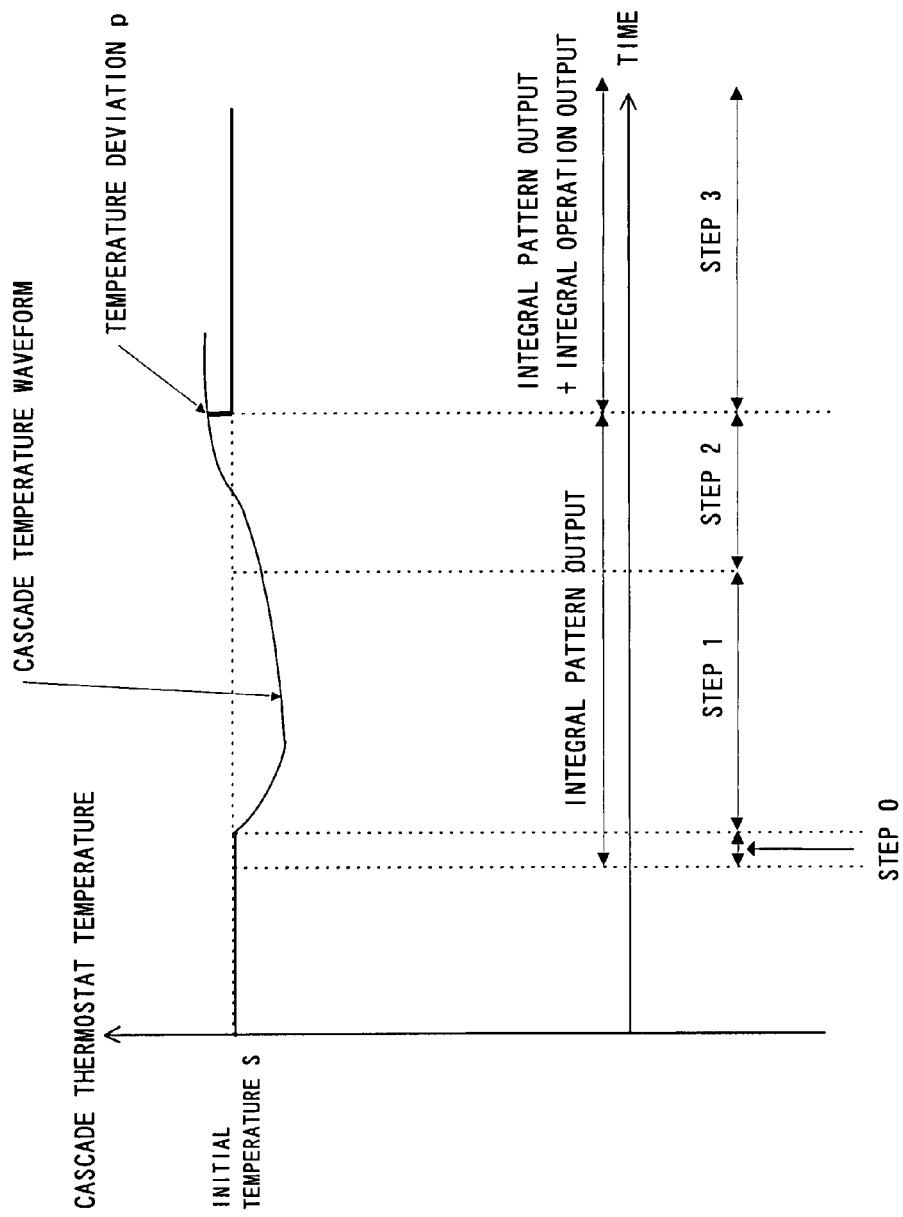
FIG. 29 is a figure for explaining the occurrence of an overshoot and undershoot where the integral output pattern is proper.

Provided that the deviation is given "p" of between the temperature the cascade thermostat indicates at the switchover of steps 2 and 3 and the initial temperature S as shown in FIG. 29, there is an occurrence of overshoot or undershoot despite that the integral output pattern is proper because considered is the great effect of P output in the transition period. The P output W1, calculated from the deviation p at the switchover of steps 2 and 3, can be determined by equation (55), similarly to equation (7).

$$W1 = Kp \cdot p \tag{55}$$

Namely, the amount W1 of P output is excessive in outputting, which can be considered to appear as a deviation p at the switchover of steps 1 and 2. Therefore, it can be considered that the improvement of overshoot and undershoot be realized by regulating the excessive P output W1 by means of the integral output pattern.

Here, the temperature transition lies in steps 1 to 2. By subtracting the regulation amount W from the step 1 target temperature V and calculating again the step 1 inclination and step 2 inclination U, the operation amount in a temperature transition, i.e. in steps 1 to 2, can be regulated properly. Namely, where there is an undershoot, the integral operation amount is increased in a temperature transition. Where there is an overshoot, the integral operation amount is decreased in a temperature transition. This can reduce the deviation between the initial temperature S and the temperature the cascade thermostat indicates at the switchover of the steps 2 and 3 thus improving the overshoot and undershoot.

Provided that the regulation amount is W1, the integral output initial temperature is k(0), the step 0 time is "s", the step 1 target temperature is V, the step 1 time is (j−s), the step 2 time is (a−j) and the heater stabilization temperature (step 3 target temperature) is k(n), then the post-regulation step 1 target temperature V', step 1 ramp rate T' and step 2 ramp rate U' can be determined by the following equations (56)-(58).

$$V'=V-W \tag{56}$$

$$T'[°C./min]=(V'-k(0))/(j-s) \tag{57}$$

$$U'[°C./min]=(k(n)-V')/(a-j) \tag{58}$$

Figure 30:
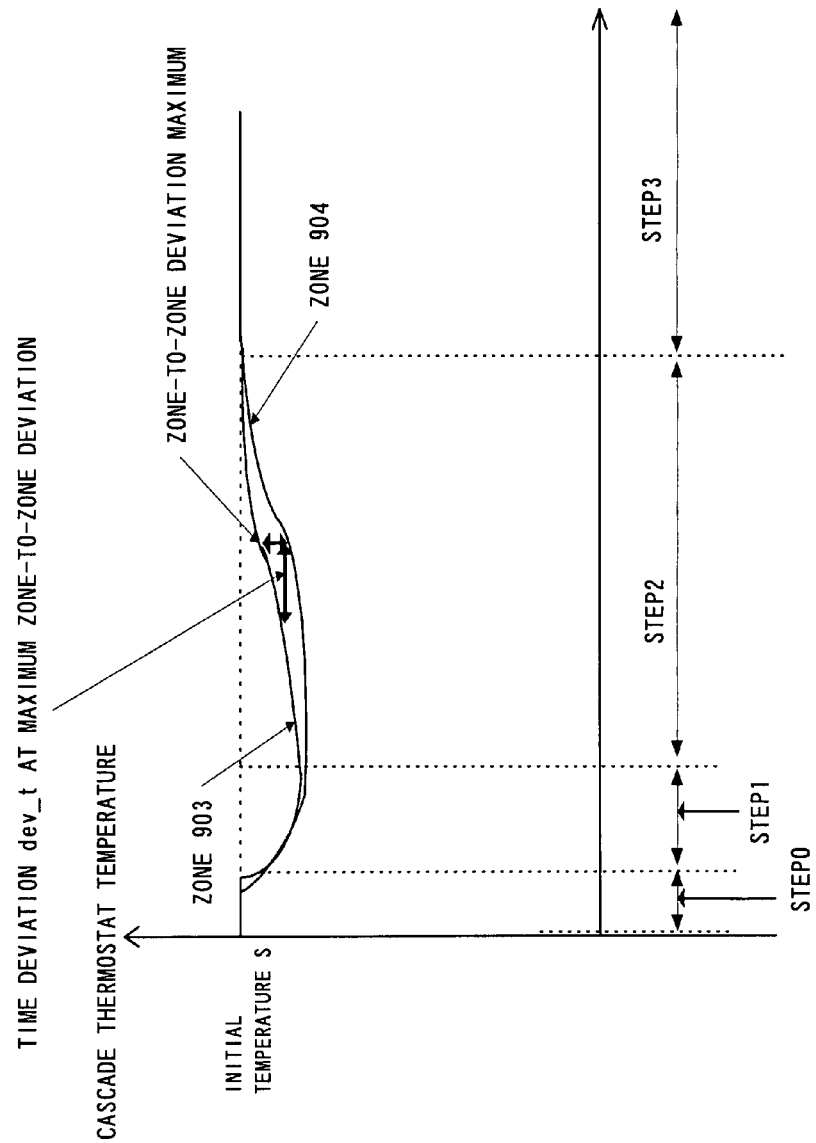
FIG. 30 is a figure for explaining a zone-to-zone deviation.

Then, explanation is made on the improvement and regulation of a zone-to-zone deviation. Because operation amount is prepared and regulated for each heating zone as shown in FIG. 30 even where temperature regulation is proper, there occurs early and late zones to a stabilization at target temperature. This forms a zone-to-zone deviation that possibly gives an effect upon film thickness. For this reason, by regulating the integral output pattern, the zone earlier to target transition is delayed to be matched to the late zone by regulating the integral output pattern, thus improving the zone-to-zone deviation.

Determined is a time deviation dev_t [min] at a maximum zone-to-zone deviation maximum time point of between a certain zone 903 earlier to a stabilization at target temperature and a zone 904 later to target temperature. This is to be determined by determining a temperature B' in the zone 904 at the time point of maximum zone-to-zone deviation so that the difference of between the time point the temperature becomes B' in the zone 903 and the time point of maximum zone-to-zone deviation can be given as a time deviation dev_t.

Figure 31:
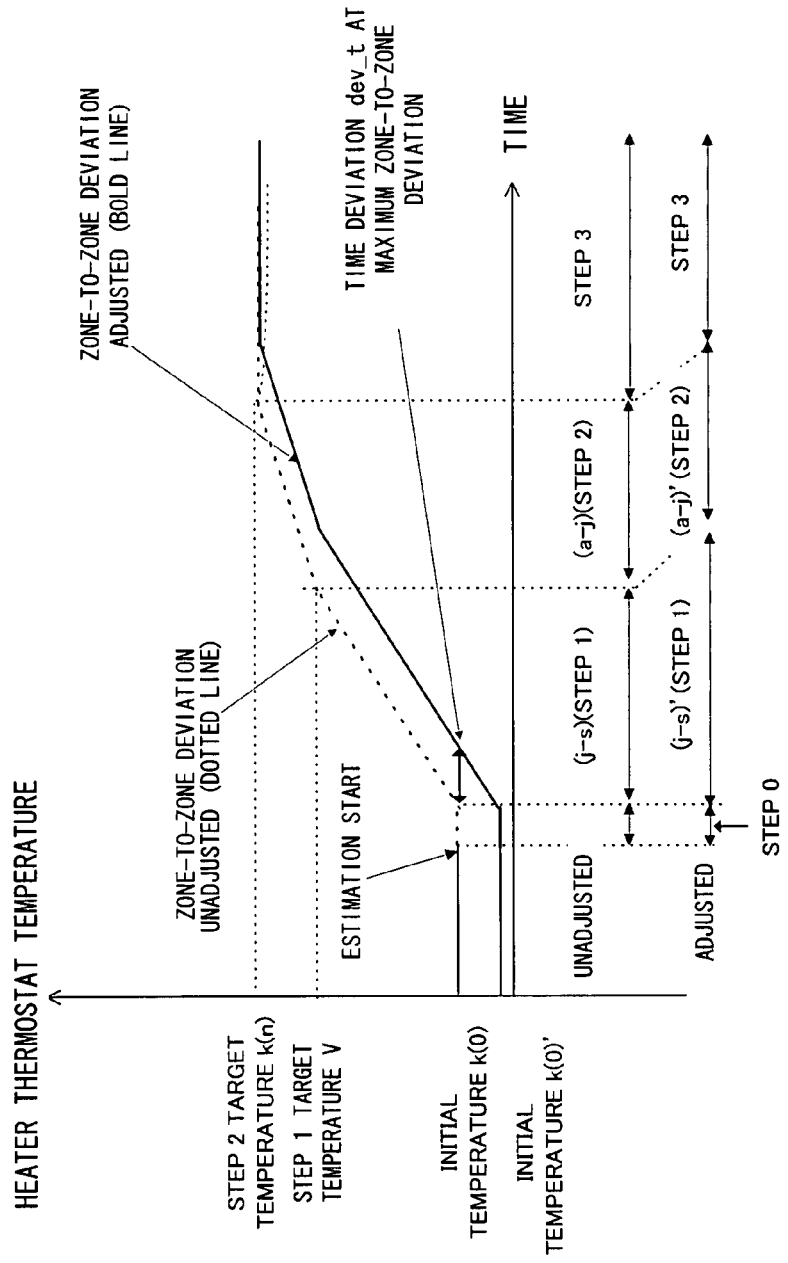
FIG. 31 is a figure for explaining a temperature regulating procedure in the presence of a zone-to-zone deviation.

Then, by delaying, by dev_t, each of the steps for an integral output pattern in the zone 903 as shown in FIG. 31, the stabilization at target temperature is delayed to be matched to the zone 904. The parameters shown in FIG. 31 can be determined by the equations (33)-(34) shown in the first embodiment. Here, T is the foregoing step 1 inclination T [° C./min].

By thus delaying the integral output pattern by the amount of time deviation dev_t, delaying is possible for the zone earlier in stabilization at target temperature. The above is the explanation on the temperature regulation method in the present embodiment.

By executing the above procedure, temperature regulation can be properly done swiftly and positively by even an operator not skilled. The detailed behavior in the reactor is shown in FIGS. 32 and 33.

Figure 32:
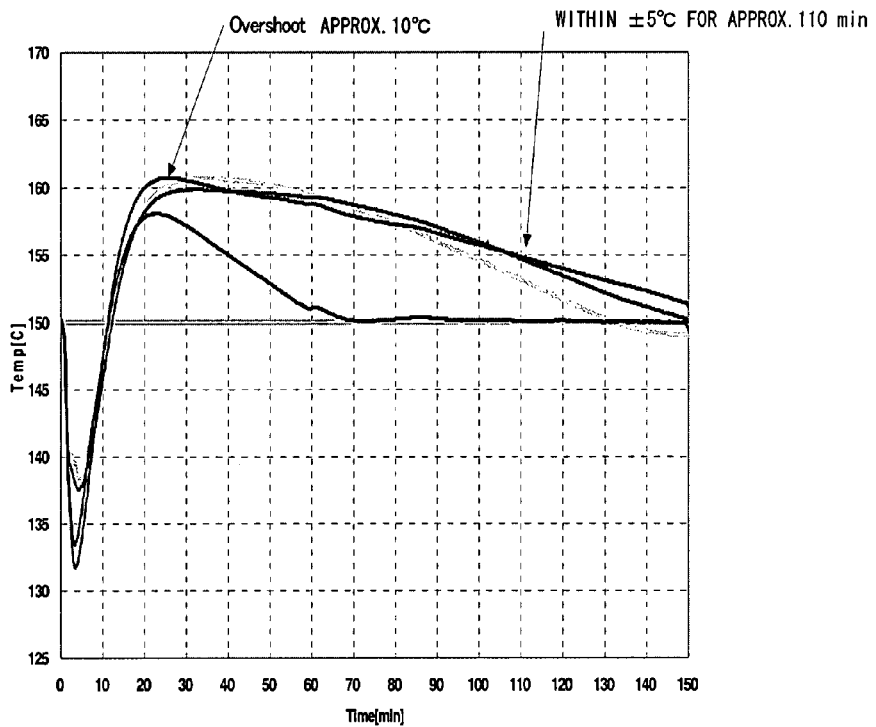
FIG. 32 is a figure showing a concrete example of temperature recovery after the boat is loaded.
Figure 33:
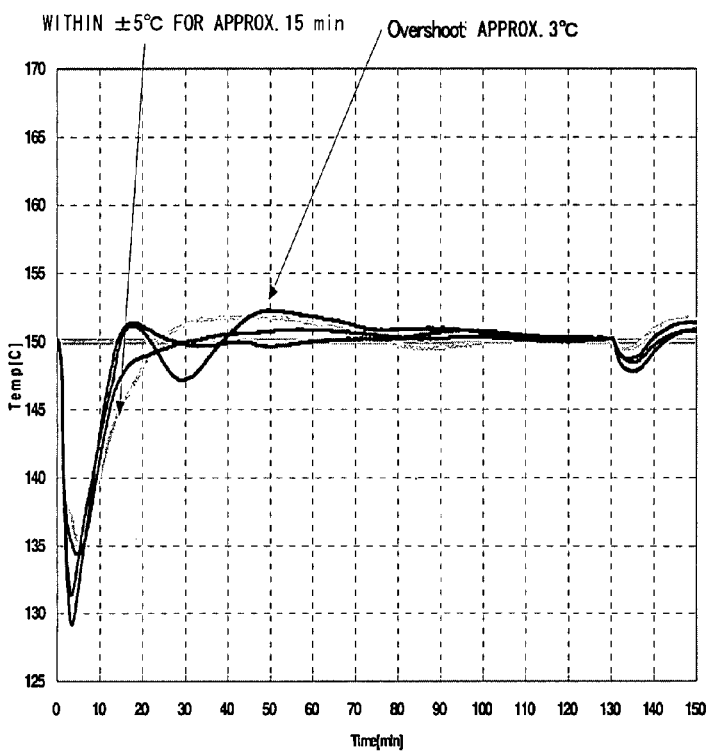
FIG. 33 is a figure showing a concrete example of temperature recovery after the boat is loaded.

FIGS. 32 and 33 are concrete examples of temperature recovery after the ending of boat-up. In the boat-up recovery under the conventional-technique PID control shown in FIG. 32, stabilization is not available within a target temperature ±5° C. even where overshoot is approximately 10° C. and it is approximately 100 minutes after the ending of boat-up.

In the boat-up recovery under the PIDC control with temperature regulation based on the procedure of the invention shown in FIG. 33, stabilization is available within a target temperature ±5° C. where overshoot is approximately 3° C. and it is approximately 15 minutes after the ending of boat-up. From FIGS. 32 and 33, the invention is apparently effective in boat-up recovery.

According to the invention, even where comparatively significant disturbances occur in the furnace under control, an integral output pattern that allows the control amount to follow the target value most rapidly is previously set up from the total sum over operation amounts containing such disturbances, to pattern-output an integral value in place of integral arithmetic operation at from a particular time. At from the time point the most part of the deviations resulting from disturbances, etc. is considered disappeared, integral arithmetic operation is again done to output an integral value, thus making it possible to recover the control amount outputted from the object under control to the initial value swiftly and correctly.

Meanwhile, according to the procedure in the invention, the most part of actual measurement temperature, i.e. natural phenomenon, operation amount and time, relied conventionally upon the experiences and intuitions of the skilled person during temperature regulation can be determined by a particular computing equation. This allows for temperature regulation with swiftness and positiveness thus diminishing the time and cost.

Meanwhile, by programming the procedure of the invention and incorporating it as software on a temperature controller or the like, proper temperature regulation is available without the need of operator's intervention.

Fourth Embodiment

Then, explanation is made on a fourth embodiment of the invention.

The thermal processing system in the present embodiment is arranged similarly to the thermal processing system according to the third embodiment. The present embodiment and the third embodiment are different in the processing where an overshoot or undershoot occurs in the temperature regulation process procedure. In the following, those similar to the apparatus structure and process contents of the third embodiment are attached with the same references, to omit the explanation thereof.

In the third embodiment, patterning is made for the integral output in a temperature transition while the integral output amount in a temperature stabilization is prepared to be that in stabilization, thereby effecting a temperature regulation. Namely, temperature transition period lies in steps 1 and 2 while stabilization period is in step 3.

Namely, the overshoot or undershoot regulation under PIDC control is regulated by use of an overshooting temperature ratio, in place of the regulation using temperature regulation in the third embodiment.

In also the third embodiment, an overshooting temperature ratio H is determined based on a result of PIDC control by use of the foregoing equations (59)-(61). In the following, equations (59)-(61) and the explanation thereon are again described.

Determined is a total sum over the cascade temperatures overshot in the duration of from a reach time "b" to initial time S to a stabilization time "c" at initial temperature S, as shown by the hatching in FIG. 23. Provided that this is an overshooting-temperature total sum F'", then F'" can be determined by the following equation (59). Incidentally, in equation (59), the integral range of ∫g(t)dt lies between b and C.

$$F'''=\int g(t)dt-S(c-b) \tag{59}$$

Then, determined is a total sum over temperatures of between a time point r1 of minimum temperature S1 and a stabilization time "c" at initial-temperature S, as shown by the hatching in FIG. 24. Provided that this is the total sum G over temperatures, then G can be determined by the following equation (60). Incidentally, in equation (60), the integral range of ∫g(t)dt lies between r1 and c.

$$G=\int g(t)dt-S'(c-r1) \quad (60)$$

Then, determined is an overshooting temperature ratio H [percentage]. This is a ratio of the overshooting temperature total sum F" shown in FIG. 23 to the temperature total sum G shown in FIG. 24. Accordingly, it can be determined by the following equation (61).

$$H=F''/G \quad (61)$$

The amount of overshooting temperature ratio H calculated is a heat amount ratio of an overshoot factor that is latent in the integral output pattern of steps 1 and 2. Therefore, by deleting the amount of overshooting temperature ratio H from the step 1 target temperature V, reflection is possible on the integral output pattern in a temperature transition, thus making it possible to stabilize swiftly the furnace interior to an ideal temperature.

Provided that the initial temperature is k(0), the step 0 time is "s", the step 1 target temperature is V, the step 1 time is (j−s), the step 2 time is (a−j) and the heater's stable temperature (step 3 target temperature) is k(n), then the step 1 target temperature V', step 1 ramp rate T' and step 2 ramp rate U after deleting of the overshooting temperature ratio H can be determined by the following equations (62)-(64).

$$V'=V*(1-H) \quad (62)$$

$$T'[°C./\min]=(V'-k(0))/(j-s) \quad (63)$$

$$U[°C./\min]=(k(n)-V')/(a-j) \quad (64)$$

Fifth Embodiment

Then, explanation is made on a fifth embodiment of the invention.

The thermal processing system according to the present embodiment is arranged similarly to the thermal processing system according to the first embodiment. The present embodiment and the first embodiment are different in the computation method for determining an operation amount of ramp-up when determining an output pattern of under power control in a temperature regulation process procedure. In the following, those similar to the apparatus structure and process contents of the first embodiment are attached with the same references, to omit the explanation thereof.

At first, a power output pattern is determined by use of "a", "d" and "D1" determined similarly to the first embodiment, thereby effecting power control.

Figure 35:
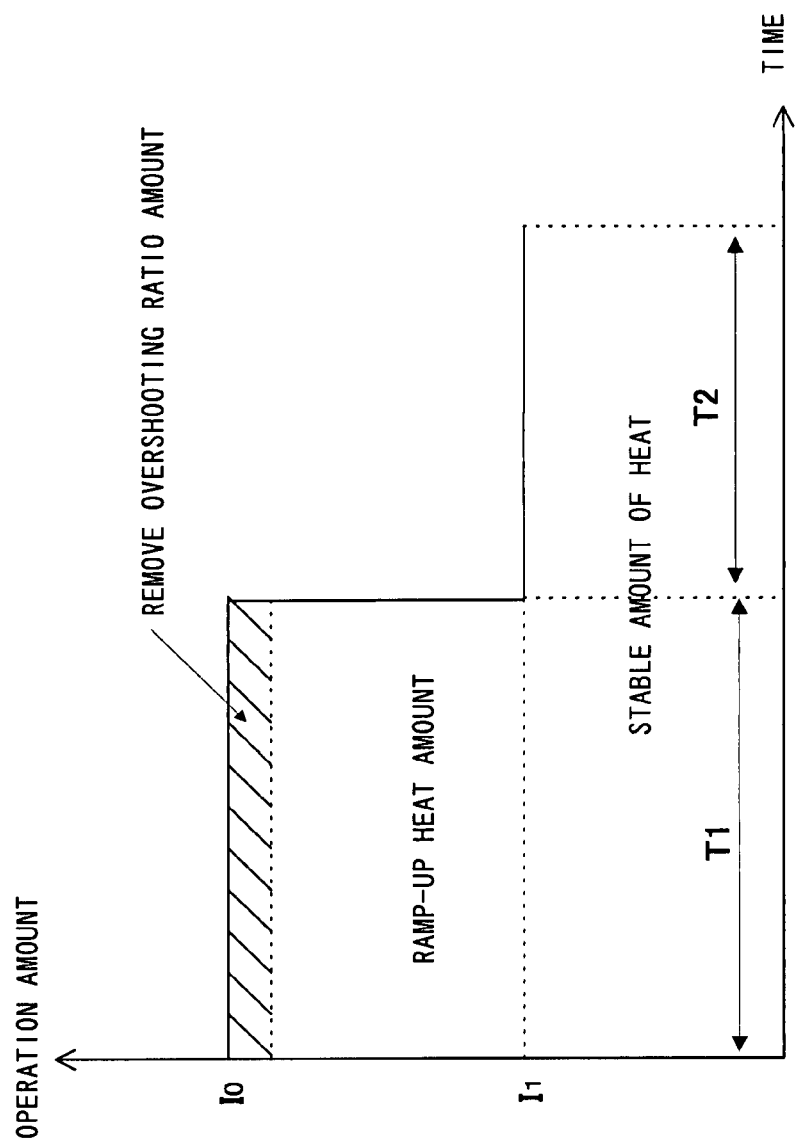
FIG. 35 is a figure for explaining a diminish from the operation amount determined from a ramp-up heat amount of a power output pattern having an overshooting temperature ratio M.

The parameters in FIG. 35 can be determined by the following equations (65)-(68).

$$I0=(D1'/T1)+d \quad (65)$$

$$I1=d \quad (66)$$

$$T1=a/2 \quad (67)$$

$$T2=a \quad (68)$$

Accordingly, if dividing into two periods the period of up to the maximum-overshoot time point of under PID control, the former half is considered as a period to raise the heater temperature in order for ramp-up while the latter half is as a period the cascade temperature rises with a delay though the heater temperature begins to fall. The parameters are set up on the consideration that the period the power required for ramp-up is outputted is suitably in the former half, i.e. a half at the maximum-overshooting time point.

I0 is an addition of an operation amount "d" in stability at a target temperature to an operation amount of outputting a ramp-up heat amount D' in a constant output amount in a half time of the overshoot maximum time "a". Using this power output pattern, temperature characteristic data of under power control is acquired.

Figure 34:
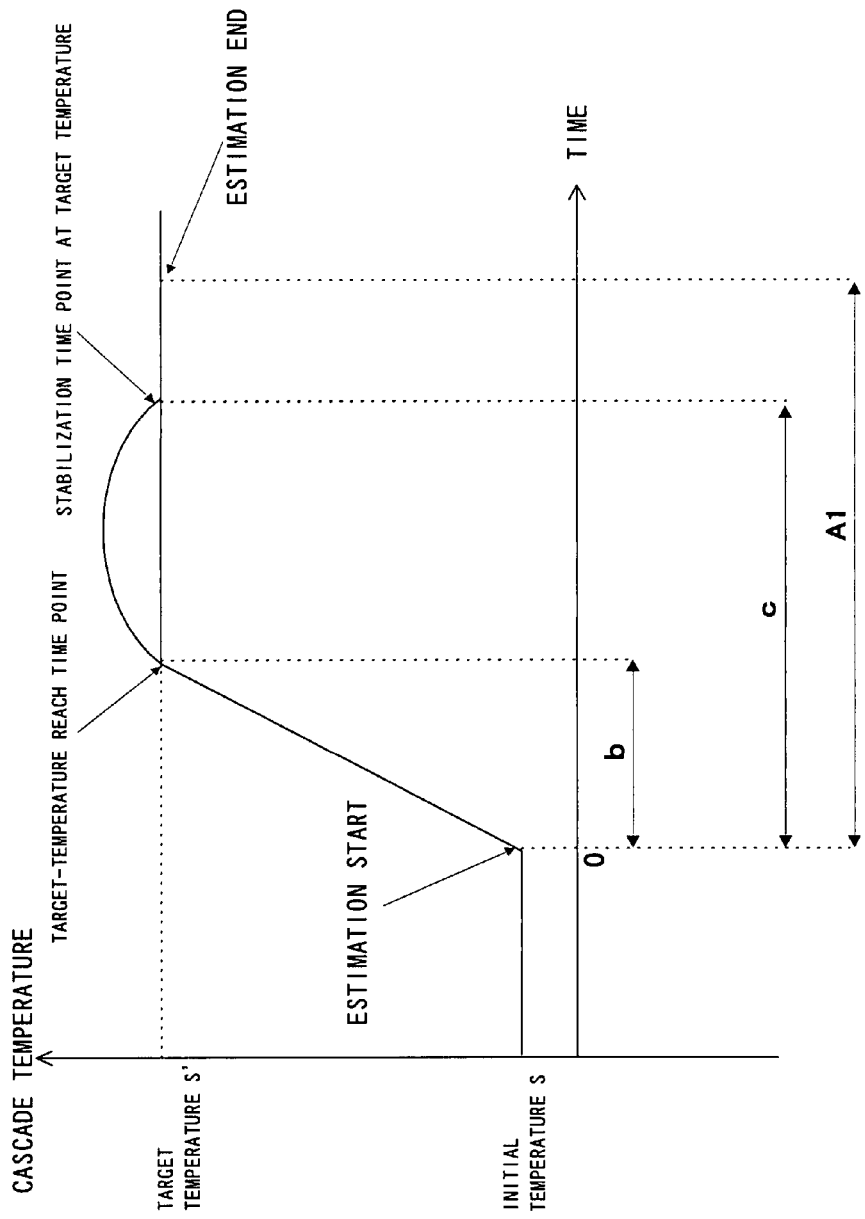
FIG. 34 is a figure for explaining a determination of various parameters from the temperature-characteristic basic data of under power control.

Then, a temperature-regulation estimating time A1 [min] of from a start of power control is determined from the temperature-characteristic basic data of under power control, as shown in FIG. 34. Meanwhile, determined are a target-temperature S' reach time "b" [min], a target-temperature S' stabilization time "c" [min], a maximum temperature j2 the heater thermocouple indicates, and a time a2 [min] of the maximum temperature. Meanwhile, determined are a temperature f(t) [°C.] the heater thermocouple 2 indicates at each time point within the temperature-regulation estimating time A1, and a temperature g(t) [°C.] the cascade thermocouple 3 indicates.

Then, determined is a total sum over overshooting temperatures in a duration of from a target-temperature S' reach time "b" to a target-temperature stabilization time "c", as shown in FIG. 9. In case this is taken as an overshooting-temperature total sum K, such K can be determined by the following equation (69). Incidentally, in equation (69), the integral range of ∫m(t)dt lies between b and c.

$$K=\int g(t)dt-S'*(c-b) \quad (69)$$

Then, determined is a total sum over temperatures in a duration of the target-temperature S' stabilization time "c", as shown in FIG. 10. If this is taken as a total sum L1 over temperatures, such L1 can be determined by the following equation (70). Incidentally, in equation (70), the integral range of ∫g(t)dt lies between 0 and c.

$$L1=\int g(t)dt \quad (70)$$

Then, an overshooting temperature ratio M [percentage] is determined. This is a ratio of an overshooting temperature total sum K to a total sum L1 over temperatures. It accordingly can be determined by the following equation (71).

$$M=K/L1 \quad (71)$$

Then, as shown in FIG. 35, the operation amount I0 can be made as a proper operation amount by deleting the overshooting temperature ratio M from the operation amount determined from the ramp-up heat amount for a power output pattern. If the operation amount I0 after deleting an overshooting temperature ratio H is taken as I0', such I0' can be determined by the following equation (72).

$$I0'=(I0-I1)*(1-M)+I1 \quad (72)$$

Rough regulation of temperature is available by deleting the amount of overshooting temperature ratio determined by the foregoing equations (69)-(72) and as shown in FIG. 35, acquiring temperature characteristic data again under power control and repeating the same procedure several times to obtain a suitable operation amount.

Sixth Embodiment

Then, a sixth embodiment is explained. The present embodiment is a modification to the configuration in the temperature control section explained in the first embodiment. In the following, those similar to the apparatus structure and process contents of the first embodiment are attached with the same references, to omit the explanation thereof.

Figure 36:
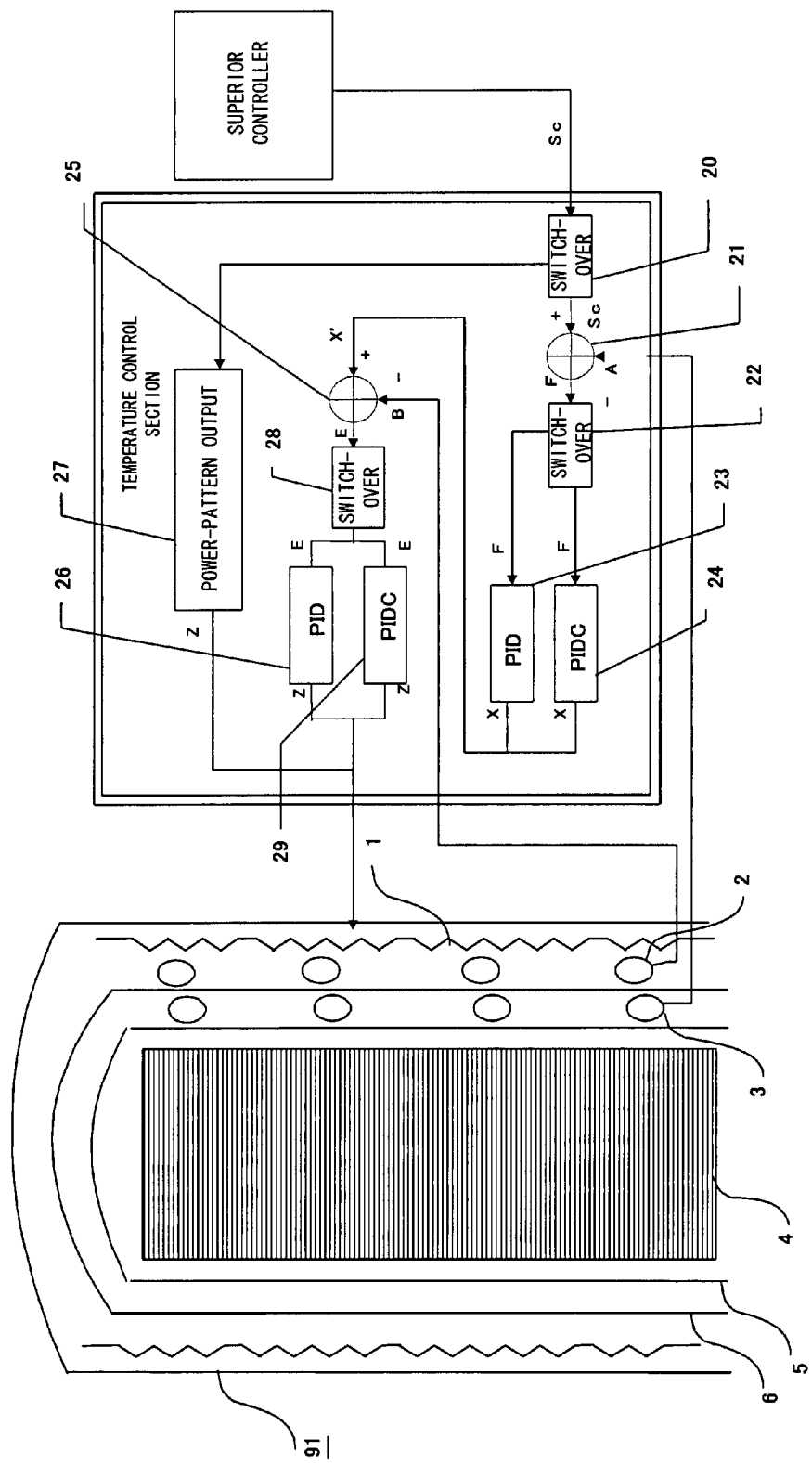
FIG. 36 is a functional block diagram for explaining a sixth embodiment of the invention.

As shown in FIG. 36, the present embodiment is configured to calculate an operation amount X by switching over PID operation and PIDC operation at a preset time, and an operation amount Z by switching over PID operation and PIDC operation at a preset time or from a power output pattern.

Seventh Embodiment

Then, a seventh embodiment is explained. The present embodiment is a modification to the first embodiment. In the following, those similar to the apparatus structure and process contents of the first embodiment are attached with the same references, to omit the explanation thereof.

Figure 37:
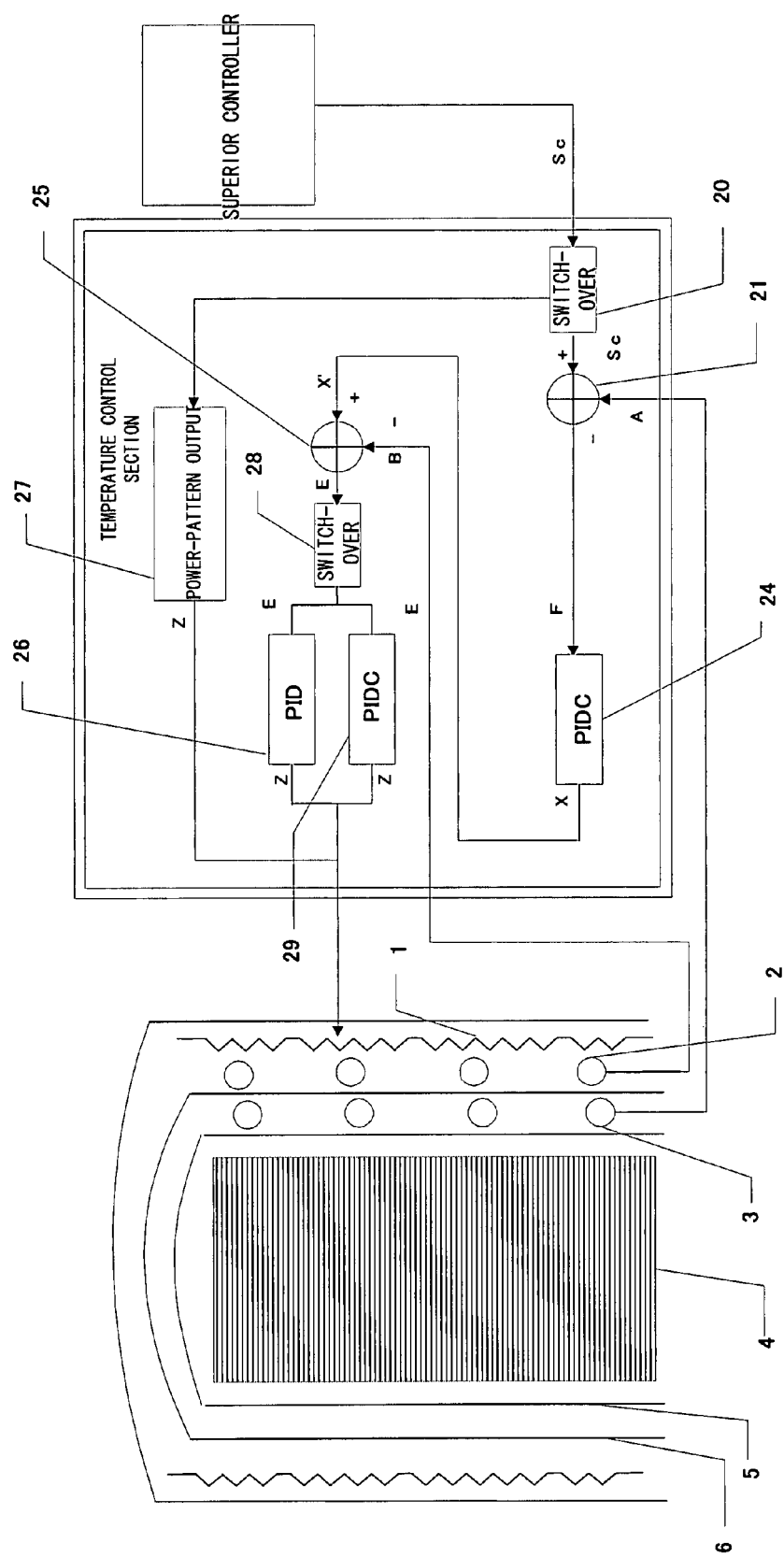
FIG. 37 is a functional block diagram for explaining a seventh embodiment of the invention.

As shown in FIG. 37, the present embodiment is configured to calculate an operation amount X by PIDC operation, and an operation amount Z by switching over PID operation and PIDC operation at a preset time or from a power output pattern.

Eighth Embodiment

Then, an eighth embodiment is explained. The present embodiment is a modification to the first embodiment. In the following, those similar to the apparatus structure and process contents of the first embodiment are attached with the same references, to omit the explanation thereof.

Figure 38:
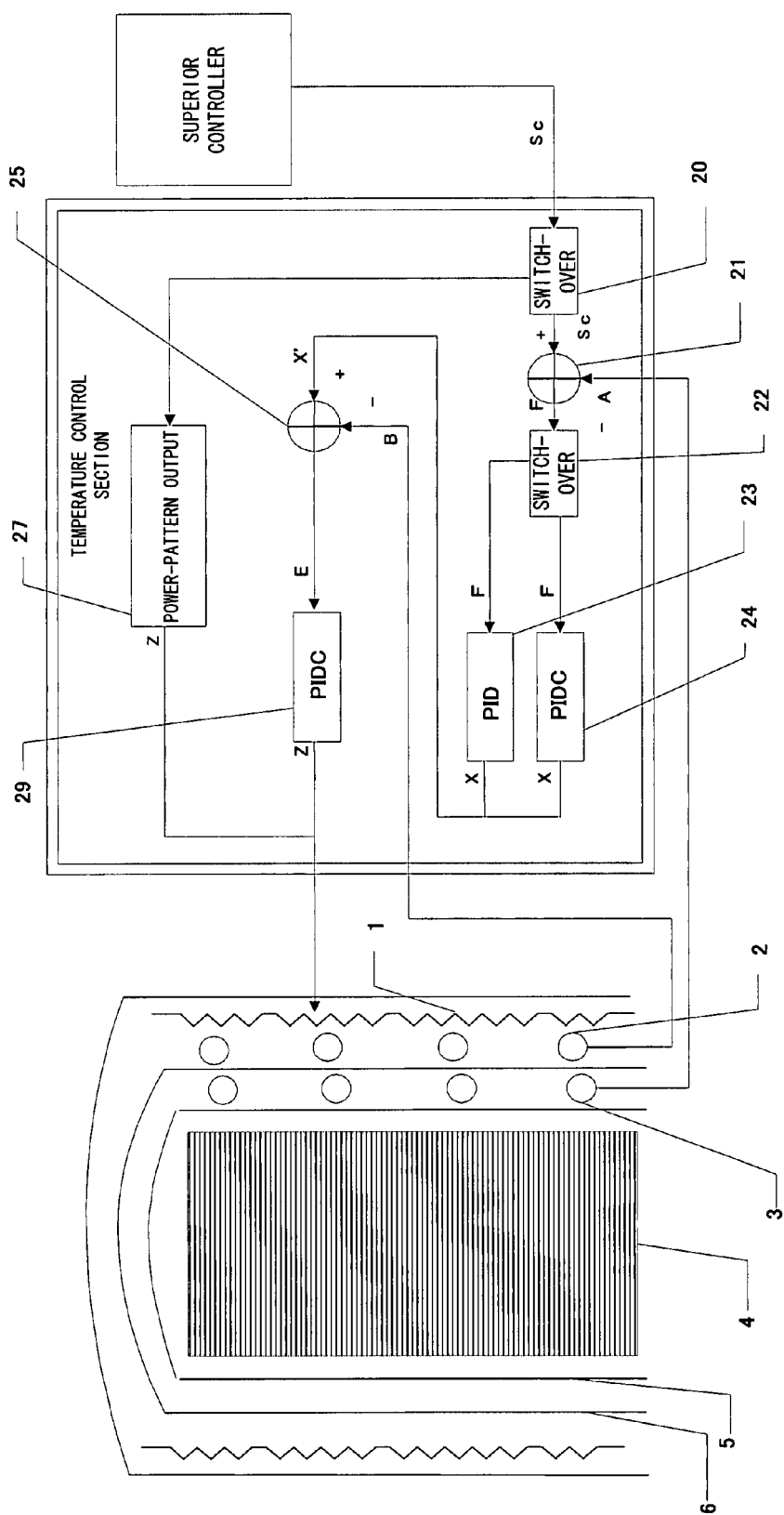
FIG. 38 is a functional block diagram for explaining an eighth embodiment of the invention.

As shown in FIG. 38, the present embodiment is configured to calculate an operation amount Z by PIDC operation or from a power output pattern.

Ninth Embodiment

Then, a ninth embodiment is explained. The present embodiment is a modification to the first embodiment. In the following, those similar to the apparatus structure and process contents of the first embodiment are attached with the same references, to omit the explanation thereof.

Figure 39:
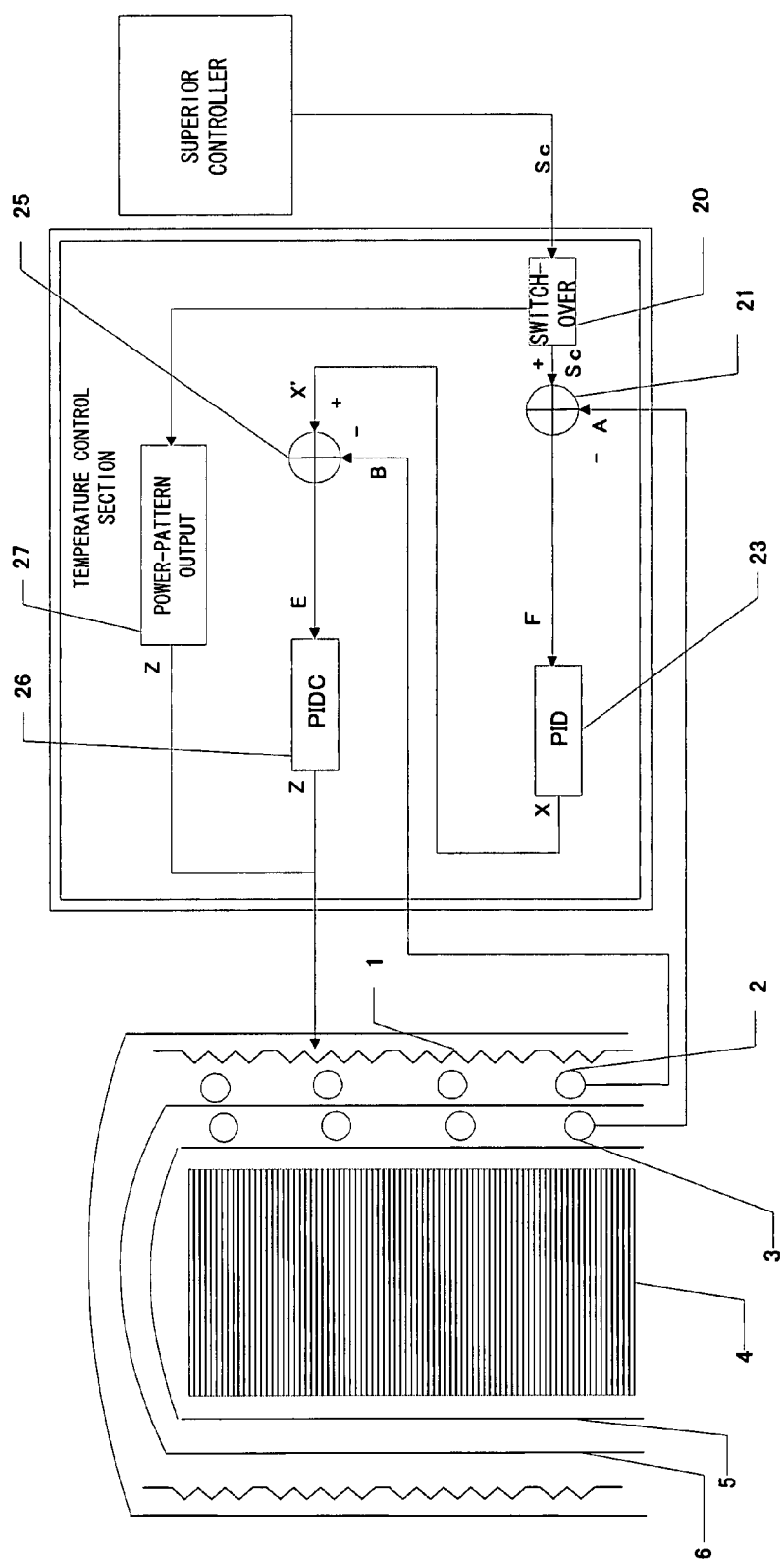
FIG. 39 is a functional block diagram for explaining a ninth embodiment of the invention.

As shown in FIG. 39, the present embodiment is configured to calculate an operation amount X by PID operation, and an operation amount Z by PIDC operation or from a power output pattern.

Tenth Embodiment

Then, a tenth embodiment is explained. The present embodiment is a modification to the first embodiment. In the following, those similar to the apparatus structure and process contents of the first embodiment are attached with the same references, to omit the explanation thereof.

Figure 40:
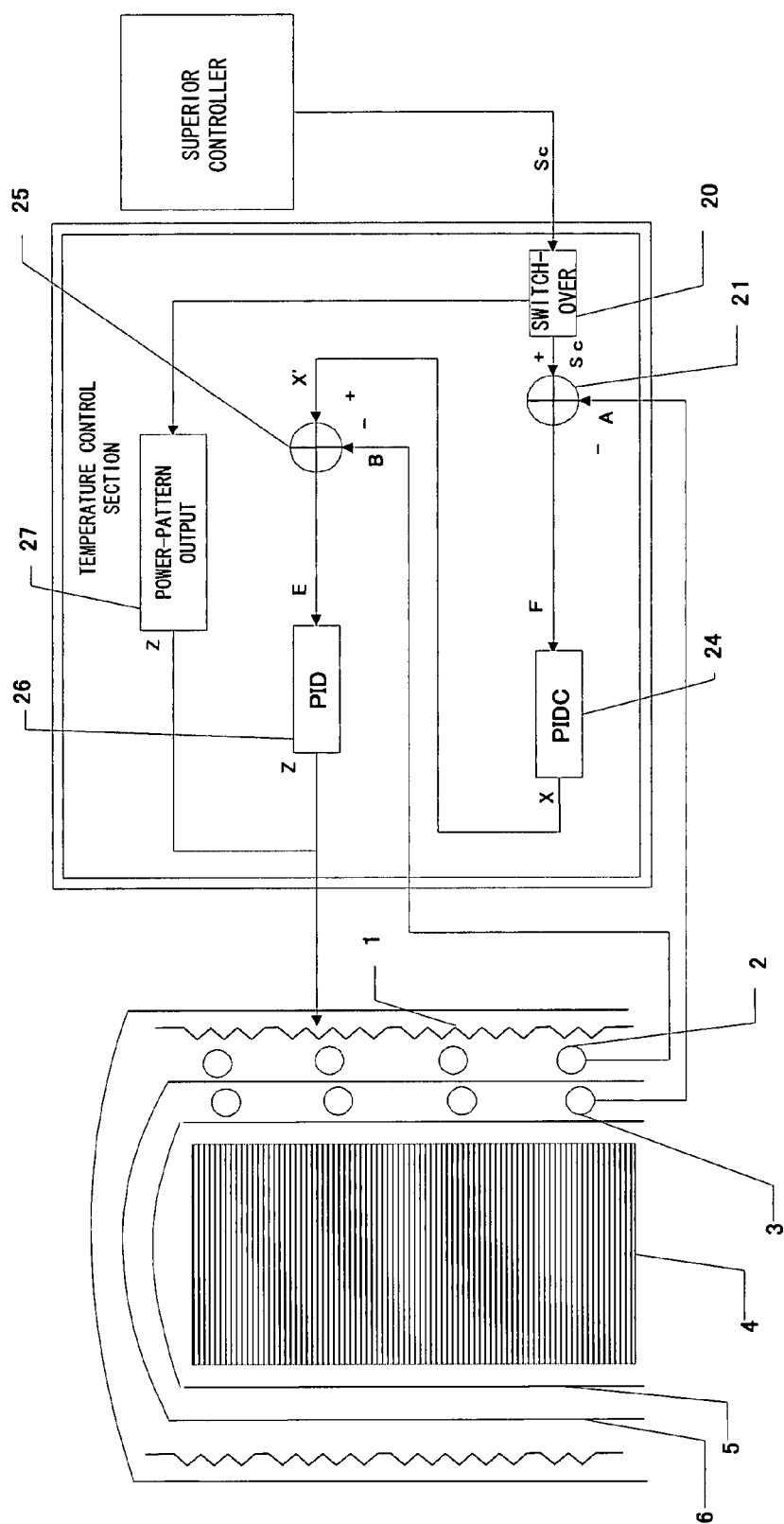
FIG. 40 is a functional block diagram for explaining a tenth embodiment of the invention.

As shown in FIG. 40, the present embodiment is configured to calculate an operation amount X by PIDC operation, and an operation amount Z by PID operation or from a power output pattern.

Eleventh Embodiment

Then, an eleventh embodiment is explained. The present embodiment is a modification to the first embodiment. In the following, those similar to the apparatus structure and process contents of the first embodiment are attached with the same references, to omit the explanation thereof.

Figure 41:
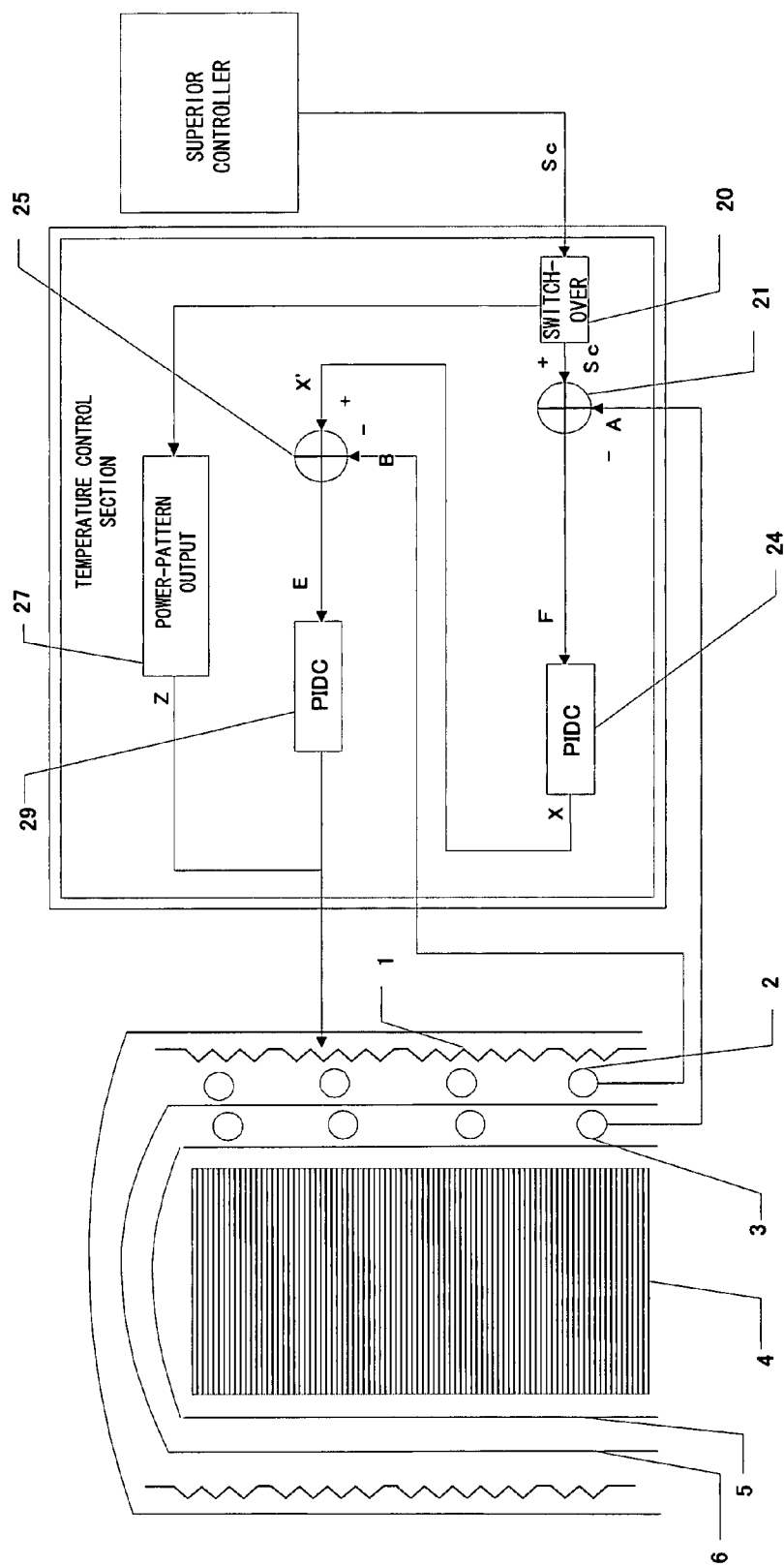
FIG. 41 is a functional block diagram for explaining an eleventh embodiment of the invention.

As shown in FIG. 41, the present embodiment is configured to calculate an operation amount X by PIDC operation, and an operation amount Z by PIDC operation or from a power output pattern.

Twelfth Embodiment

Then, a twelfth embodiment is explained. The present embodiment is a modification to the first embodiment. In the following, those similar to the apparatus structure and process contents of the first embodiment are attached with the same references, to omit the explanation thereof.

Figure 42:
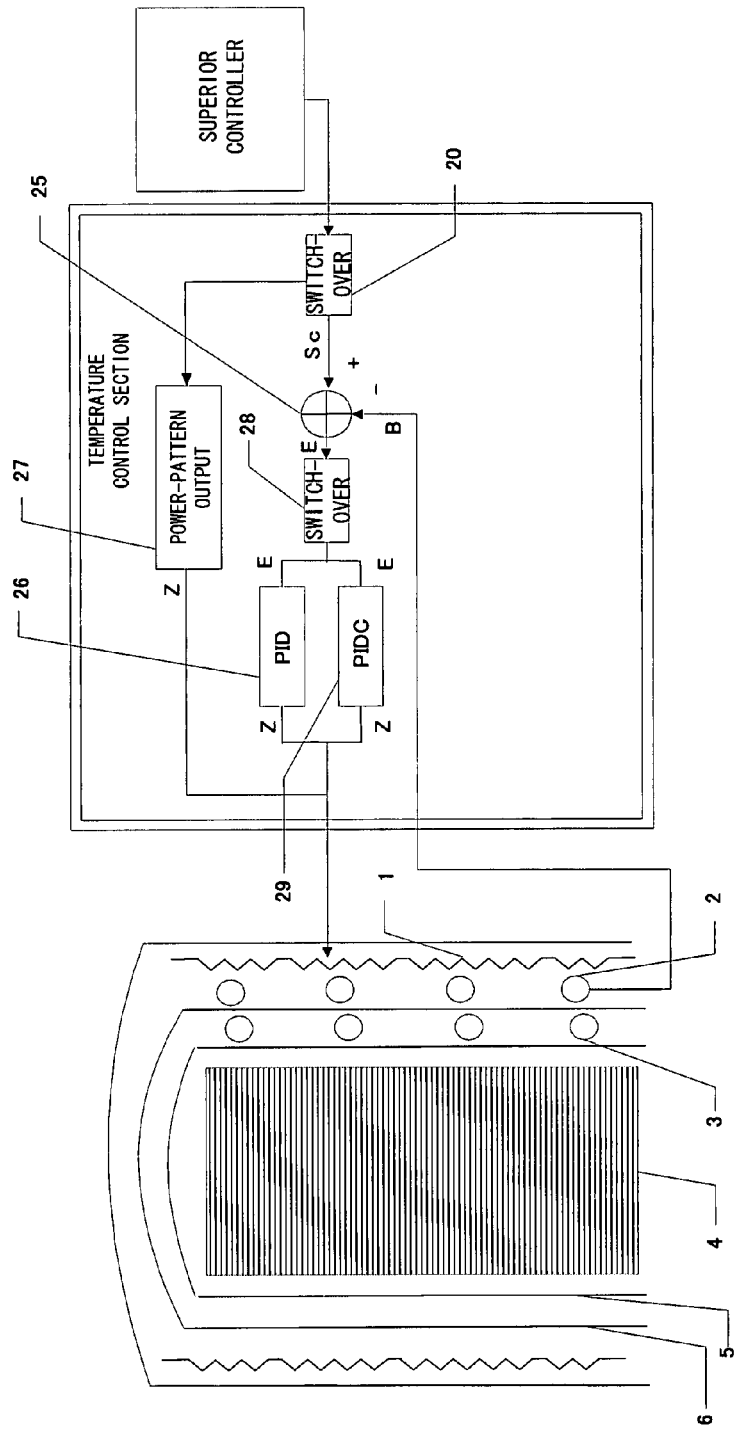
FIG. 42 is a functional block diagram for explaining a twelfth embodiment of the invention.

As shown in FIG. 42, the present embodiment uses a deviation E between a control amount B for the heater thermocouple and a target value Sc, by ignoring the control amount A for the cascade thermocouple.

Thirteenth Embodiment

Then, a thirteenth embodiment is explained. The present embodiment is a modification to the first embodiment. In the following, those similar to the apparatus structure and process contents of the first embodiment are attached with the same references, to omit the explanation thereof.

Figure 43:
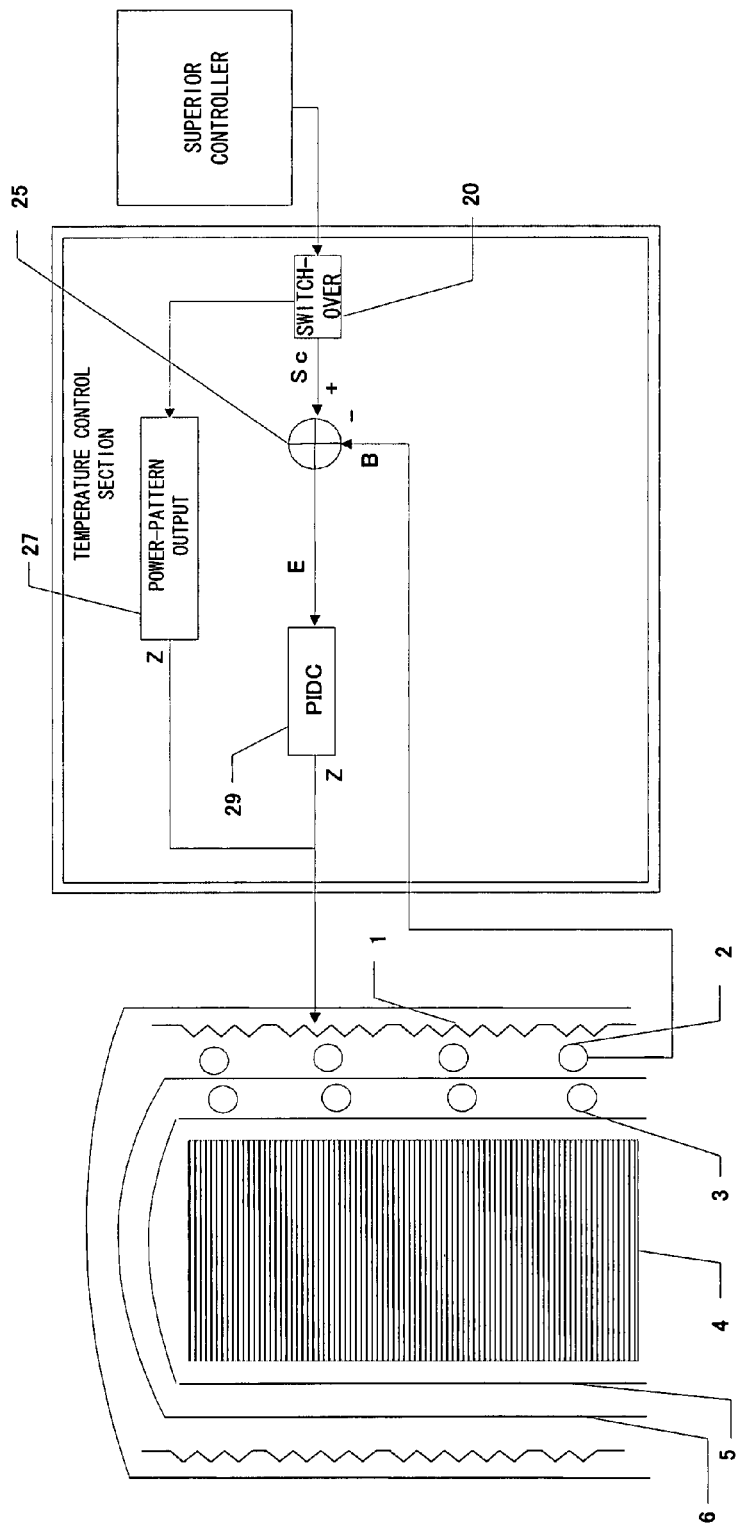
FIG. 43 is a functional block diagram for explaining a thirteenth embodiment of the invention.

As shown in FIG. 43, the present embodiment uses a deviation E between a control amount B for the heater thermocouple and a target value Sc, by ignoring the control amount A for the cascade thermocouple. An operation amount Z is calculated by PIDC operation or from a power output pattern.

Fourteenth Embodiment

Then, a fourteenth embodiment is explained. The present embodiment is a modification to the first embodiment. In the following, those similar to the apparatus structure and process contents of the first embodiment are attached with the same references, to omit the explanation thereof.

Figure 44:
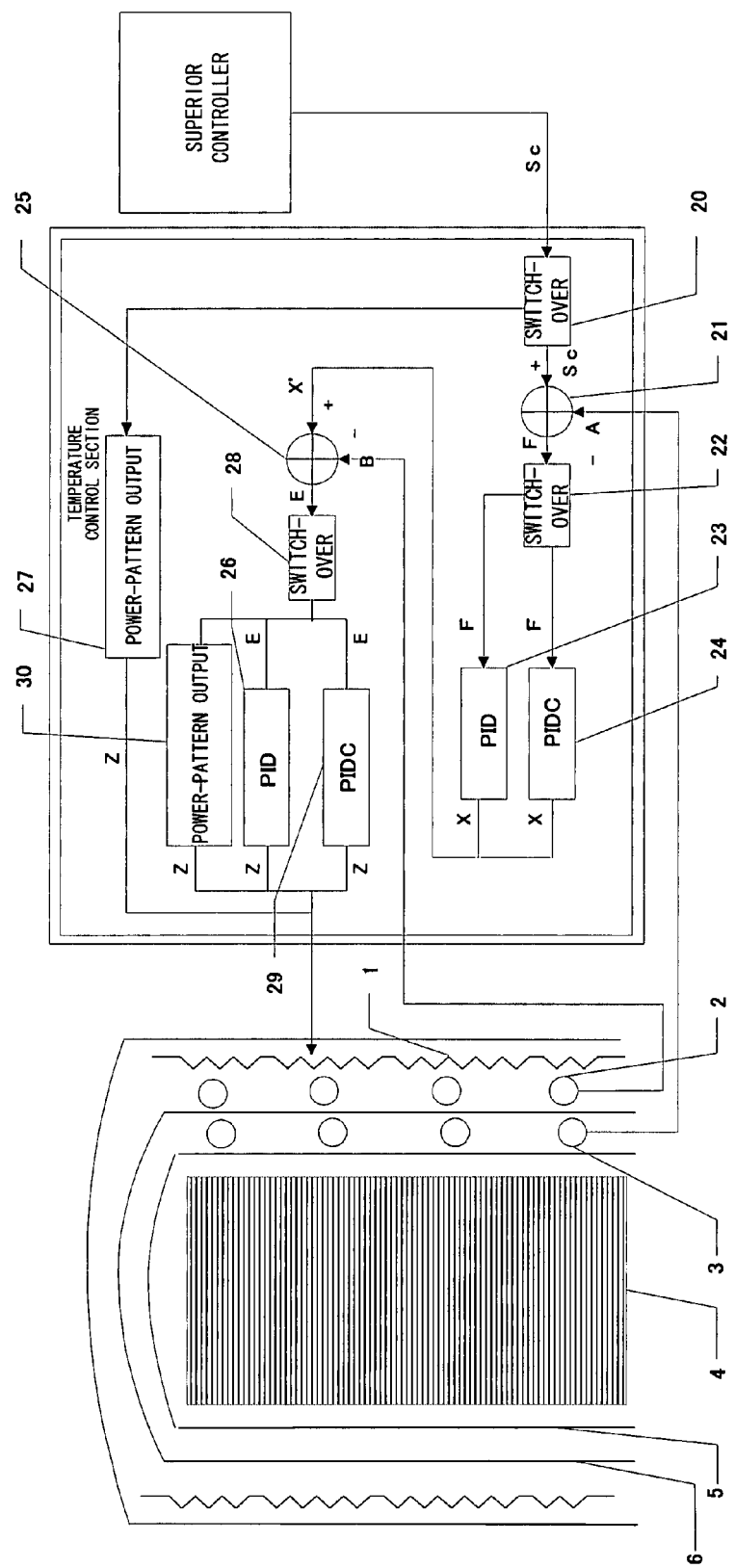
FIG. 44 is a functional block diagram for explaining a fourteenth embodiment of the invention.

As shown in FIG. 44, the present embodiment is configured to calculate an operation amount Z by switching over between three, i.e. PID operation, PIDC operation and a power output pattern at a preset time, or from a power output pattern.

Fifteenth Embodiment

Then, a fifteenth embodiment is explained. The present embodiment is a modification to the first embodiment. In the following, those similar to the apparatus structure and process contents of the first embodiment are attached with the same references, to omit the explanation thereof.

Figure 45:
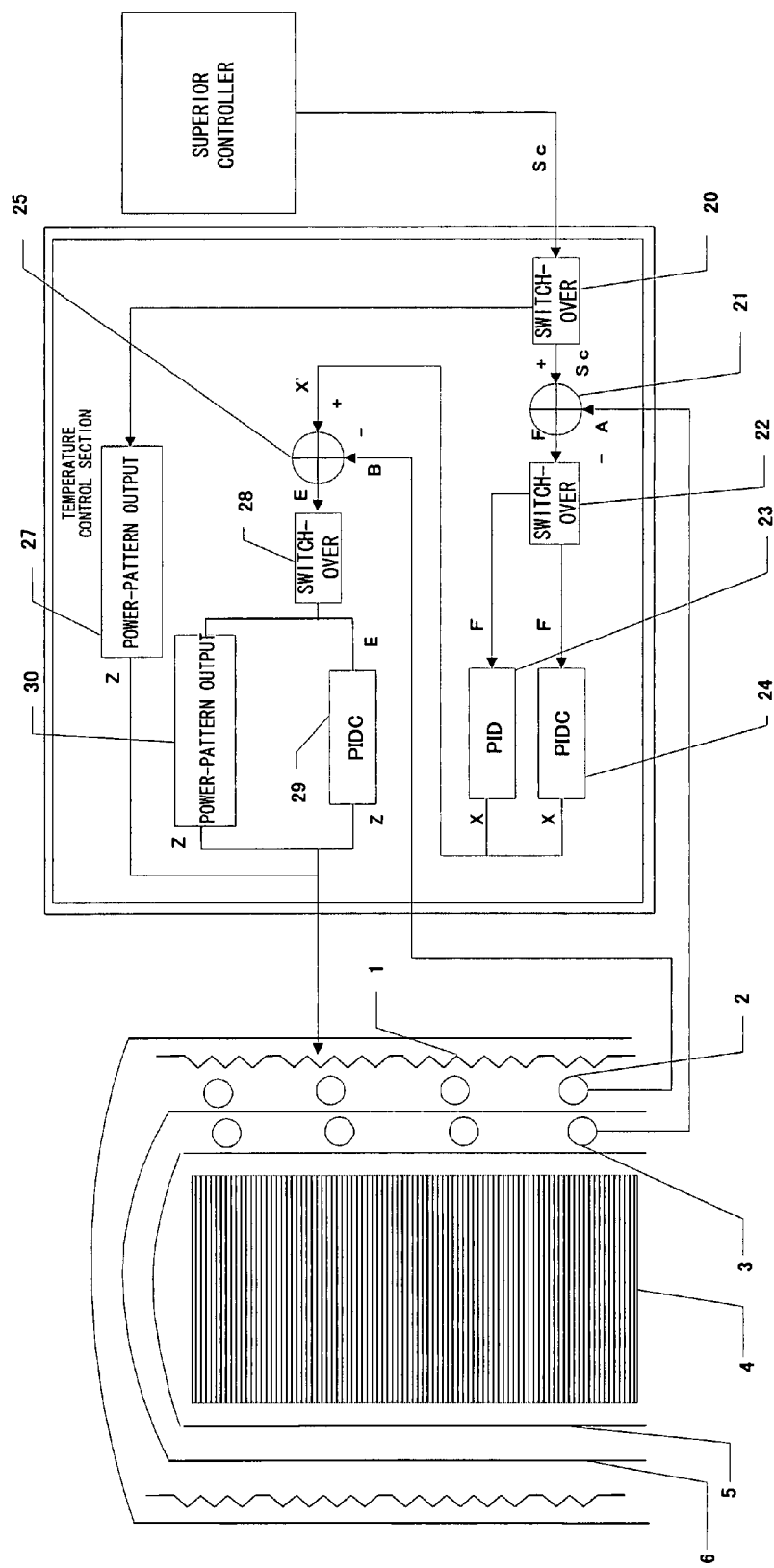
FIG. 45 is a functional block diagram for explaining a fifteenth embodiment of the invention.

As shown in FIG. 45, the present embodiment is configured to calculate an operation amount Z by switching over PIDC operation and a power output pattern at a preset time or from a power output pattern.

Sixteenth Embodiment

Then, a sixteenth embodiment is explained. The present embodiment is a modification to the first embodiment. In the following, those similar to the apparatus structure and process contents of the first embodiment are attached with the same references, to omit the explanation thereof.

Figure 46:
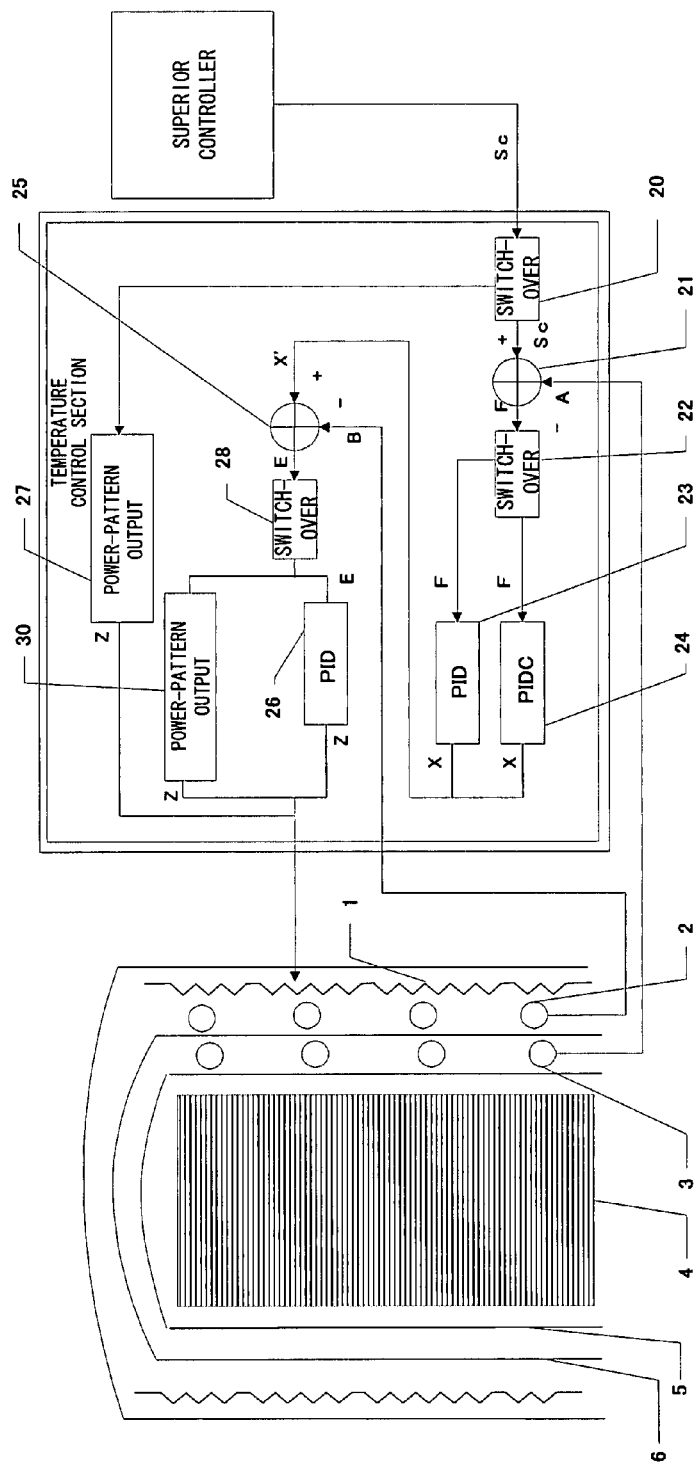
FIG. 46 is a functional block diagram for explaining a sixteenth embodiment of the invention.

As shown in FIG. 46, the present embodiment is configured to calculate an operation amount Z by switching over PIDC operation and a power output pattern at a preset time, or from a power output pattern.

Seventeenth Embodiment

Then, a seventeenth embodiment is explained.

The thermal processing system in the present embodiment is not in a vertical structure as in the thermal processing systems of the foregoing embodiments but in a single-wafer structure. In the following, those similar to the apparatus structure and process contents of the first embodiment are attached with the same references, to omit the explanation thereof. Incidentally, as shown in FIG. 47, the thermal processing system in the present embodiment has a temperature control section similar in configuration and function to the temperature control section 71 of the first embodiment shown in FIG. 1.

Figure 47:
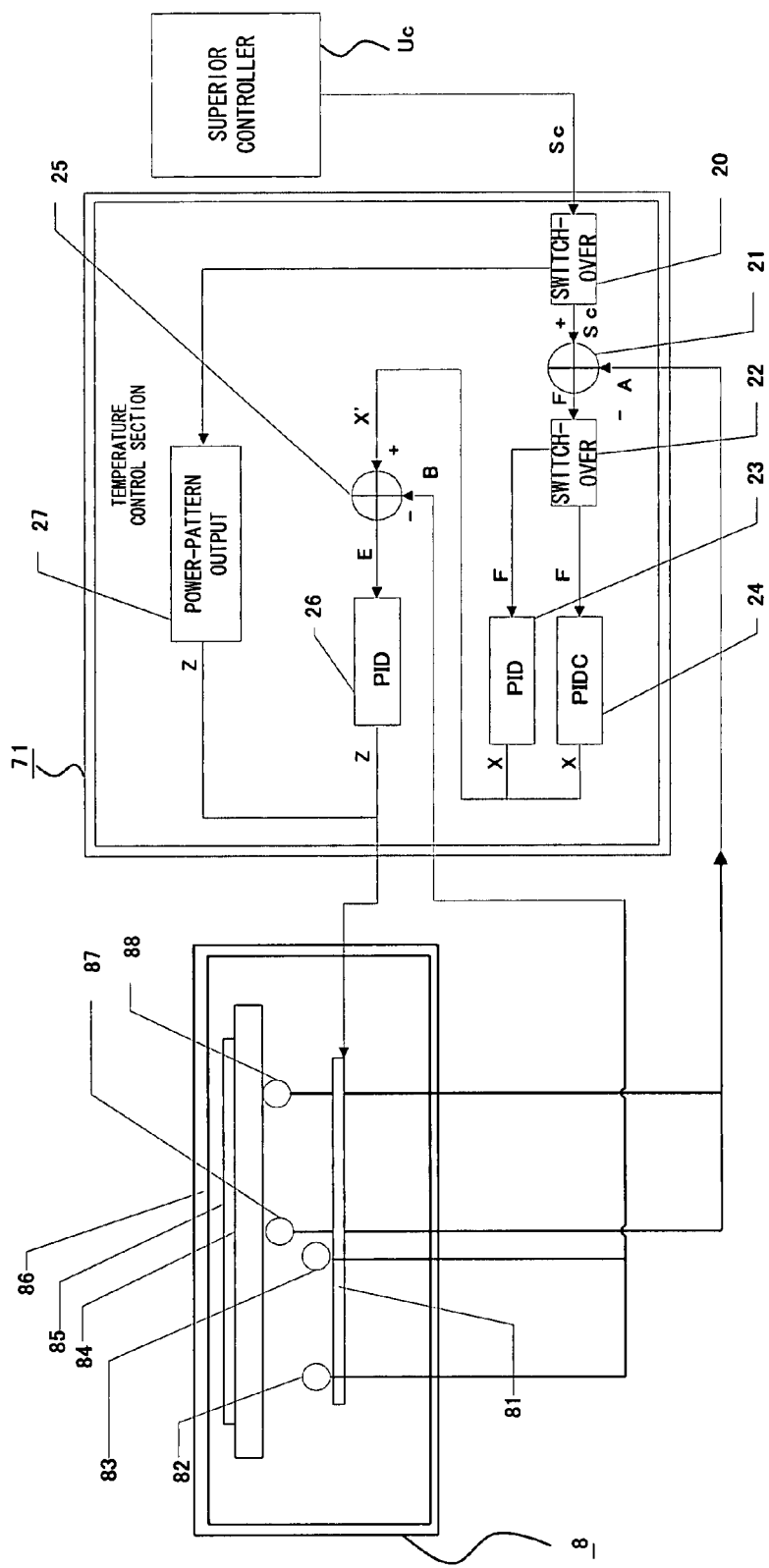
FIG. 47 is a functional block diagram for explaining a seventeenth embodiment of the invention.
Figure 48:
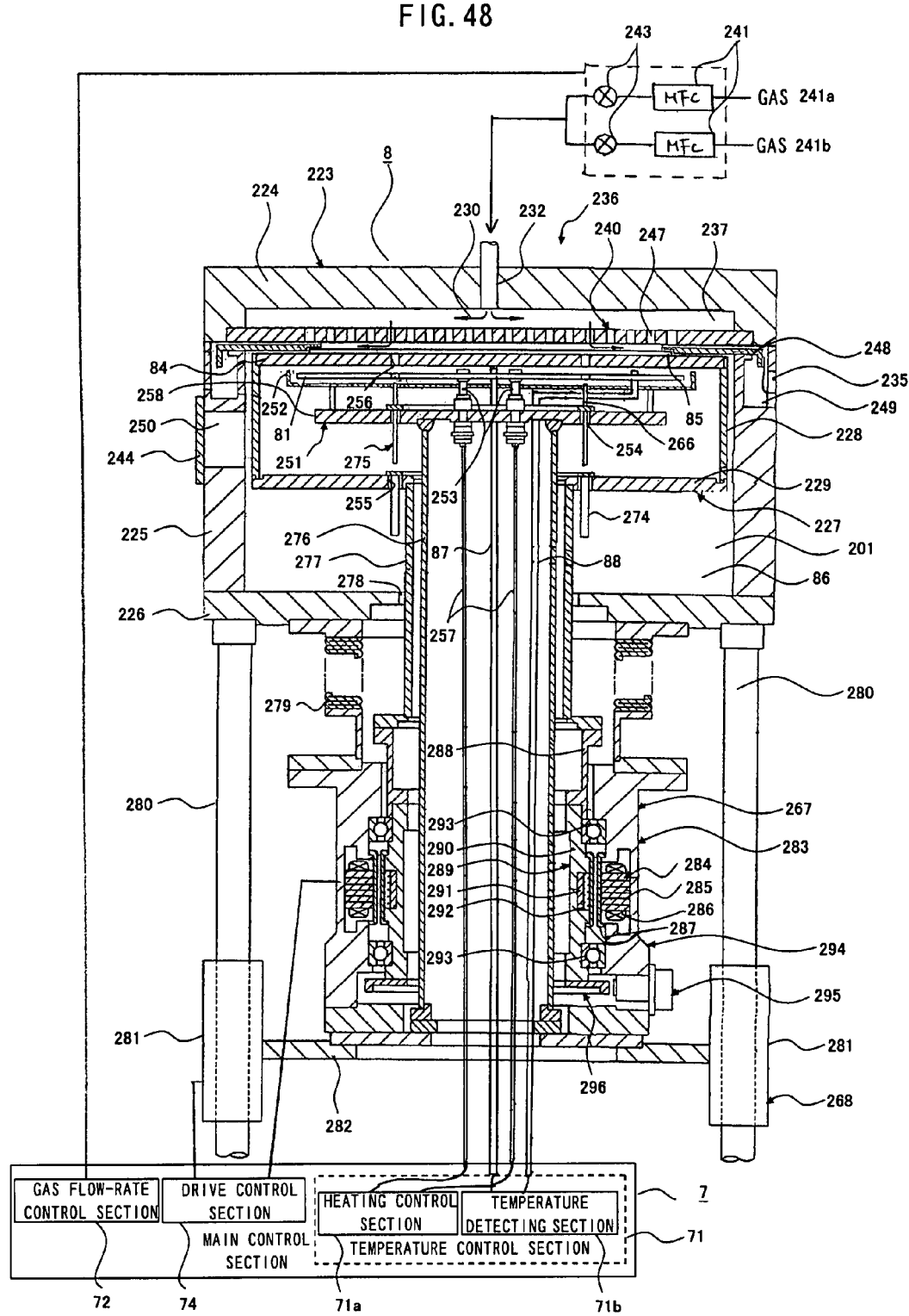
FIG. 48 is a figure for explaining the detail structure in a vicinity of a reactor of a single-wafer system concerning the seventeenth embodiment of the invention.

Specifically, in the thermal processing system of this embodiment, a process furnace 86 is structured as a single-sheet CVD furnace (single-sheet cold-wall CVD furnace) as shown in FIGS. 47 and 48, thus having a chamber 223 formed with a process chamber 201 for processing a wafer (semiconductor wafer) 85 as a substrate to process. The chamber 223 is formed in a cylindrical form closed both at upper and lower ends, by a combination of an upper cap 224, a cylindrical cup 225 and a lower cap 226.

Intermediately of a cylindrical wall of a cylindrical cup 225 of the chamber 223, a wafer load/unload port 250 is provided horizontally to be opened and closed by a gate valve 244. The wafer load/unload port 250 is formed such that a wafer 85, as a substrate to process, can be loaded/unloaded to/from the process chamber 201 by means of a wafer transporter, not shown in FIG. 48. Namely, the wafer 85 can be transported into/out of the process chamber 201 through the wafer load/unload port 250 while the wafer 85 is supported mechanically from beneath by the wafer transporter.

In an upper part of a wall surface opposite to the wafer load/unload port 250 of the cylindrical cup 225, there is formed a gas exit port 235 connected to an evacuator (not shown) made by a vacuum pump, etc., in a manner communicating with the process chamber 201. Thus, the process chamber 201 at its interior is to be evacuated by the evacuator.

Meanwhile, in the upper part of the cylindrical cup 225, a gas-exit buffer space 249 is formed annular in form and communicating with the gas-exit port 235, thus having a function to discharge a gas uniformly to the front surface of the wafer 85 cooperatively with a cover plate 248.

Incidentally, the cover plate 248 extends over a part of a susceptor (substrate support means) 84 in a manner covering an edge of the wafer 85. This is used to control a CVD film to be formed at the edge of the wafer 85.

The upper cap 224 of the chamber 223 is integrally built with a shower head 236 to supply a process gas. Namely, gas supply pipes 232 are inserted in a ceiling wall of the upper cap 224. Each gas supply pipe 232 is connected with a gas supply device formed by an opening-and-closing valve 243 and a flow-rate control device (mass flow controller: MFC) 241 in order to introduce process gasses 241a, 241b, e.g. material gas, purge gas, etc. On the lower surface of the upper cap 224, a shower plate (hereinafter, referred to as plate) 240 formed in a disc form is fixed horizontally spaced from the gas supply pipe 232. In the plate 240, a plurality of gas-blow ports (hereinafter, referred to as blow ports) 247 are arranged evenly throughout the surface thereof, thus communicating between the upper and lower spaces.

A buffer chamber 237 is formed by an inner space defined by an inner surface of the upper cap 224 and the upper surface of the plate 240. The buffer chamber 237 is arranged to diffuse the process gas 230, introduced in the gas supply pipe 232, wholly evenly and to blow it evenly in a shower form through the blow ports 247.

An insertion bore 278 is formed circular in the center of the lower cap 226 of the chamber 223. A cylindrically-formed support shaft 276 is inserted from below into the process chamber 201 at a centerline thereof. The support shaft 276 is allowed to ascend and descend by means of an elevator mechanism (elevator means) 268 using an air-cylinder device or the like.

A heating unit 251 is concentrically arranged and horizontally fixed, at an upper end of the support shaft 276. The heating unit 251 is allowed to ascend and descend through the support shaft 276. Namely, the heating unit 251 has a support plate 258 formed in a disc form. The support plate 258 is fixed concentrically at an upper end opening of the support shaft 276. A plurality of electrodes 253 are provided vertically, serving also as pillars, on the upper surface of the support plate 258. Between the upper ends of the electrodes 253, there is bridged and fixed a heater (heating means) 81 formed in a disc form and to be controlled separately at a plurality of regions thereof. The electric line 257 for the electrodes 253 is inserted through a hollow interior of the support shaft 276.

Meanwhile, below the heater 81, a reflector plate 252 is fixed to the support plate 258 so that the heat radiated at the heater 81 can be reflected toward the susceptor 84. This acts for heating well in efficiency.

Meanwhile, pyrometers 87, 88, as temperature detecting means, are inserted from the lower end of the support shaft 276 so that the pyrometers 87, 88 can be arranged with the tips having respective predetermined gaps to the backside of the susceptor 84. The pyrometers 87, 88 are structured by a combination of a quartz rod and an optical fiber, to detect the radiation light emitted from the backside of the susceptor 84 (e.g. the backside corresponding to the divisional regions of the heater 81). Thus, those are used in calculating the backside temperature of the susceptor 84 (the temperature of the wafer 85 can be calculated from the previously acquired relationship in temperature between the wafer 85 and the susceptor 84). Depending upon the result of calculation, the heater 81 is placed under control in its heating degree.

Around the support shaft 276 in the insertion bore 278 of the lower cap 226, there is concentrically arranged a rotary shaft 277 formed in a cylindrical form greater in diameter than the support shaft 276 and inserted in the process chamber 201 from below. The rotary shaft 277 is arranged to ascend and descend together with the support shaft 276 by means of the elevator mechanism 268 using an air cylinder device, etc. At the upper end of the rotary shaft 277, a rotary drum 277 is concentrically arranged and horizontally fixed so that the rotary drum 227 can be rotated by the rotary shaft 277. Namely, the rotary drum 227 has a rotary plate 229 formed in a doughnut-like flat plate and a rotary barrel 228 formed circular cylindrical. The rotary plate 229 has an inner peripheral edge fixed to the upper-end opening of the cylindrical rotary shaft 277 while the rotary barrel 228 is concentrically fixed to the outer peripheral edge in the upper surface of the rotary plate 229. The rotary barrel 228 of the rotary drum 227 has an upper end covered with the susceptor 84 that is formed in a disc form using silicon carbide, aluminum nitride, etc. in a manner closing the upper-end opening of the rotary barrel 228.

The rotary drum 227 is arranged with a wafer elevator device 275, as shown in FIG. 48. The wafer elevator device 275 is structured with two elevation rings each formed in a circular ring form on which a projection pin (substrate push means) 226, 274 projects. The lower elevation ring (hereinafter, rotation-side ring) is arranged on the rotary plate 229 of the rotary drum 227, concentrically to the support shaft 276. On the lower surface of the rotation-side ring, a plurality of (assumed three in the embodiment) push pins (hereinafter, referred to as rotation-side pins) 274 are arranged equally spaced circumferentially and projecting vertically downward. The rotation-side pins 274 are slidably received respectively in guide holes 255 arranged in the rotary plate 229 in positions on a concentric line to the rotary barrel 228 and vertically formed. The rotation-side pins 274 have lengths set up mutually equal so that they can horizontally push up the rotation-side ring wherein those are set up in a manner corresponding to the amount of push-up of the wafer over the susceptor. The rotation-side pins 274 have lower ends opposed to, for seating/unseating to/from, the bottom surface of the process chamber 201, i.e. upper surface of the lower cap 226.

The support plate 258 of the heating unit 251 is arranged with the other elevation ring (hereinafter, referred to as heater-side ring) formed in a circular ring form, concentrically to the support shaft 276. On the lower surface of the heater-side ring, a plurality of (assumed three in the embodiment) push pins (hereinafter, referred to as heater-side pins) 266 are arranged equally spaced circumferentially and projecting vertically downward. The heater-side pins 266 are slidably received respectively in guide holes 254 arranged in the support plate 258 in positions on a concentric line to the support shaft 276 and vertically formed. The heater-side pins 266 have lengths set up mutually equal so that they can horizontally push up the heater-side ring wherein the lower ends thereof are opposed to the upper surface of the rotation-side ring through a proper air gap. Namely, the heater-side pins 266 are arranged not to interfere with the rotation-side ring during rotation of the rotary drum 227.

Meanwhile, on the upper surface of the heater-side ring, a plurality of (assumed three in the embodiment) push pins (hereinafter, referred to as push portions) 266 are arranged equally spaced circumferentially and projecting vertically upward. The push portions 266 have upper ends opposed to the through-holes 256 of the heater 81 and susceptor 84. The push portions 266 have lengths set up mutually equal so that the wafer 85, rested on the susceptor 84 can be placed floating horizontally from the susceptor 84, by being inserted from below through the through-holes 256 of the heater 81 and susceptor 84. Meanwhile, the push portions 266 have length set up such that the upper ends thereof do not protrude from the upper surface of the heater 81 in the state the heater-side ring seats upon the support plate 258. Namely, the push portions 266 are arranged not to interfere with the susceptor 84 during rotation of the rotary drum 227 and not to prevent the heater 81 from heating up.

As shown in FIG. 48, the chamber 223 is supported horizontally by a plurality of pillars 280. Over those pillars 280, elevation blocks 281 are respectively fit for ascending and descending. Between the elevation blocks 281, there is bridged an elevation base 282 that can be ascended and descended by an elevation drive device (not shown) using air cylinder device, etc. A sacseptor rotating device is arranged on the elevation base 282. Between the susceptor rotation device and the chamber 223, a bellows 279 is interposed in a manner to hermetically seal the outer side of the rotary shaft 277.

A blushless DC motor is used for the susceptor rotating mechanism (rotating means) 267 arranged on the elevation base 282, whose output shaft (motor shaft) is formed as a hollow shaft thus being structured as the rotary shaft 277. The susceptor rotating mechanism 267 has a housing 283. The housing 283 is installed vertically upwardly on the elevation base 282. The housing 283 has an inner peripheral surface fixed with a stator 284 formed by an electromagnet (coil). Namely, the stator 284 is structured with a coil wire (enamel-coated copper wire) 286 wound over a core 285. The coil wire 286 is electrically connected with a lead, not shown, inserted through a through-hole, not shown, opened in a sidewall of the housing 283. The stator 284 at its coil wire 286 is supplied with electric power from a driver (not shown) of the blushless DC motor through the lead, thus being structured to form a rotary magnetic field.

At the inward of the stator 284, a rotor 289 is concentrically arranged with an air gap set up. The rotor 289 is rotatably pivoted on the housing 283 through the upper and lower ball bearings 293. Namely, the rotor 289 has a cylindrical body 290, a core 291 and a plurality of permanent magnets 292. The body 290 is fixed with the rotary shaft 277 for rotation in unison therewith by means of a bracket 288. The core 291 is fit to and fixed on the body 290. Around the core 291, the plurality of permanent magnets 292 are fixed circumferentially equally spaced. The core 291 and the plurality of permanent magnets 292 form a plurality of magnetic poles arranged annular. The rotary magnetic field formed by the stator 284 is to pass the plurality of magnetic poles, i.e. the magnetic field of the permanent magnets 292, thereby causing the rotor 289 to rotate.

The upper and lower ball bearings 293 are respectively arranged at upper and lower ends of the body 290 of the rotor 289. The upper and lower ball bearings 293 are suitably set with gaps to absorb the thermal expansion of the body 290. The gaps of the ball bearings 293 are to absorb the thermal expansion of the body 290 wherein, on the other hand, those are set at 5-50 μm in order to suppress chattering to a minimal extent. Incidentally, the gap of the ball bearing signifies a gap occurring on an opposite side where the balls are gathered to any one side of the outer lace and the inner lace.

The stator 284 and the rotor 289 have respective opposed surfaces where covers 287 are opposed to each other that are outer and inner surrounding members structuring double-sided cylindrical walls. Those are respectively fixed to the inner peripheral surface of the housing 283 and to the outer peripheral surface of the body 290, thus being set with predetermined air gaps to the respective covers 287. The covers 287, employing non-magnetic stainless steel, are respectively formed in cylindrical forms extremely thin in cylindrical wall thickness. Those are firmly fixed evenly to the housing 283 and the body 290 throughout the circumference thereof by electron beam welding, at the upper and lower opening ends of the cylinders. Because the covers 287 are formed extremely thin of non-magnetic stainless steel, they are to prevent the magnetic flux from dispersing and the motor efficiency from lowering. Besides, the coil wire 286 of the stator 284 and the permanent magnets 292 of the rotor 289 can be prevented from corroding. Meanwhile, the interior of the process chamber 201 can be positively prevented from being contaminated due to the coil wire 286, etc. The covers 287 surround the stator 284 in a hermetically sealed state thereby perfectly isolating the stator 284 from the interior of the process chamber 201 where a vacuum atmosphere is to prevail.

Meanwhile, the susceptor rotating device is arranged with a magnetic rotary encoder 294. Namely, the magnetic rotary encoder 294 has a to-detect ring 296 as an object-to-detect formed of a magnetic material. The to-detect ring 296 uses a magnetic material, such as iron, and formed in a circular ring form. The to-detect ring 296 has an outer periphery arranged annularly with a multiplicity of teeth serving as a to-detect part.

In an opposite position to the to-detect ring 296 of the housing 283, a magnetic sensor 295 is arranged to detect the teeth that are the to-detect part of the to-detect ring 296. The gap, between the tip surface of the magnetic sensor 295 and the outer peripheral surface of the to-detect ring 296, is set at 0.06-0.17 mm. The magnetic sensor 295 is configured to detect a change of magnetic flux caused due to rotation of the to-detect ring 296 opposite in position thereto by means of a magnetic resistance element. The detection result by the magnetic sensor 295 is sent to the blushless DC motor, i.e. to the drive control section of the susceptor rotating mechanism 267 where it is used in positional recognition of the susceptor 84 and in controlling the rotation amount of the susceptor 84. Incidentally, the process furnace 86 has a main control section 7 configured with a gas flow-rate control section 72, a drive control section 74, a heating control section 71a, a temperature control section 71b and so on. Meanwhile, the temperature control section 71 is configured by the heating control section 71a and the temperature detecting section 71b, thus having heater thermocouples 82, 83 for detecting the temperature of the heater 81 at the temperature control section 71.

The gas flow-rate control section 72 is connected to an MFC 241 and an opening-and-closing valve 243, to regulate the flow-rate and gas supply. The drive control section 74 is connected to the susceptor rotating mechanism 267 and elevation blocks 281, thus controlling the drive of those. The heating control section 71a is connected to the heater 81 through a line 257, to control the heating degree of the heater 81. The temperature detecting section 71b is connected to the pyrometers 87, 88, to detect the temperature of the susceptor 84, thus being used in heating-control of the heater 81 cooperatively with the heating control section 71a.

Then, explanation is made on a film-forming process in a semiconductor device manufacturing method with the thermal processing system of the present embodiment.

Upon loading and unloading the wafer 85, the rotary drum 227 and the heating unit 251 are descended to a lower-limit position by the rotary shaft 277 and support shaft 276. Thereupon, the rotation-side pins 274 of the wafer elevator device 275, at their lower ends, go into engagement with the bottom surface of the process chamber 201, i.e. the upper surface of the lower cap 226. Accordingly, the rotation-side ring ascends relatively to the rotary drum 227 and heating unit 251. The ascended rotation-side ring pushes up the heater-side pins 266 thereby lifting the heater-side ring up. When the heater-side ring is lifted, the three push portions 266 standing at the heater-side ring passes through the through-holes 256 of the heater 81 and susceptor 84. Thus, the wafer 85 rested upon the upper surface of the susceptor 84 is supported from below and floated from the susceptor 84.

When the wafer elevator device 275 becomes a state the wafer 85 is floated from the upper surface of the susceptor 84, there becomes a state an insertion space is formed under the wafer 85, i.e. a space at between the underside of the wafer 85 and the upper surface of the susceptor 84. Accordingly, the tweezers, i.e. a substrate support plate provided on a wafer transporter not shown in FIG. 48, are inserted from the wafer load/unload port 250 into the insertion space of the wafer 85. The tweezers, inserted under the wafer 85, ascend to receive the wafer 85. The tweezers, after receiving the wafer 85, retracts through the wafer load/unload port 250 and unloads the wafer 85 from the process chamber 201. The wafer transporter, which unloaded the wafer 85 by means of the tweezers, transports the wafer 85 to a predetermined storage site for, e.g. an empty wafer cassette, external of the process chamber 201.

Then, the wafer transporter receives, by the tweezers, a wafer 85 next to form a film from the predetermined storage site for, e.g. occupied wafer cassette, and loads it into the process chamber 201 through the wafer load/unload port 250. The tweezers transport the wafer 85 to a position which is above the susceptor 84 and at which the center of the wafer 85 coincides with the center of the susceptor 84. After transporting the wafer 85 to a predetermined position, the tweezers somewhat descend thereby putting the wafer 85 onto the susceptor 84. The tweezers, after delivering the wafer 85 to the wafer elevator device 275, exits to the exterior of the process chamber 201 through the wafer load/unload port 250. After the tweezers exit the process chamber 201, the wafer load/unload port 250 is closed by means of a gate valve (sluice valve) 244.

When the gate valve 244 is closed, the rotary drum 227 and the heating unit 251 are ascended by the elevation base 282 relative to the process chamber 201 through the rotary shaft 277 and support shaft 276. By the rise of the rotary drum 227 and heating unit 251, the push pins 266, 274 descend relative to the rotary drum 227 and heating unit 251 so that the wafer 85 is perfectly placed in on the susceptor 84, as shown in FIG. 48. The rotary shaft 277 and the support shaft 276 are stopped in a position at which the push portions 266 at upper ends come close to the underside of the heater 81 in height.

Meanwhile, the process chamber 201 is evacuated by the vacuum device (not shown) connected to the gas exit port 235. On this occasion, the bellows 279 isolates the vacuum ambient in the process chamber 201 from the external atmosphere.

Then, the rotary drum 227 is rotated by the susceptor rotating mechanism 267 through the rotary shaft 277. Namely, when the susceptor rotating mechanism 267 is operated, the rotary magnetic field of the stator 284 passes the magnetic field of a plurality of magnetic poles of the rotor 289, to rotate the rotor 289. Accordingly, the rotary drum 227 rotates by means of the rotary shaft 277 fixed to the rotor 289. On this occasion, the magnetic rotary encoder 294, arranged on the susceptor rotating mechanism 267, detects from time to time the rotating position of the rotor 289 that is sent to the drive control section 74. Based on the signal, control is effected as to rotation rate, etc.

During rotation of the rotary drum 227, the rotation-side pins 274 unseat from the bottom surface of the process chamber 201 while the heater-side pins 226 is unseated from the rotation-side ring. Accordingly, the rotary drum 227 is not prevented from rotating by the wafer elevator device 275. Moreover, the heating unit 251 can stay in the state of stoppage. Namely, in the wafer elevator device 275, the rotation-side ring and the rotation-side pins 274 rotate together with the rotary drum 227 while the heater-side ring and the heater-side pins 226 are in the state of stoppage together with the heating unit 251.

When the temperature of the wafer 85 rises up to a process temperature wherein the amount of gas exiting through the gas-exit port 235 and the rotation of the rotary drum 227 are stabilized, a process gas 230 is introduced in the supply tube 232 as shown by the solid arrow in FIG. 48. The process gas 230, introduced in the gas supply pipe 232, flows in the buffer chamber 237 serving as a gas dispersion space and diffuses radially outwardly. It turns into a nearly uniform flow through the blow ports 247 of the shower plate 240, thus being blown in a shower form toward the wafer 85. The process gas 230, blown in a shower form through a group of blow ports 247, passes the space above the cover plate 248 and is sucked into the gas exit port 235 via the gas-exit buffer space 249, thus being allowed to exit.

On this occasion, because of rotation of the wafer 85 on the susceptor 84 supported on the rotary drum 227, the process gas 230 blown in a shower form from the group of blow ports 247 become in uniform contact with the entire surface of the wafer 85. Because of the uniform contact of process gas 230 with the entire surface of the wafer 85, the thickness and quality distributions of the CVD film formed by the process gas 230 on the wafer 85 are given uniform throughout the surface of the wafer 85.

Meanwhile, because the heating unit 251 is in the state not to rotate due to the support by the support shaft 276, temperature distribution is controlled uniformly throughout the surface of the wafer 85 being heated by the heating unit 251 while being rotated by the rotary drum 227. By thus uniformly controlling the temperature distribution throughout the surface of the wafer 85, the entire surface of the wafer is uniformly controlled as to the thickness and quality distributions of the CVD film formed on the wafer 85 by thermo-chemical reaction.

When a predetermined process time previously selected lapses, the susceptor rotating mechanism 267 is stopped from operating. On this occasion, because the rotating position of the susceptor 84, i.e. rotor 289, is monitored from time to time by the magnetic rotary encoder 294 set up in the susceptor rotating mechanism 267, the susceptor 84 is correctly stopped at a preset rotating position. Namely, correct, well-reproducible coincidence is given at between the push portions 266 and the through-holes 256 of the heater 81 and susceptor 84.

When the susceptor rotating mechanism 267 is stopped from operating, the rotary drum 227 and the heating unit 251 are lowered to the load/unload position by the elevation base 282 through the rotary shaft 277 and support shaft 276, as shown in the foregoing. As noted before, in a midcourse of lowering, the wafer 85 is caused to float over the susceptor 84 through the action of the wafer elevator device 275. On this occasion, because correct, well-reproducible coincidence is given at between the push portions 266 and the through-holes 256 of the heater 81 and susceptor 84, there is a less possibility of causing an erroneous push up of the susceptor 84 and heater 81 by the push portions 266.

By repeating the foregoing operation from then on, a CVD film is deposited on the next wafer 85.

Although the first to sixteenth embodiments showed the structures as to the vertical type of thermal processing system, the first to sixteenth embodiments are applicable to a thermal processing system as a single-wafer apparatus as shown in the present embodiment without limited to those.

In this manner, the foregoing embodiments can provide a temperature regulating method characterized by having means of switching over between control to previously set up an output of a proper operation amount and control to output an operation amount according to proportional/integral/differential operation, to thereby input to heating means the proper operation amount and the operation amount based on the proportional/integral/differential operation by a suitable switchover, in temperature control in which the operation amount to input to heating means provided in a thermal processing system is changed thereby changing the control amount by the heating means, performing control by making a feed-back process according to a proportional/integral/differential operation based on the control amount for changing the operation amount and maintaining or following the control amount at or to a target value.

Meanwhile, the temperature regulating method as above may be executed several times, to perform an automatic regulation to the optimal operation amount. Besides, it is natural that the temperature regulating method like the above may be programmed and installed on a computer.

Incidentally, the target temperature calculating method in outputting an integral pattern shown in the embodiments is a mere example. Calculation may be by such a calculation method as shown in equation (27), for example.

Meanwhile, it is satisfactory to prepare an output control pattern based on the output amount resulting from PID operation, to subtract the amount of P operation, in order for determining the amount of I operation, from a temperature waveform which the heater thermocouple detects when output-controlling the heater with the output control pattern (amount of D operation may be subtracted in addition to the P operation amount), and to determine swiftly and effectively an integral output pattern more approximate to the subtracted one of the temperature waveform the heater thermocouple detects.

As described above, in a process with a temperature change in a process chamber, e.g. at. a ramp-up or at a boat-up recovery, the invention first makes an operation under PID control until a stabilization from the initial temperature to a target temperature and acquires the basic data at that time, and then divides a heat amount required for stabilization from the initial temperature in the basic data to a target temperature as a stabilization heat amount and a ramp-up heat amount, thereby determining an output control pattern. By regulating the temperature based on the determined output control pattern, subtraction is made of the amount of P operation (or P operation amount and operation amount) from the basic data detected by the thermocouple, thereby determining an integral output pattern.

Incidentally, although the embodiments showed the examples the invention is applied to the vertical type systems and to the single-wafer systems, those are not limitative. It is natural that application is also possible for a horizontal type of thermal processing system.

By virtue of the foregoing structure, in the event of an occurrence of comparatively significant disturbance in the furnace under control, the control amount outputted from the object under control can be changed to a target value swiftly and correctly, because of previously setting an integral output pattern allowing the control amount to follow the target value most swiftly from the total sum over the operation amounts containing such disturbance, pattern-outputting an integral value in place of integral operation at from a particular time, and outputting an integral value by performing again an integral operation at from a time point the greater part of the deviation resulting from disturbance, etc is considered disappeared.

Meanwhile, according to the procedure in the invention, the most part of actual measurement temperature, operation amount and time, i.e. natural phenomenon, which are relied conventionally upon the experiences and intuitions of the skilled person during temperature regulation can be determined by a particular computing equation. This allows for temperature regulation with swiftness and positiveness thus diminishing the time and cost.

Meanwhile, by programming the procedure of the invention and incorporating it as software on a temperature controller or the like, proper temperature regulation is available without the need of operator's intervention.

Although the invention was explained in detail in accordance with the particular mode, it is apparent for those skilled in the art that various modifications and revisions are possible as long as not departing from the spirit and scope of the invention.

INDUSTRIAL APPLICABILITY

As detailed so far, the invention is to provide a temperature regulating method, thermal processing system and semiconductor device manufacturing method that can contributes to the improvement of operation efficiency and the reduction of cost.

The invention claimed is:

1. A temperature regulating method in a thermal processing system comprising a heater for heating an interior of a process chamber to process a substrate, a heating control section for controlling the heater, a first one of a thermocouple and a pyrometer for detecting a temperature in the process chamber, and a second one of a thermocouple and a pyrometer for detecting a temperature in the process chamber, wherein the first one of the thermocouple and the pyrometer is arranged in a position closer to the substrate than the second one of the thermocouple and the pyrometer, while the second one of the thermocouple or the pyrometer is arranged in a position closer to the heater than the first one of the thermocouple and the pyrometer, the temperature regulating method comprising:

controlling the heater by performing integral operation, differential operation and proportional operation by the heating control section, according to a detection temperature, by the first one of the thermocouple and the pyrometer, comprising a predetermined target temperature;

determining a first output control pattern by patterning a first operation amount for the heating control section to control the heater depending upon a detection temperature detected by the first one of the thermocouple and the pyrometer, in the controlling of the heater by performing integral operation, differential operation and proportional operation;

controlling the heater by the heating control section, depending upon the first output control pattern according to a detection temperature, detected by the first one of the thermocouple and the pyrometer, comprising the predetermined target temperature;

determining a first heat amount, at from a ramp-up start time to a time of maximum temperature, of a detection temperature detected by the second one of the thermocouple and the pyrometer in the controlling of the heater by the heating control section, and determining a second output control pattern by patterning at least a part of a second operation amount, at from the ramp-up start time to the time of maximum temperature, for the heating control section to control the heater according to a second heat amount which is obtained by subtracting an output amount based on the proportional operation from the first heat amount; and processing the substrate while controlling the heater by the heating control section according to the second output control pattern.

2. The temperature regulating method according to claim 1, wherein the determining of the first output control pattern further comprises:

when an overshooting amount is greater than an allowable value preset such that the detection temperature detected by the first one of the thermocouple and the pyrometer exceeds the target temperature, determining in a manner reducing the overshooting amount, a total heat amount in a period of a process of changing a temperature of at the ramp-up start time to the target temperature into a stabilization at the target temperature, a ramp-up heat amount, required for ramp up, of the total heat amount, and an overshoot heat amount when an overshoot is occurring exceeding the target temperature;

determining an overshooting temperature ratio as a ratio of the total heat amount and the overshoot heat amount; and determining the first output control pattern depending upon a heat amount determined by subtracting an amount of the overshooting temperature ratio from the ramp-up heat amount.

3. The temperature regulating method according to claim 1, wherein the processing of the substrate further comprises:

in a period of ramp up to the target temperature, arithmetically operating, by the heating control section, the second operation amount on a basis of a result of proportional and differential operations and the second output control pattern by a result which is obtained by subtracting the temperature detected by the first one of the thermocouple and the pyrometer from the target temperature, and controls the heater while performing proportional, differential and integral operations with using a result obtained by subtracting the temperature detected by the second one of the thermocouple and the pyrometer from the second operation amount arithmetically operated.

4. The temperature regulating method according to claim 1, wherein the processing of the substrate, further comprises:

operating the heating control section in a period of ramp up to the target temperature, the second operation amount on a basis of a result of proportional and differential operations and the second output control pattern by a result which is obtained by subtracting the temperature detected by the first one of the thermocouple and the pyrometer from the target temperature, and controls the heater while performing proportional, differential and integral operations with using a result obtained by subtracting the temperature detected by the second one of the thermocouple and the pyrometer from the second operation amount arithmetically operated, operating, by the heating control section when being stabilized at the target temperature, a third operation amount on a basis of a result of proportional, differential and integral operations and the second output control pattern by a result obtained by subtracting the temperature detected by the first one of the thermocouple and the pyrometer from the target temperature, and controlling the heater while performing proportional, differential and integral operations with a result obtained by subtracting the temperature detected by the second one of the thermocouple and the pyrometer from the third operation amount arithmetically operated, processing the substrate.

5. The temperature regulating method according to claim 1, wherein the determining of the first output control pattern further comprises:

determining a total heat amount in a period of a process of changing a temperature from a ramp-up start time to the target temperature, a ramp-up heat amount required for ramp up of the total heat amount, and an overshoot heat amount when an overshoot occurs exceeding the target temperature;

reducing the overshoot heat amount, when an overshooting amount is greater than an allowable value preset detected by the first one of the thermocouple and the pyrometer exceeds the target temperature; and determining the first output control pattern according to the total heat amount, the overshoot heat amount and the ramp-up heat amount.

6. A thermal processing system comprising a heater for heating an interior of a process chamber to process a substrate, heating control section for controlling the heater, a first one of a thermocouple and a pyrometer for detecting a temperature in the process chamber, and a second one of a thermocouple and a pyrometer, wherein the first one of the thermocouple and the pyrometer is arranged in a position closer to the substrate than the second one of the thermocouple and the pyrometer while the second one of the thermocouple and the pyrometer is arranged in a position closer to the heater than the first one of the thermocouple and the pyrometer, the thermal processing system comprising:

the heating control section performs integral, differential and proportional operations according to a detection temperature, by the first one of the thermocouple and the pyrometer, comprising a target temperature from a temperature at a ramp-up start time, the heating control section patterns a first operation amount for controlling the heater so as to determine a first output control pattern, the heating control section determines a first heat amount, at from the ramp-up start time to the time of maximum temperature, of a detection temperature detected by the second one of the thermocouple and the pyrometer when the heater is controlled based on the first output control pattern when a detection temperature by the first one of the thermocouple and the pyrometer reaches the target temperature, the heating control section patterns at least a part of a second operation amount for controlling the heater, at from the ramp-up start time to the time of maximum temperature, by using a second heat amount which is obtained by subtracting an output amount based on the proportional operation from the first heat amount so as to determine a second output control pattern, and the heating control section processes the substrate while controlling the heater according to the second output control pattern comprising at least a part of the second operation amount.

7. A thermal processing system according to claim 6, wherein the heating control section, when an overshooting amount is greater than an allowable value preset such that the detection temperature detected by the first one of the thermocouple and the pyrometer exceeds the target temperature, determines by reducing the overshooting amount, a total heat amount in a period of a process of changing a temperature at the ramp-up start time to the target temperature into a stabilization at the target temperature, a ramp-up heat amount, required for ramp-up, of the total heat amount, and an overshoot heat amount when an overshoot is occurring, exceeding the target temperature;

wherein the heating control section determines an overshooting temperature ratio as a ratio of the total heat amount and the overshoot heat amount; and wherein the heating control section determines the first output control pattern depending upon a heat amount determined by subtracting an amount of the overshooting temperature ratio from the ramp-up heat amount.

8. A thermal processing system according to claim 6, wherein, when the heating control section processes the substrate, in a period of ramp up to the target temperature, the heating control section operates the second operation amount on a basis of a result of proportional and differential operations and the second output control pattern by a result obtained by subtracting the temperature detected by the first one of the thermocouple and the pyrometer from the target temperature, and controls the heater while performing proportional, differential and integral operations with a result obtained by subtracting the temperature detected by the second one of the thermocouple and the pyrometer from the second operation amount arithmetically operated, and when being stabilized at the target temperature, the heating control section operates a third operation amount on a basis of a result of proportional, differential and integral operations and the second output control pattern by a result obtained by subtracting the temperature detected by the first one of the thermocouple and the pyrometer from the target temperature, and controls the heater while performing proportional, differential and integral operations with a result obtained by subtracting the temperature detected by the second one of the thermocouple and the pyrometer from the third operation amount operated, processing the substrate.

9. The thermal processing system according to claim 6, wherein, when the heating control section processes the substrate, in a period of ramp up to the target temperature, the heating control section arithmetically operates the second operation amount on a basis of a result of proportional and differential operations and the second output control pattern by use of a result obtained by subtracting the temperature detected by the first one of a thermocouple or a pyrometer from the target temperature, and controls the heater while performing proportional, differential and integral operations with using a result obtained by subtracting the temperature detected by the second one of the thermocouple and the pyrometer from the second operation amount arithmetically operated.

10. The thermal processing system according to claim 6, wherein, when the heating control section processes the substrate, and when stabilized at the target temperature, the heating control section arithmetically operates a third operation amount on a basis of a result of proportional, differential and integral operations and the second output control pattern by use of a result which is obtained by subtracting the temperature detected by the first one of the thermocouple and the pyrometer from the target temperature, and controls the heater while performing proportional, differential and integral operations with a result obtained by subtracting the temperature detected by the second one of the thermocouple and the pyrometer from the third operation amount arithmetically operated, processing the substrate.

11. The temperature regulating system according to claim 6, wherein the processing of the substrate, when being stabilized at the target temperature, the heating control section arithmetically operates a third operation amount on a basis of a result of proportional, differential and integral operations and the second output control pattern by a result obtained by subtracting the temperature detected by the first one of the thermocouple and the pyrometer from the target temperature, and controls the heater while performing proportional, differential and integral operations with using a result obtained by subtracting the temperature detected by the second one of the thermocouple and the pyrometer from the third operation amount arithmetically operated, processing the substrate.

12. A semiconductor device manufacturing method for processing a substrate by using a thermal processing system wherein:

a thermal processing system includes a heater for heating an interior of a process chamber to process a substrate, heating control section for controlling the heater, a first one of a thermocouple and a pyrometer for detecting a temperature in the process chamber, and a second one of a thermocouple and a pyrometer, wherein the first one of the thermocouple and the pyrometer is arranged in a position closer to the substrate than the second one of the thermocouple and the pyrometer while the second one of the thermocouple and the pyrometer is arranged in a position closer to the heater than the first one of the thermocouple and the pyrometer, the heating control section determining a first output control pattern by patterning a first operation amount for controlling the heater depending upon a detection temperature detected by the first one of the thermocouple and the pyrometer upon controlling the heater by performing integral, differential and proportional operations in a manner the detection temperature by the first one of the thermocouple and the pyrometer becomes a predetermined target temperature, and determining a second output control pattern by patterning at least a part of a second operation amount for controlling the heater depending upon a detection temperature detected by the second one of the thermocouple and the pyrometer upon controlling the heater on a basis of the first output control pattern, the semiconductor manufacturing method comprising:

loading a substrate into the process chamber;

determining, by the heating control section, a first heat amount, at from the ramp-up start time to the time of maximum temperature, of a detection temperature detected by the second one of the thermocouple and the pyrometer when the heater is controlled based on the first output control pattern by detection of temperature by the first one of the thermocouple and the pyrometer comprising a target temperature, and processes the substrate loaded in the process chamber while controlling the heater by using the second output control pattern as least a part of the second operation amount, at from the ramp-up start time to the time of maximum temperature, by using a second heat amount obtained by subtracting an output amount based on the proportional operation from the first heat amount; and unloading the substrate out of the process chamber.

13. The semiconductor device manufacturing method according to claim 12, wherein, when an overshooting amount is greater than an allowable value preset such that the detection temperature detected by the first one of the thermocouple and the pyrometer exceeds the target temperature, a total heat amount in a period of a process of changing a temperature at the ramp-up start time to the target temperature into a stabilization at the target temperature, a ramp-up heat amount, required for ramp up, of the total heat amount, and an overshoot heat amount when an overshoot is occurring exceeding the target temperature, determining an overshooting temperature ratio as a ratio of the total heat amount and the overshoot heat amount are determined by reducing the overshooting amount, and the first output control pattern is determined based on a heat amount determined by subtracting an amount of the overshooting temperature ratio from the ramp-up heat amount.

14. The semiconductor device manufacturing method according to claim 12, wherein the processing of the substrate causes the heating control section, in a period of ramp up to the target temperature, to arithmetically operate the second operation amount on a basis of a result of proportional and differential operations and the second output control pattern by a result obtained by subtracting the temperature detected by the first one of the thermocouple and the pyrometer from the target temperature, and to control the heater while performing proportional, differential and integral operations with a result obtained by subtracting the temperature detected by the second one of a thermocouple and the pyrometer from the second operation amount arithmetically operated.

15. The semiconductor manufacturing method according to claim 12, wherein the processing of the substrate causes the heating control section, when being stabilized at the target temperature, to arithmetically operate a third operation amount on a basis of a result of proportional, differential and integral operations and the second output control pattern by a result obtained by subtracting the temperature detected by the first one of the thermocouple and the pyrometer from the target temperature, and to control the heater while performing proportional, differential and integral operations with a result obtained by subtracting the temperature detected by the second one of the thermocouple and the pyrometer from the third operation amount arithmetically operated, processing the substrate.

16. The semiconductor manufacturing method according to claim 12, wherein the processing of the substrate causes the heating control section, in a period of ramp up to the target temperature, to arithmetically operate the second operation amount on a basis of a result of proportional and differential operations and the second output control pattern by a result obtained by subtracting the temperature detected by the first one of the thermocouple and the pyrometer from the target temperature, and to control the heater while performing proportional, differential and integral operations with a result obtained by subtracting the temperature detected by the second one of the thermocouple and the pyrometer from the second operation amount arithmetically operated, and the processing of the substrate causes the heating control section, when being stabilized at the target temperature, to arithmetically operate a third operation amount on a basis of a result of proportional, differential and integral operations and the second output control pattern by a result obtained by subtracting the temperature detected by the first one of the thermocouple and the pyrometer from the target temperature, and to control the heater while performing proportional, differential and integral operations with using a result obtained by subtracting the temperature detected by the second one of the thermocouple and the pyrometer from the third operation amount arithmetically operated, processing the substrate.

* * * * *